(12) United States Patent
Someya et al.

(10) Patent No.: US 11,267,932 B2
(45) Date of Patent: *Mar. 8, 2022

(54) CURABLE COMPOSITION, CURED FILM, DISPLAY PANEL OR OLED LIGHT, AND METHOD FOR PRODUCING CURED PRODUCT

(71) Applicant: TOKYO OHKA KOGYO CO., LTD., Kawasaki (JP)

(72) Inventors: Kazuya Someya, Kawasaki (JP); Issei Suzuki, Kawasaki (JP); Koichi Misumi, Kawasaki (JP); Dai Shiota, Kawasaki (JP)

(73) Assignee: Tokyo Ohka Kogyo Co., Ltd., Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/047,508

(22) Filed: Jul. 27, 2018

(65) Prior Publication Data

US 2019/0031818 A1 Jan. 31, 2019

(30) Foreign Application Priority Data

Jul. 31, 2017 (JP) .............................. JP2017-148559

(51) Int. Cl.
| | | |
|---|---|---|
| *C08G 59/40* | (2006.01) | |
| *C08G 59/24* | (2006.01) | |
| *C09D 163/00* | (2006.01) | |
| *H01L 27/32* | (2006.01) | |
| *H01L 51/00* | (2006.01) | |
| *H01L 51/56* | (2006.01) | |
| *C08G 59/32* | (2006.01) | |
| *C08G 59/68* | (2006.01) | |
| *C08G 59/30* | (2006.01) | |
| *C08G 75/08* | (2006.01) | |
| *H01L 51/52* | (2006.01) | |

(52) U.S. Cl.
CPC ....... *C08G 59/4078* (2013.01); *C08G 59/245* (2013.01); *C08G 59/306* (2013.01); *C08G 59/3236* (2013.01); *C08G 59/3245* (2013.01); *C08G 59/3281* (2013.01); *C08G 59/4064* (2013.01); *C08G 59/68* (2013.01); *C08G 75/08* (2013.01); *C09D 163/00* (2013.01); *H01L 27/3244* (2013.01); *H01L 51/004* (2013.01); *H01L 51/56* (2013.01); *H01L 51/0097* (2013.01); *H01L 51/5253* (2013.01); *H01L 2251/5338* (2013.01)

(58) Field of Classification Search
CPC ............ C08G 59/4078; C08G 59/4064; C08G 59/245; C08G 75/08; C08G 59/68; C08G 59/3281; C08G 59/3245; C08G 59/3236; C08G 59/306; C09D 163/00; G03F 7/027; G03F 7/004; H01L 51/56; H01L 51/004; H01L 27/324; H01L 51/0097; H01L 51/5253; H01L 2251/5338

See application file for complete search history.

(56) References Cited

U.S. PATENT DOCUMENTS

| | | | |
|---|---|---|---|
| 6,166,233 A * | 12/2000 | Neckers ................... | C07F 5/00 |
| | | | 522/25 |
| 9,914,687 B2 | 3/2018 | Shiota et al. | |
| 2006/0199099 A1* | 9/2006 | Arao ...................... | G03F 7/0382 |
| | | | 430/270.1 |
| 2009/0076180 A1* | 3/2009 | Iwaya ..................... | C08L 63/00 |
| | | | 522/31 |
| 2010/0104858 A1 | 4/2010 | Horio et al. | |
| 2010/0256313 A1 | 10/2010 | Nakamura et al. | |
| 2014/0231729 A1 | 8/2014 | Shiota et al. | |
| 2015/0042931 A1* | 2/2015 | Hsu ........................ | G02B 5/223 |
| | | | 349/106 |
| 2016/0046552 A1 | 2/2016 | Shiota et al. | |
| 2017/0260132 A1* | 9/2017 | Kunimoto ............. | C07C 327/58 |
| 2017/0305848 A1 | 10/2017 | Shiota et al. | |
| 2018/0334533 A1 | 11/2018 | Someya et al. | |
| 2019/0031818 A1 | 1/2019 | Someya et al. | |

FOREIGN PATENT DOCUMENTS

| | | |
|---|---|---|
| JP | H 08-101501 A | 4/1996 |
| JP | 2005-283905 A | 10/2005 |
| JP | 2008-133379 A | 6/2008 |
| JP | 2013-033208 A | 2/2013 |
| JP | 2013-124338 A | 6/2013 |
| JP | 2014-156522 A | 8/2014 |
| JP | 2015-017026 A | 1/2015 |
| JP | 2016-188286 A | 11/2016 |
| JP | 2017-036206 A | 2/2017 |
| WO | WO 2016/047784 A1 | 3/2016 |

OTHER PUBLICATIONS

Office Action issued in U.S. Appl. No. 15/974,036, dated Oct. 1, 2019.
Office Action issued in U.S. Appl. No. 15/974,191, dated Jun. 27, 2019.
Office Action issued in U.S. Appl. No. 15/974,191, dated Apr. 27, 2020.

(Continued)

*Primary Examiner* — Jessica M Roswell
(74) *Attorney, Agent, or Firm* — Knobbe Martens Olson & Bear LLP

(57) ABSTRACT

A curable composition which is capable of forming a cured product having satisfactory heat resistance and adhesion to a base material, and has satisfactory curability, a cured film obtained from a cured product of the curable composition, a display panel or an OLED light provided with the cured film, and a method for producing a cured product using the curable composition. The composition includes a curable compound and a cationic polymerization initiator, and contains a cationic polymerizable compound having, as the main skeleton, a fused ring in which three or more rings including an aromatic ring are fused, and a salt including a gallium-containing anion as the cationic polymerization initiator.

16 Claims, No Drawings

(56) References Cited

OTHER PUBLICATIONS

Notification of Reasons for Refusal Issued in related Japanese Patent Application No. JP2017-098574, dated Sep. 8, 2020.
Notification of Reasons for Refusal issued in related Japanese Patent Application No. 2017-098575, dated Dec. 1, 2020.

* cited by examiner

CURABLE COMPOSITION, CURED FILM, DISPLAY PANEL OR OLED LIGHT, AND METHOD FOR PRODUCING CURED PRODUCT

This application claims priority to Japanese Patent Application No. 2017-148559, filed Jul. 31, 2017, the entire content of which is incorporated herein by reference.

BACKGROUND OF THE INVENTION

Field of the Invention

The present invention relates to a curable composition, a cured film obtained from a cured product of the curable composition, a display panel for an image display device or an OLED light provided with the cured film, and a method for producing a cured product using the above-described curable composition.

Related Art

Heretofore, a cationic polymerizable curable composition containing, as a curable component, a cationic polymerizable compound such as an epoxy compound has been used in various application.

There has been known, as such curable composition, a cationic polymerization type thermal curable composition containing, for example, an aromatic ring-containing alicyclic epoxy compound, a cationic polymerizable compound other than the aromatic ring-containing alicyclic epoxy compound, and a thermal cationic polymerization initiator (see Patent Document 1). Use of such curable composition enables formation of a cured product having high glass transition temperature, transparency (scarcely colored due to heat yellowing resistance), and excellent adhesion to a base material.

Patent Document 1: Japanese Unexamined Patent Application, Publication No. 2014-156522

SUMMARY OF THE INVENTION

Use of the curable composition mentioned in Patent Document 1 enables formation of a cured product which exhibits high glass transition temperature and satisfactory heat resistance from the viewpoint of thermal deformation. However, when using the curable composition mentioned in Patent Document 1, it is not necessarily possible to form a cured product having satisfactory heat resistance from the viewpoint of the pyrolysis resistance.

In light of the problems, the present invention has been made and an object thereof is to provide a curable composition, which is capable of forming a cured product having satisfactory heat resistance (pyrolysis resistance) and adhesion to a base material, and has satisfactory curability, a cured film obtained from a cured product of the curable composition, a display panel or an OLED light provided with the cured film, and a method for producing a cured product using the above-described curable composition.

The present inventors have found that the problems can be solved by allowing a curable compound (A) to contain a cationic polymerizable compound having, as the main skeleton, a fused ring in which three or more rings including an aromatic ring are fused, and using a salt comprising a gallium-containing anion having a specific structure as an anion moiety as a cationic polymerization initiator (B), in a curable composition comprising the curable compound (A) and the cationic polymerization initiator (B), thereby completing the present invention. Specifically, the present invention provides the following.

A first aspect of the present invention is directed to a curable composition comprising a curable compound (A) and a cationic polymerization initiator (B), wherein the curable compound (A) comprises a compound represented by the following formula (a1), and the cationic polymerization initiator (B) is a compound comprising a cation moiety and an anion moiety, the anion moiety being an anion represented by the following formula (b1):

[Formula 1]

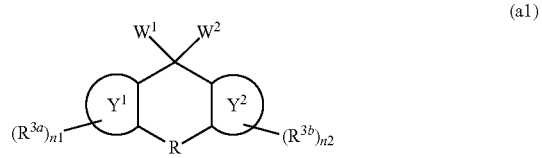

wherein, in the formula (a1), $W^1$ and $W^2$ are each independently a group represented by the following formula (a2):

[Formula 2]

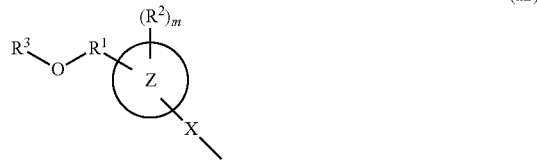

wherein, in the formula (a2), a ring Z represents an aromatic hydrocarbon ring, X represents a single bond or a group represented by —S—, $R^1$ represents a single bond, an alkylene group having 1 or more and 4 or less carbon atoms, or an alkyleneoxy group having 1 or more and 4 or less carbon atoms, and when $R^1$ is an alkyleneoxy group, the oxygen atom in the alkyleneoxy group is bonded with a ring Z, $R^2$ represents a monovalent hydrocarbon group, a hydroxyl group, a group represented by —$OR^{4a}$, a group represented by —$SR^{4b}$, an acyl group, an alkoxycarbonyl group, a halogen atom, a nitro group, a cyano group, a mercapto group, a carboxy group, an amino group, a carbamoyl group, a group represented by —$NHR^{4c}$, a group represented by —$N(R^{4d})_2$, a sulfo group, or a group in which at least part of hydrogen atoms bonded to a carbon atom(s) included in a monovalent hydrocarbon group, a group represented by —$OR^{4a}$, a group represented by —$SR^{4b}$, an acyl group, an alkoxycarbonyl group, a group represented by —$NHR^{4c}$, or a group represented by —$N(R^{4d})_2$ are substituted with a monovalent hydrocarbon group, a hydroxyl group, a group represented by —$OR^{4a}$, a group represented by —$SR^{4b}$, an acyl group, an alkoxycarbonyl group, a halogen atom, a nitro group, a cyano group, a mercapto group, a carboxy group, an amino group, a carbamoyl group, a group represented by —$NHR^{4c}$, a group represented by —$N(R^{4d})_2$, a mesyloxy group, or a sulfo group, $R^{4a}$ to $R^{4d}$ independently represent a monovalent hydrocarbon group, m represents an integer of 0 or more, and $R^3$ is a hydrogen atom, a vinyl group, a thiiran-2-ylmethyl group, or a glycidyl group, both $W^1$ and $W^2$ do not have a hydrogen atom as $R^3$, a ring $Y^1$ and a ring $Y^2$ represent the same or different aromatic hydrocarbon ring, R represents a single bond, an optionally substituted methylene group, an ethylene group which is optionally substituted and optionally comprises a heteroatom between two carbon atoms, a group represented by —O—, a group represented by —NH—, or a group represented by —S—, $R^{3a}$ and $R^{3b}$ independently represent a cyano group, a halogen atom, or a monovalent hydrocarbon group, and n1 and n2 independently represent an integer of 0 or more and 4 or less.

[Formula 3]

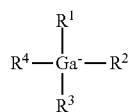
(b1)

wherein, in the formula (b1), $R^1$, $R^2$, $R^3$ and $R^4$ are each independently an optionally substituted hydrocarbon group, or an optionally substituted heterocyclic group, and at least one of $R^1$, $R^2$, $R^3$ and $R^4$ is an optionally substituted aromatic hydrocarbon group.

A second aspect of the present invention is directed to a cured film comprising a cured product of the curable composition according to the first aspect.

A third aspect of the present invention is directed to a display panel for an image display device or an OLED light provided with the cured film according to the second aspect.

A fourth aspect of the present invention is directed to a method for producing a cured product, which comprises: forming the curable composition according to the first aspect into a predetermined shape, and subjecting the thus formed curable composition to at least one of light exposure and heating.

According to the present invention, it is possible to provide a curable composition which is capable of forming a cured product having satisfactory heat resistance (pyrolysis resistance) and adhesion to a base material, and has satisfactory curability, a cured film obtained from a cured product of the curable composition, a display panel or an OLED light provided with the cured film, and a method for producing a cured product using the above-described curable composition.

DETAILED DESCRIPTION OF THE INVENTION

<<Curable Composition>>

The curable composition comprises a curable compound (A) and a cationic polymerization initiator (B).

The curable compound (A) is a compound represented by the formula (a1) described below and has a fused polycyclic skeleton comprising an aromatic ring as the main skeleton, and also has a cationic polymerizable group.

The cationic polymerization initiator (B) is a salt comprising a gallium-containing anion having a specific structure described below as an anion moiety.

The curable composition comprises the above-described curable compound (A) and cationic polymerization initiator (B), and thus a cured product having satisfactory heat resistance (pyrolysis resistance) and adhesion to a base material can be formed, and the curable composition has satisfactory curability.

Essential or optional components contained in the curable composition will be described below.

<(A) Curable Compound>

The curable compound (A) comprises a compound represented by the following formula (a1).

A cured product having satisfactory heat resistance (pyrolysis resistance) and adhesion to a base material can be formed using the curable compound (A) represented by the following formula (a1) in combination with a cationic polymerization initiator (B) described below, and the curable composition has satisfactory curability.

[Formula 4]

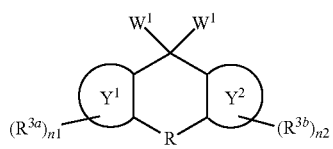
(a1)

wherein, in the formula (a1), $W^1$ and $W^2$ are each independently a group represented by the following formula (a2):

[Formula 5]

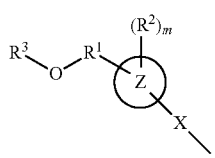
(a2)

wherein, in the formula (a2), a ring Z represents an aromatic hydrocarbon ring, X represents a single bond or a group represented by —S—, $R^1$ represents a single bond, an alkylene group having 1 or more and 4 or less carbon atoms, or an alkyleneoxy group having 1 or more and 4 or less carbon atoms, and when $R^1$ is an alkyleneoxy group, the oxygen atom in the alkyleneoxy group is bonded with a ring Z, $R^2$ represents a monovalent hydrocarbon group, a hydroxyl group, a group represented by —$OR^{4a}$, a group represented by —$SR^{4b}$, an acyl group, an alkoxycarbonyl group, a halogen atom, a nitro group, a cyano group, a mercapto group, a carboxy group, an amino group, a carbamoyl group, a group represented by —$NHR^{4c}$, a group represented by —$N(R^{4d})_2$, a sulfo group, or a group in which at least part of hydrogen atoms bonded to a carbon atom(s) included in a monovalent hydrocarbon group, a group represented by —$OR^{4a}$, a group represented by —$SR^{4b}$, an acyl group, an alkoxycarbonyl group, a group represented by —$NHR^{4c}$, or a group represented by —$N(R^{4d})_2$ are substituted with a monovalent hydrocarbon group, a hydroxyl group, a group represented by —$OR^{4a}$, a group represented by —$SR^{4b}$, an acyl group, an alkoxycarbonyl group, a halogen atom, a nitro group, a cyano group, a mercapto group, a carboxy group, an amino group, a carbamoyl group, a group represented by —$NHR^{4c}$, a group represented by —$N(R^{4d})_2$, a mesyloxy group, or a sulfo group, $R^{4a}$ to $R^{4d}$ independently represent a monovalent hydrocarbon group, m represents an integer of 0 or more, and $R^3$ is a hydrogen atom, a vinyl group, a thiiran-2-ylmethyl group, or a glycidyl group, both $W^1$ and $W^2$ do not have a hydrogen atom as $R^3$, a ring $Y^1$ and a ring $Y^2$ represent the same or different aromatic hydrocarbon ring, R represents a single bond, an optionally substituted methylene group, an ethylene group which is optionally substituted and optionally comprises a heteroatom between two carbon atoms, a group represented by —O—, a group represented by —NH—, or a group represented by —S—, $R^{3a}$ and $R^{3b}$ independently represent a cyano group, a halogen atom, or a monovalent hydrocarbon group, and n1 and n2 independently represent an integer of 0 or more and 4 or less.

In the formula (a2), examples of the ring Z include a benzene ring, a fused polycyclic aromatic hydrocarbon ring [for example, a fused di- to tetracyclic aromatic hydrocarbon ring, such as a fused dicyclic hydrocarbon ring (e.g., a $C_{8-20}$ fused dicyclic hydrocarbon ring such as a naphthalene ring, and preferably a $C_{10-16}$ fused dicyclic hydrocarbon ring) or a fused tricyclic aromatic hydrocarbon ring (e.g., an anthracene ring, a phenanthrene ring, etc.)], and the like.

The ring Z is preferably a benzene ring or a naphthalene ring, and more preferably a naphthalene ring.

$W^1$ and $W^2$ in the formula (a1) each independently represent a group represented by the following formula (a2), so that $W^1$ and $W^2$ each contain a ring Z.

The ring Z contained in $W^1$ and the ring Z contained in $W^2$ may be the same or different and, for example, one ring may be a benzene ring and the other ring may be a naphthalene ring, and any of rings is particularly preferably a naphthalene ring.

There is no particular limitation on the substitution position of the ring Z bonded to the carbon atoms, to which both $W^1$ and $W^2$ are directly bonded, via X.

For example, when the ring Z is a naphthalene ring, the group corresponding to the ring Z bonded to the carbon atom may be a 1-naphthyl group, a 2-naphthyl group, or the like.

In the formula (a2), X independently represents a single bond, or a group represented by —S—, and typically a single bond.

In the formula (a2), examples of $R^1$ include a single bond; an alkylene group having 1 or more and 4 or less carbon atoms, such as a methylene group, an ethylene group, a trimethylene group, a propylene group, or a butane-1,2-diyl group; and a alkyleneoxy group having 1 or more and 4 or less carbon atoms, such as a methyleneoxy group, an ethyleneoxy group, or a propyleneoxy group; and $R^1$ is preferably a single bond; a $C_{2-4}$ alkylene group (particularly, a $C_{2-3}$ alkylene group such as an ethylene group or a propylene group); a $C_{2-4}$ alkyleneoxy group (particularly, a $C_{2-3}$ alkylene group such as an ethyleneoxy group or a propyleneoxy group), and more preferably a single bond.

When $R^1$ is an alkyleneoxy group, the oxygen atom in the alkyleneoxy group is bonded with the ring Z.

$W^1$ and $W^2$ in the formula (a1) each independently represent a group represented by the following formula (a2), so that $W^1$ and $W^2$ each contain $R^1$ as a divalent group. $R^1$ contained in $W^1$ and $R^1$ contained in $W^2$ may be the same or different.

In the formula (a2), examples of $R^2$ include a monovalent hydrocarbon group such as an alkyl group (e.g., a $C_{1-12}$ alkyl group such as a methyl group, an ethyl group, a propyl group, an isopropyl group, or a butyl group, preferably a $C_{1-8}$ alkyl group, and more preferably a $C_{1-6}$ alkyl group, etc.), an cycloalkyl group (a $C_{5-10}$ cycloalkyl group such as a cyclohexyl group, preferably a $C_{5-8}$ cycloalkyl group, and more preferably a $C_{5-6}$ cycloalkyl group, etc.), an aryl group (e.g., a $C_{6-14}$ aryl group such as a phenyl group, a tolyl group, a xylyl group, or a naphthyl group, preferably a $C_{6-10}$ aryl group, and more preferably a $C_{6-8}$ aryl group, etc.), or an aralkyl group (a $C_{6-10}$ aryl-$C_{1-4}$ alkyl group such as a benzyl group or an phenethyl group, etc.); a hydroxyl group; a group represented by —$OR^{4a}$ [wherein $R^{4a}$ represents a monovalent hydrocarbon group (the above-exemplified monovalent hydrocarbon groups, etc.)] such as an alkoxy group (a $C_{1-12}$ alkoxy group such as a methoxy group, an ethoxy group, a propoxy group, or a butoxy group, preferably a $C_{1-8}$ alkoxy group, and more preferably a $C_{1-6}$ alkoxy group, etc.), a cycloalkoxy group (a $C_{5-10}$ cycloalkoxy group such as a cyclohexyloxy group, etc.), an aryloxy group (a $C_{6-10}$ aryloxy group such as a phenoxy group), or an aralkyloxy group (e.g., a $C_{6-10}$aryl-$C_{1-4}$ alkyloxy group such as a benzyloxy group); a group represented by —$SR^{4b}$ [wherein $R^{4b}$ represents a monovalent hydrocarbon group (the above-examplified monovalent hydrocarbon groups, etc.)] such as an alkylthio group (a $C_{1-12}$ alkylthio group such as a methylthio group, an ethylthio group, a propylthio group, or a butylthio group, preferably a $C_{1-8}$ alkylthio group, and more preferably a $C_{1-6}$ alkylthio group, etc.), a cycloalkylthio group (a $C_{5-10}$cycloalkylthio group such as a cyclohexylthio group, etc.), an arylthio group (a $C_{6-10}$ arylthio group such as a phenylthio group), or an aralkylthio group (e.g., a $C_{6-10}$ aryl-$C_{14}$ alkylthio group such as a benzylthio group);

an acyl group (a $C_{1-6}$ acyl group such as an acetyl group, etc.); an alkoxycarbonyl group (a $C_{1-4}$ alkoxy-carbonyl group such as a methoxycarbonyl group, etc.); a halogen atom (a fluorine atom, a chlorine atom, a bromine atom, an iodine atom, etc.); a nitro group; a cyano group; a mercapto group; a carboxy group; an amino group; a carbamoyl group; a group represented by —$NHR^{4c}$ [wherein $R^{4c}$ represents a monovalent hydrocarbon group (the above-examplified monovalent hydrocarbon groups, etc.)] such as an alkylamino group (a $C_{1-12}$ alkylamino group such as a methylamino group, an ethylamino group, a propylamino group, or a butylamino group, preferably a $C_{1-8}$ alkylamino group, and more preferably a $C_{1-6}$ alkylamino group, etc.), an cycloalkylamino group (a $C_{5-10}$ cycloalkylamino group such as a cyclohexylamino group, etc.), an arylamino group (a $C_{6-10}$ arylamino group such as a phenylamino group), or an aralkylamino group (e.g., a $C_{6-10}$ aryl-$C_{1-4}$ alkylamino group such as a benzylamino group);

a group represented by —$N(R^{4d})_2$ [wherein $R^{4d}$ independently represents a monovalent hydrocarbon group (the above-exemplified monovalent hydrocarbon groups, etc.)] such as a dialkylamino group (a di($C_{1-12}$ alkyl)amino group such as a dimethylamino group, a diethylamino group, a dipropylamino group, or a dibutylamino group, preferably a di($C_{1-8}$ alkyl)amino group, and more preferably a di($C_{1-6}$ alkyl)amino group, etc.), a dicycloalkylamino group (a di($C_{5-10}$ cycloalkyl)amino group such as a dicyclohexylamino group, etc.), a diarylamino group (a di($C_{6-10}$ aryl) amino group such as a diphenylamino group), or a diaralkylamino group (e.g., a di($C_{6-10}$ aryl-$C_{1-4}$ alkyl)amino group such as a dibenzylamino group);

a (meth)acryloyloxy group; a sulfo group; and a group in which at least part of hydrogen atoms bonded to a carbon atom(s) included in the monovalent hydrocarbon group, a group represented by —$OR^{4a}$, a group represented by —$SR^{4b}$, an acyl group, an alkoxycarbonyl group, a group represented by —$NHR^{4c}$, or a group represented by —$N(R^{4d})_2$ are substituted with the monovalent hydrocarbon group, a hydroxyl group, a group represented by —$OR^{4a}$, a group represented by —$SR^{4b}$, an acyl group, an alkoxycarbonyl group, a halogen atom, a nitro group, a cyano group, a mercapto group, a carboxy group, an amino group, a carbamoyl group, a group represented by —$NHR^{4c}$, a group represented by —N($R^{4d}$)$_2$, a (meth)acryloyloxy group, a mesyloxy group, or a sulfo group [for example, an alkoxyaryl group (e.g., a $C_{1-4}$ alkoxy $C_{6-10}$ aryl group such as a methoxyphenyl group), an alkoxycarbonylaryl group (e.g., a $C_{1-4}$ alkoxy-carbonyl $C_{6-10}$ aryl group such as a methoxycarbonylphenyl group or an ethoxycarbonylphenyl group, etc.)] and the like.

Of these, $R^2$ may be typically a monovalent hydrocarbon group, a group represented by —O$R^{4a}$, a group represented by —S$R^{4b}$, an acyl group, an alkoxycarbonyl group, a halogen atom, a nitro group, a cyano group, a group represented by —NH$R^{4c}$, a group represented by —N($R^{4d}$)$_2$, or the like.

Examples of preferred $R^2$ include a monovalent hydrocarbon group [for example, an alkyl group (e.g., a $C_{1-6}$ alkyl group), a cycloalkyl group (e.g., a $C_{5-8}$ cycloalkyl group), an aryl group (e.g., a $C_{6-10}$ aryl group), an aralkyl group (e.g., a $C_{6-8}$ aryl-$C_{1-2}$ alkyl group), etc.], an alkoxy group (a $C_{1-4}$ alkoxy group, etc.), and the like. Particularly, $R^{2a}$ and $R^{2b}$ are preferably a monovalent hydrocarbon group (particularly, an alkyl group), such as an alkyl group [a $C_{1-4}$ alkyl group (particularly, a methyl group)], or an aryl group [e.g., a $C_{6-10}$ aryl group (particularly, a phenyl group)].

When m is an integer of 2 or more, plural $R^2$(s) may be different or may be the same. $R^2$ contained in $W^1$ and $R^2$ contained in $W^2$ may be the same or different.

In the formula (a2), the number m of $R^2$ can be selected according to types of the ring Z and may be, for example, 0 or more and 4 or less, preferably 0 or more and 3 or less, and more preferably 0 or more and 2 or less. m in $W^1$ and m in $W^2$ may be the same or different.

In the formula (a3), $R^3$ is a hydrogen atom, a vinyl group, a thiiran-2-ylmethyl group, or a glycidyl group. Both $W^1$ and $W^2$ do not contain a hydrogen atom as $R^3$. Any of a vinyloxy group, a thiiran-2-ylmethyl group, and a glycidyl group is a cationic polymerizable functional group. Therefore, the compound represented by the formula (a1) is a cationic polymerizable compound having one or two cationic polymerizable functional groups.

$R^3$ contained in $W^1$ and $R^3$ contained in $W^2$ may be the same or different as long as both $R^3$(s) are not hydrogen atoms. Both $R^3$ contained in $W^1$ and $R^3$ contained in $W^2$ are preferably a vinyl group, a thiiran-2-ylmethyl group, or a glycidyl group, and more preferably the same group selected from the group consisting of a vinyl group, a thiiran-2-ylmethyl group, and a glycidyl group.

$R^3$ is preferably a vinyl group or a glycidyl group since it is easy to synthesize and obtain the compound represented by the formula (a1).

In the formula (a1), examples of the rings $Y^1$ and $Y^2$ includes a benzene ring and a fused polycyclic aromatic hydrocarbon ring [for example, a fused di- to tetracyclic aromatic hydrocarbon ring, such as a fused dicyclic hydrocarbon ring (e.g., a $C_{8-20}$ fused dicyclic hydrocarbon ring such as a naphthalene ring, and preferably a $C_{10-16}$ fused dicyclic hydrocarbon ring), and a fused tricyclic aromatic hydrocarbon ring (e.g., an anthracene ring, a phenanthrene ring, etc.).

The rings $Y^1$ and $Y^2$ are preferably a benzene ring or a naphthalene ring, and more preferably a benzene ring. The rings $Y^1$ ring $Y^2$ may be the same or different and, for example, one ring may be a benzene ring and the other ring may be a naphthalene ring.

In the formula (a1), R represents a single bond, an optionally substituted methylene group, an ethylene group which is optionally substituted and may contain a heteroatom between two carbon atoms, a group represented by —O—, a group represented by —NH—, or a group represented by —S—, and typically a single bond. Examples of the substituent include a cyano group, a halogen atom (a fluorine atom, a chlorine atom, a bromine atom, etc.), a monovalent hydrocarbon group [e.g., an alkyl group (a $C_{1-6}$ alkyl group such as a methyl group, an ethyl group, a propyl group, an isopropyl group, a butyl group, a t-butyl group, etc.), an aryl group (a $C_{6-10}$ aryl group such as a phenyl group), etc.], and the like; and examples of the heteroatom include an oxygen atom, a nitrogen atom, a sulfur atom, a silicon atom, and the like.

In the formula (a1), $R^{3a}$ and $R^{3b}$ usually include non-reactive substituents, for example, a cyano group, a halogen atom (fluorine atom, chlorine atom, bromine atom, etc.), a monovalent hydrocarbon group [e.g., an alkyl group, an aryl group (a $C_{6-10}$ aryl group such as a phenyl group), etc.] and the like, and are preferably a cyano group or an alkyl group, and particularly preferably an alkyl group. Examples of the alkyl group include $C_{1-6}$ alkyl groups (e.g., a $C_{1-4}$ alkyl group, particularly a methyl group) such as a methyl group, an ethyl group, a propyl group, an isopropyl group, a butyl group, and a t-butyl group. When n1 is an integer of 2 or more, $R^{3a}$ may be different or may be the same. When n2 is an integer of 2 or more, $R^{3b}$ may be different or may be the same. $R^{3a}$ and $R^{3b}$ may be the same or different. There is no particular limitation on the bonding position (substitution position) of $R^{3a}$ and $R^{3b}$ on the rings $Y^1$ and $Y^2$. The substitution number n1 and n2 is preferably 0 or 1, and particularly 0. n1 and n2 may be the same or different with each other.

The compound represented by the formula (a1) has a cationic polymerizable functional group while maintaining excellent optical properties and thermal properties, and therefore has high reactivity. Particularly, when the rings $Y^1$ and $Y^2$ are benzene rings and R is a single bond, the compound represented by the formula (a1) has a fluorene skeleton and is more excellent in optical properties and thermal properties. The compound represented by the formula (a1) gives a cured product having high hardness and is preferably as a base material component in the composition.

Of the compounds represented by the formula (a1), particularly preferred specific examples include epoxy group-containing fluorene compounds such as 9,9-bis[4-[2-(glycidyloxy)ethoxy]phenyl]-9H-fluorene, 9,9-bis[4-[2-(glycidyloxy)ethyl]phenyl]-9H-fluorene, 9,9-bis[4-(glycidyloxy)-3-methylphenyl]-9H-fluorene, 9,9-bis[4-(glycidyloxy)-3,5-dimethylphenyl]-9H-fluorene, 9,9-bis(6-glycidyloxynaphthalen-1-yl)-9H-fluorene, and 9,9-bis(5-glycidyloxynaphthalen-2-yl)-9H-fluorene; and compounds represented by the following formulas.

[Formula 6]

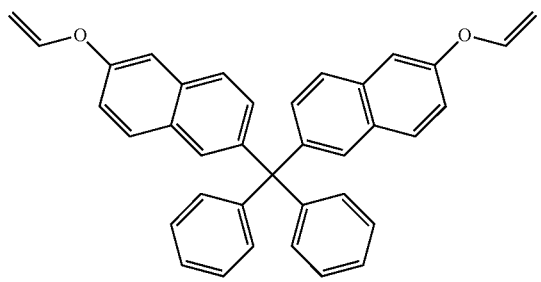

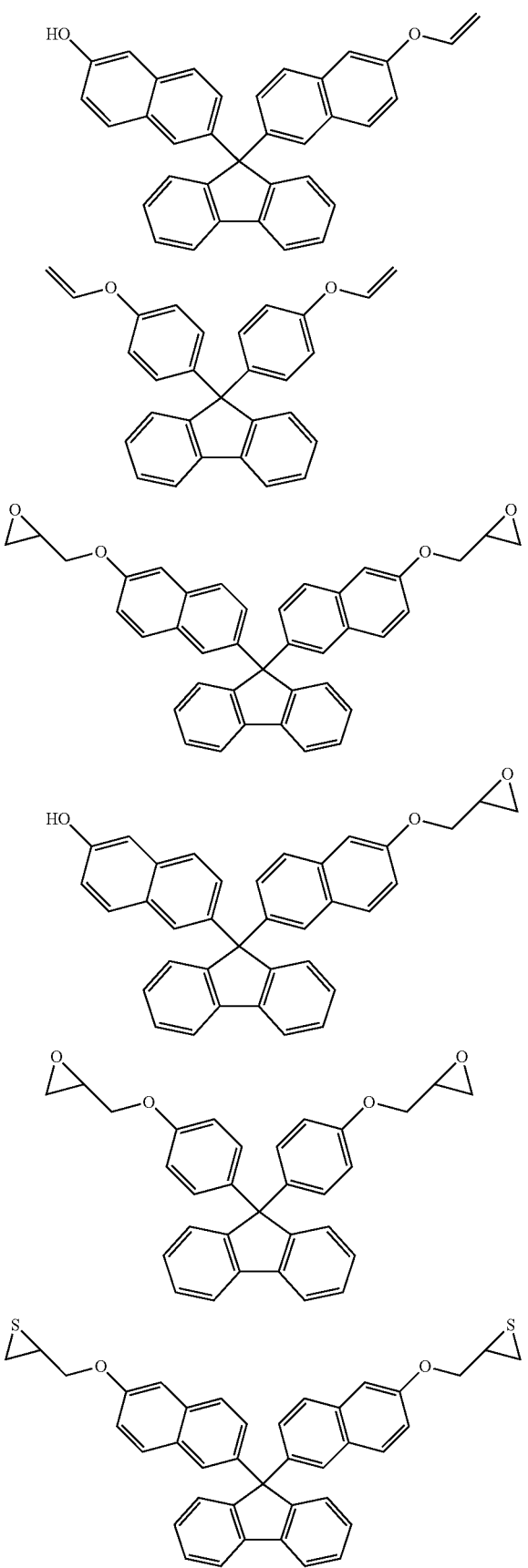
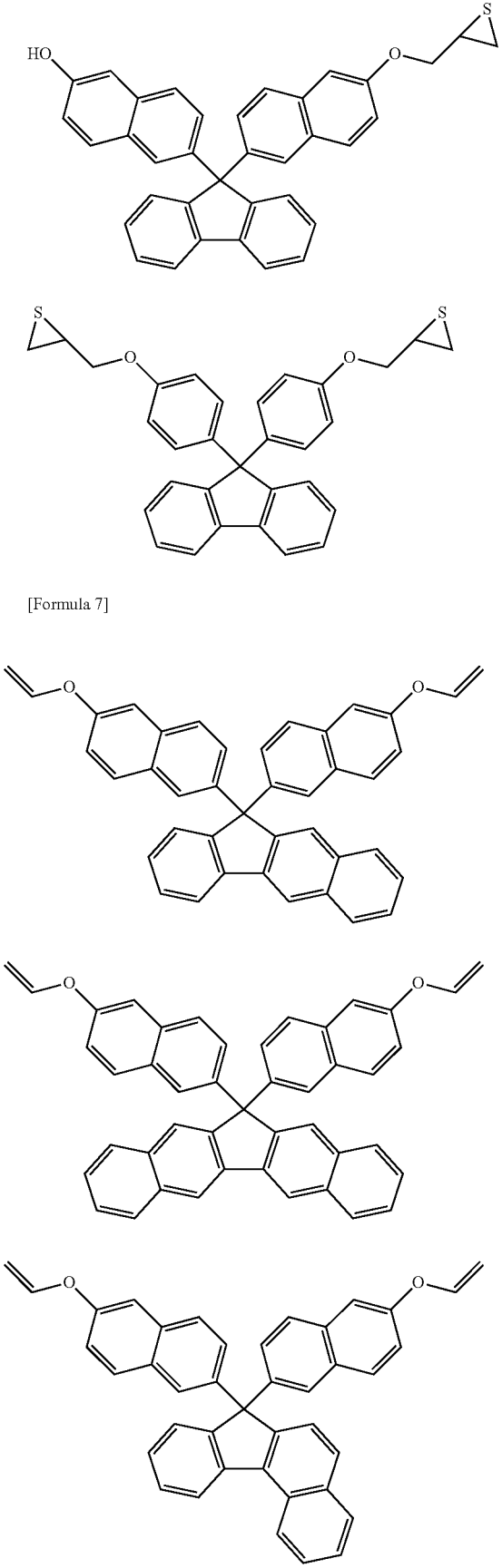
[Formula 7]

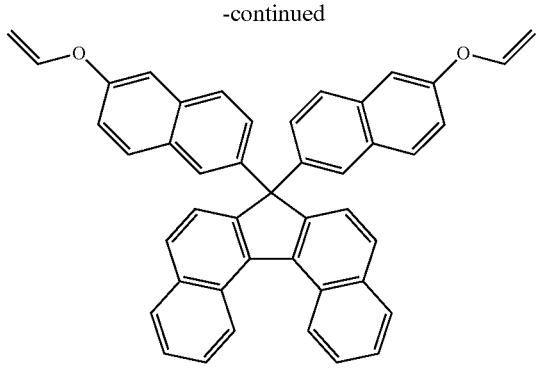
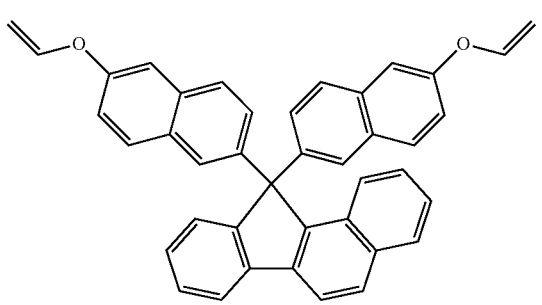
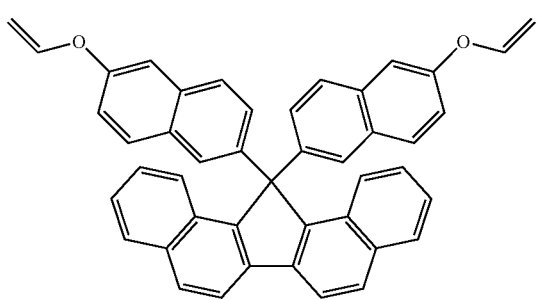
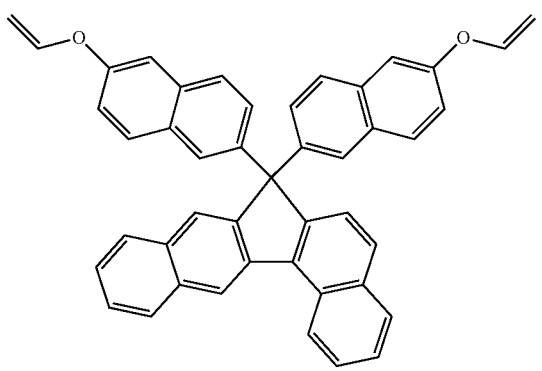
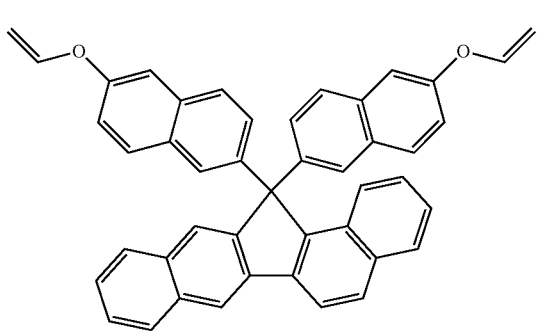
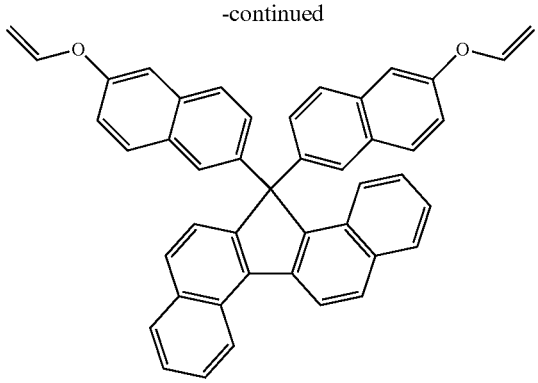
[Formula 8]
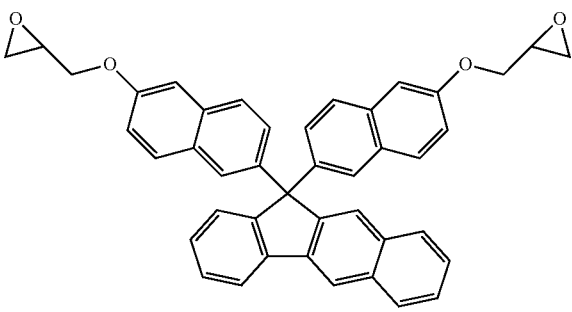
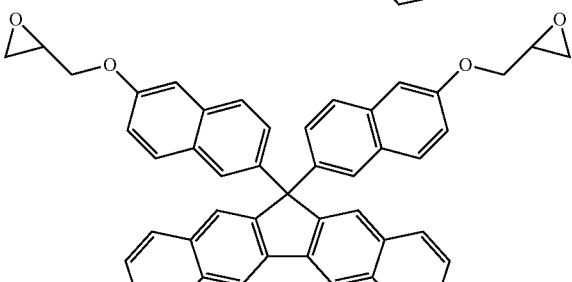
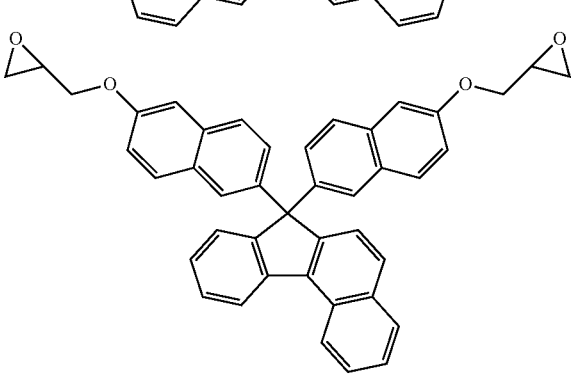
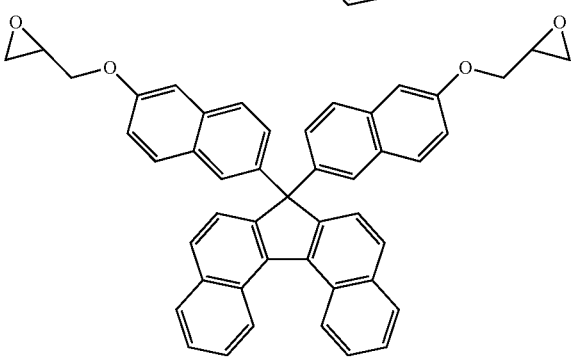

13
-continued
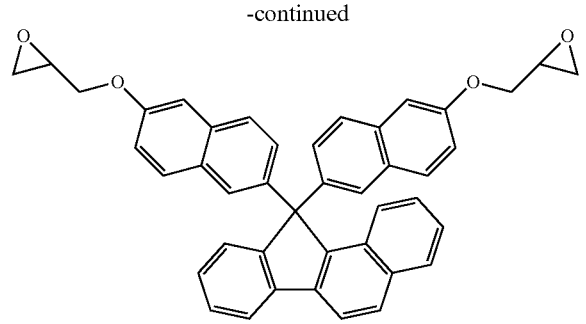
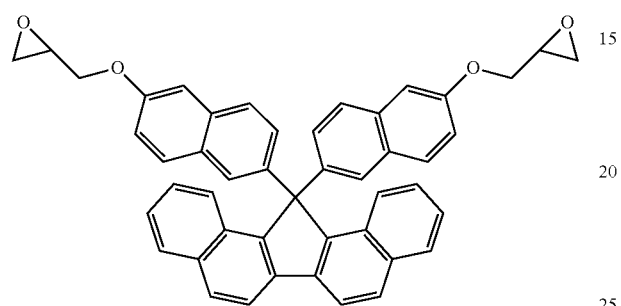
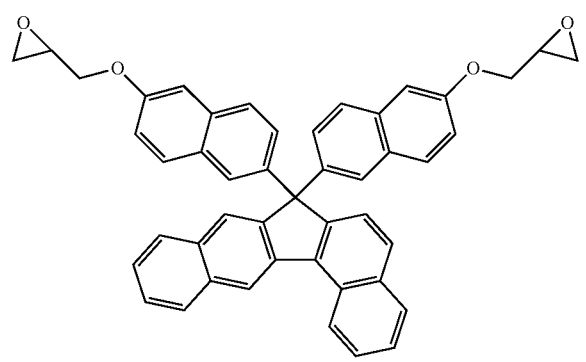
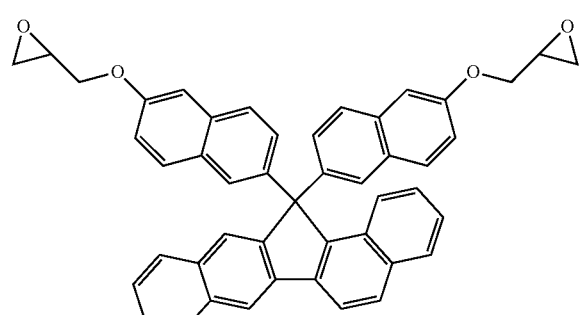
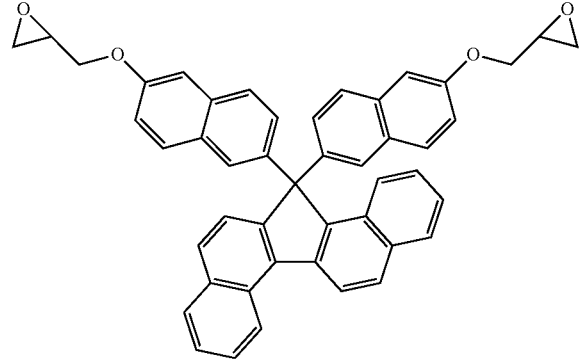
14
-continued
[Formula 9]
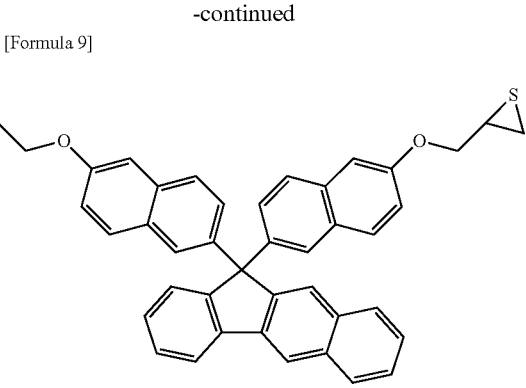
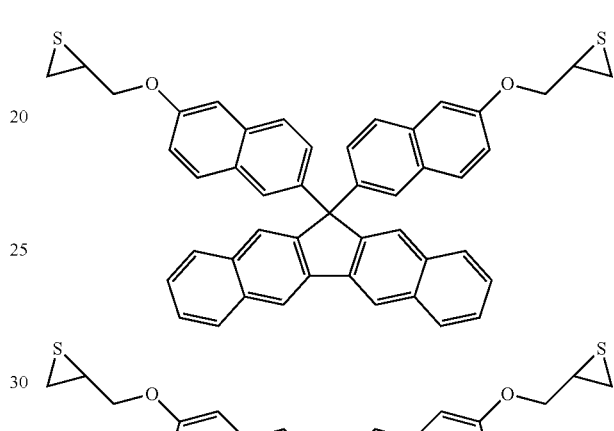
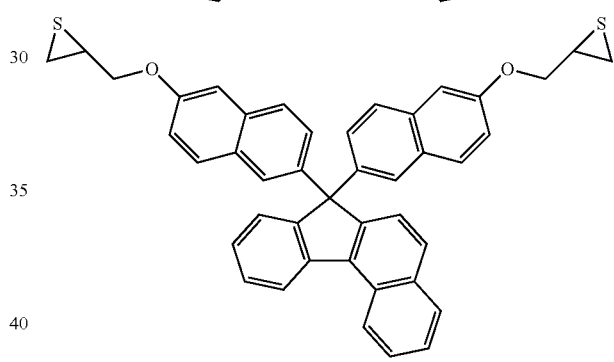
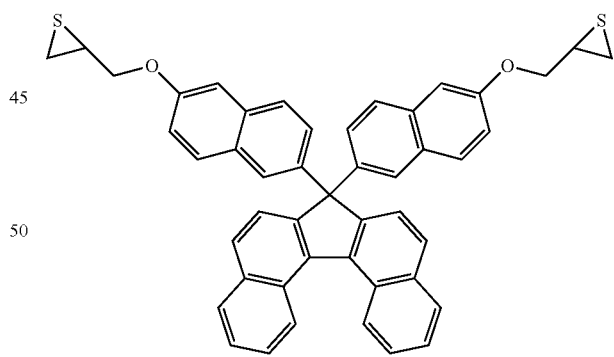
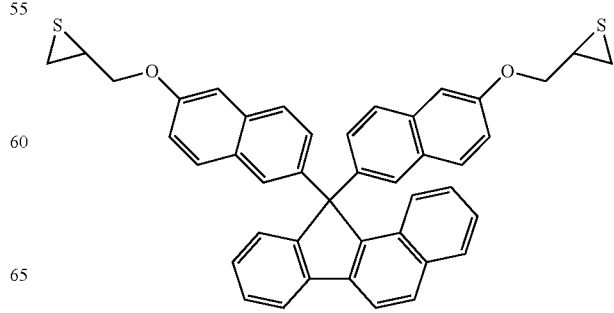

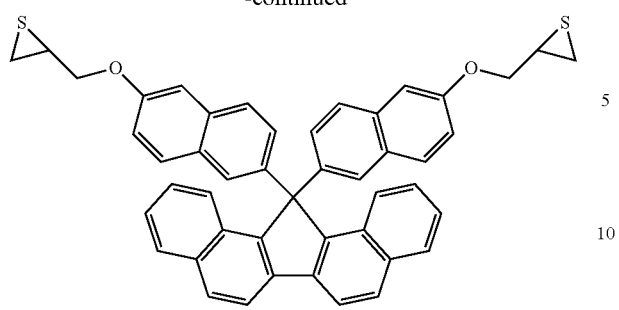
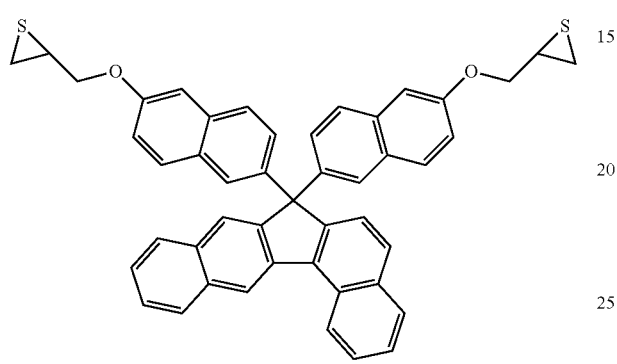
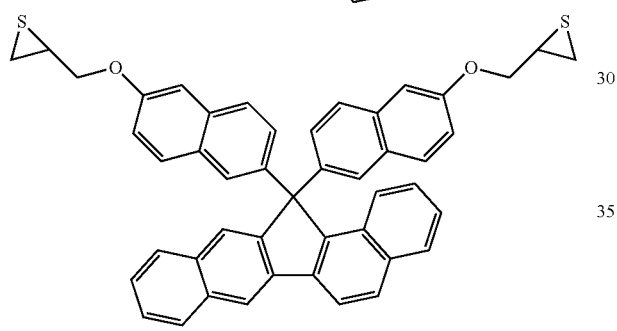
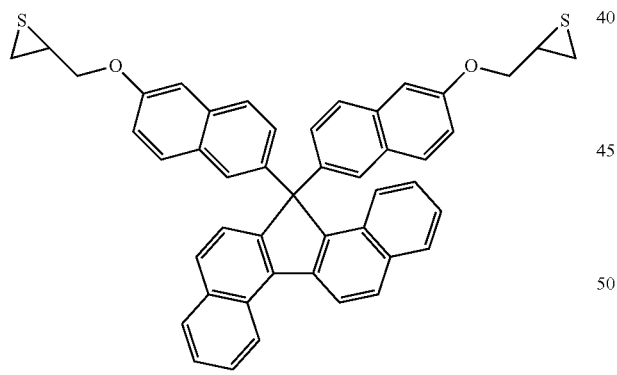
[Formula 10]
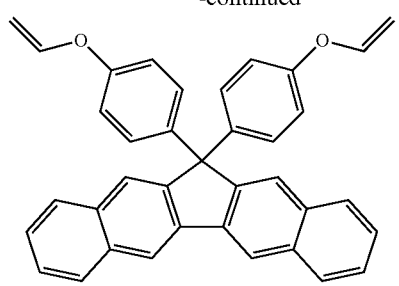
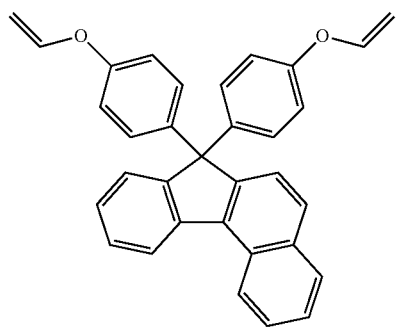
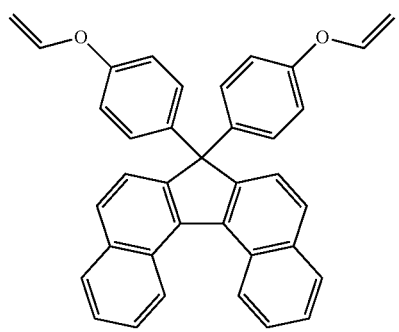
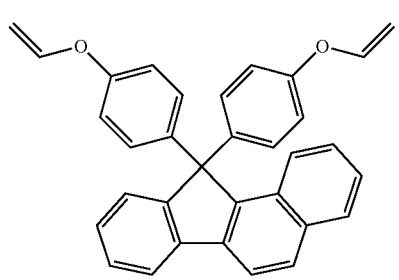
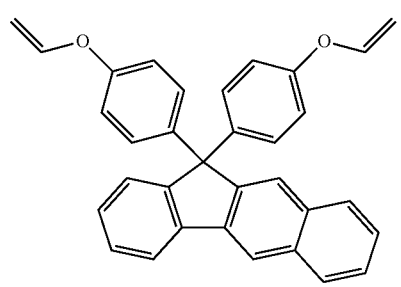
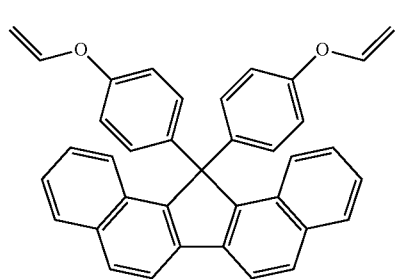

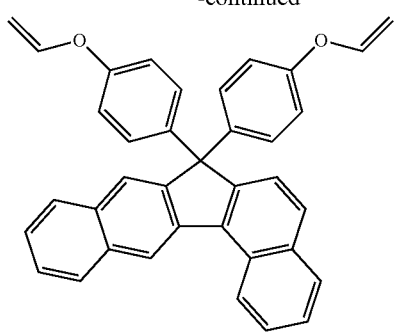
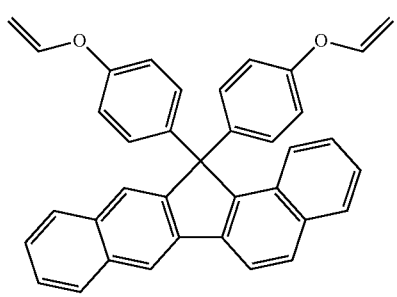
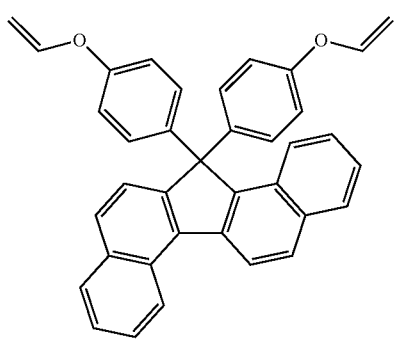
[Formula 11]
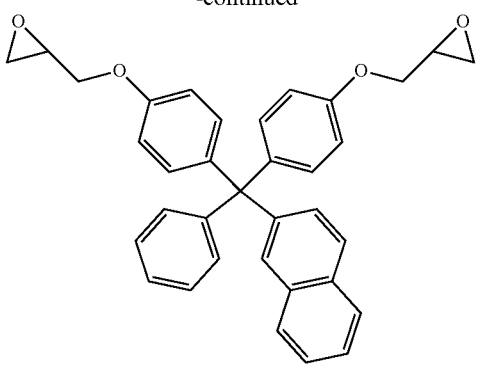
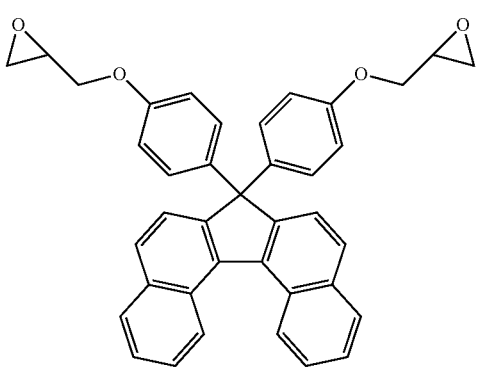
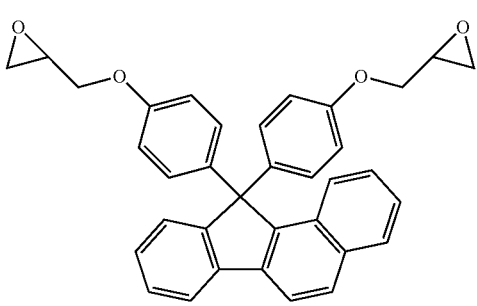
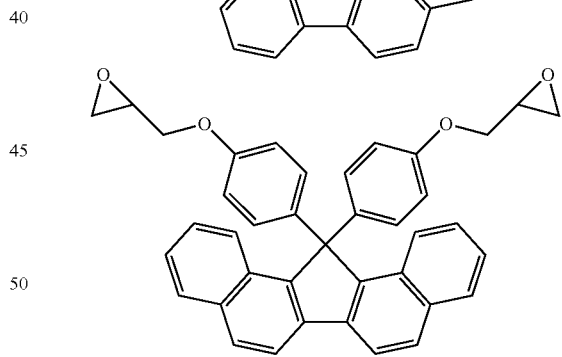
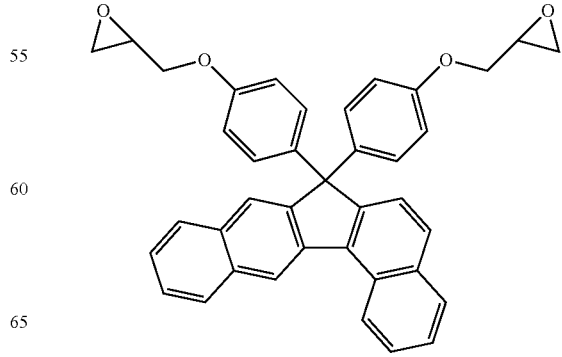

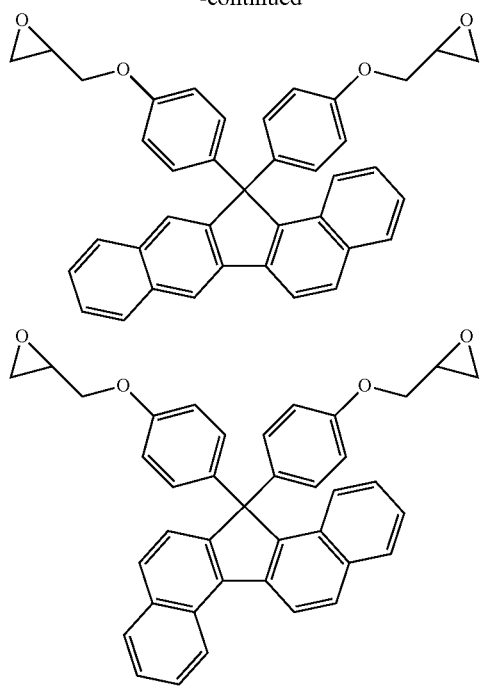
[Formula 12]
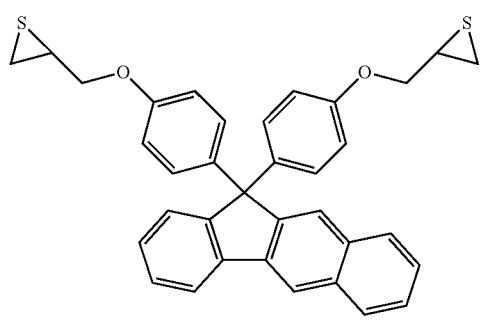
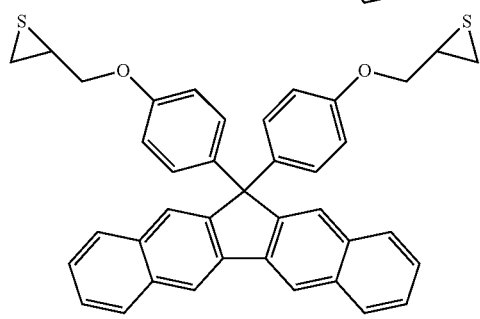
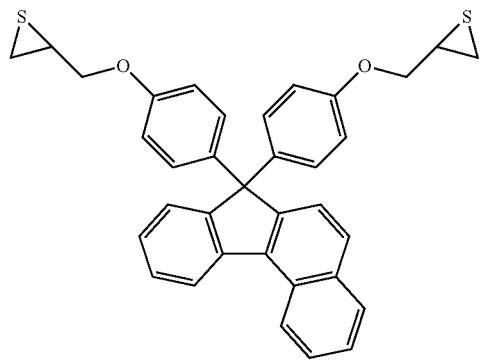
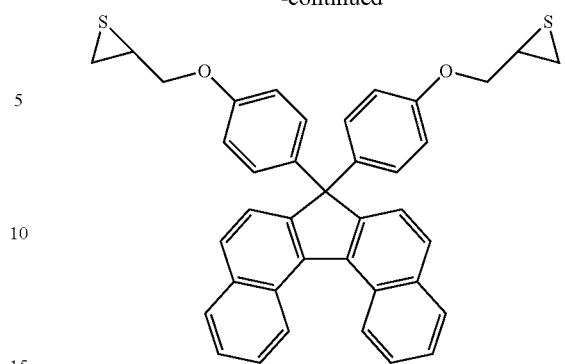
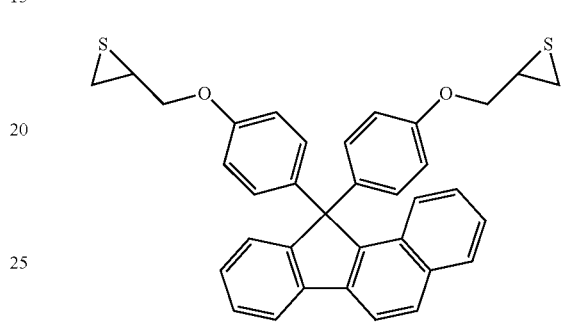
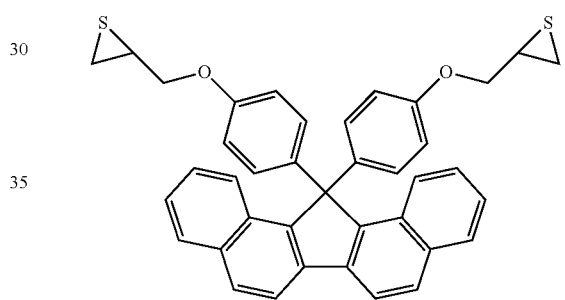
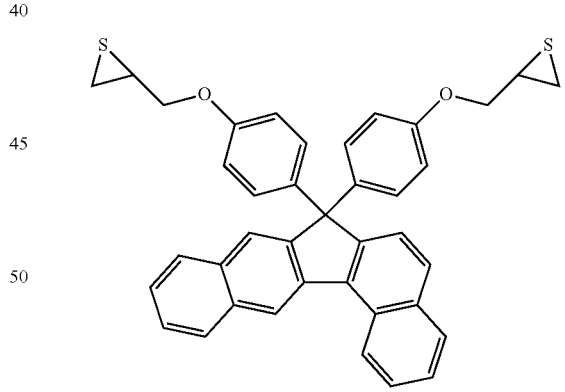
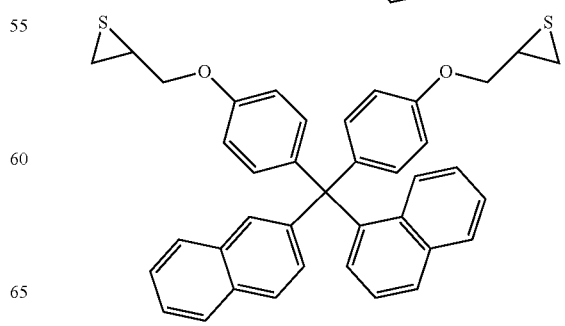

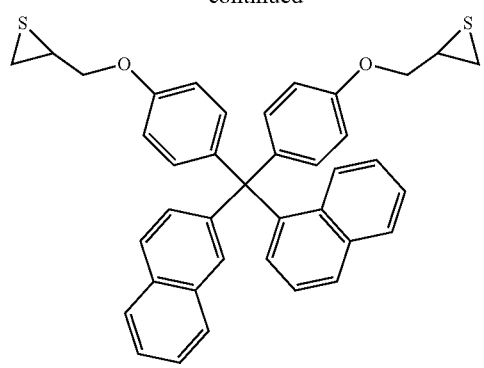
[Formula 13]
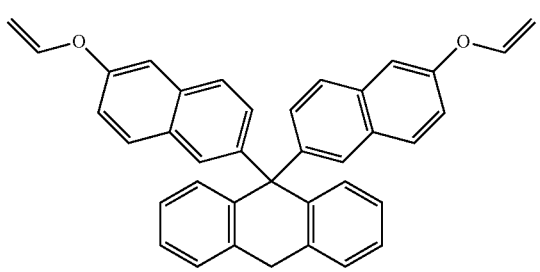
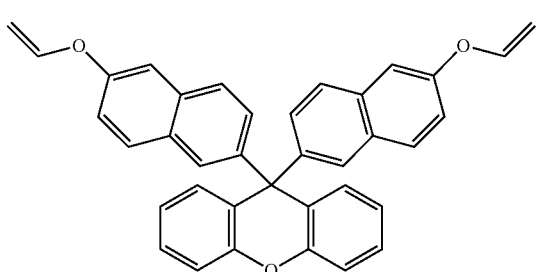
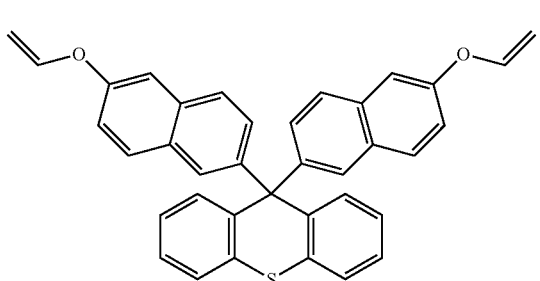
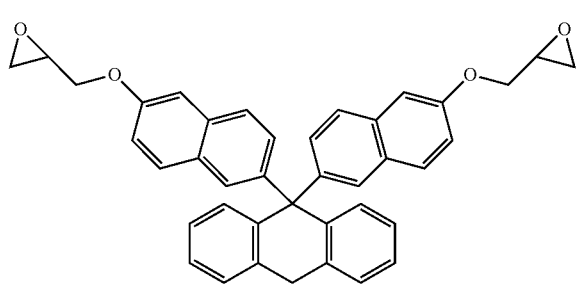
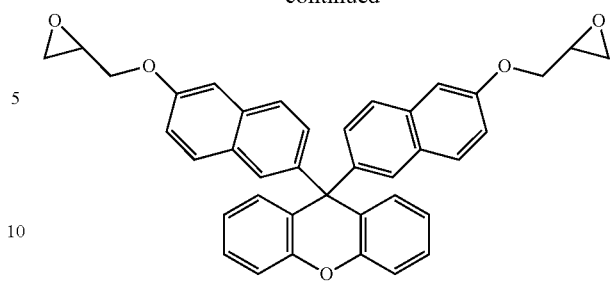
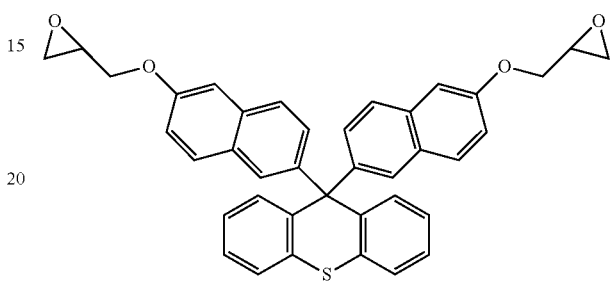
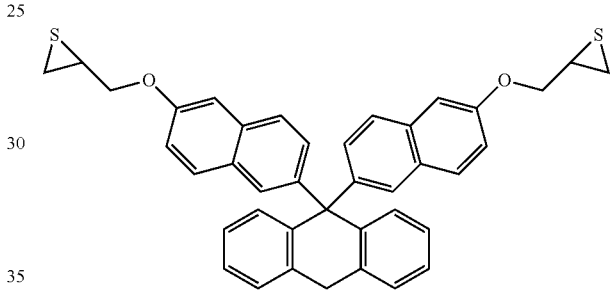
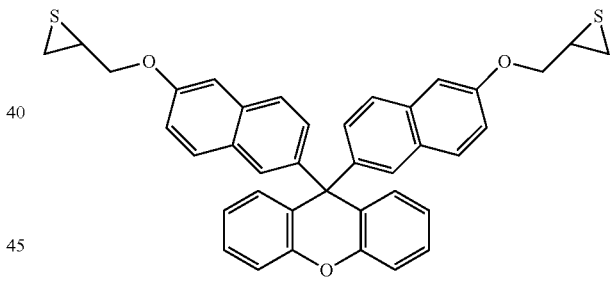
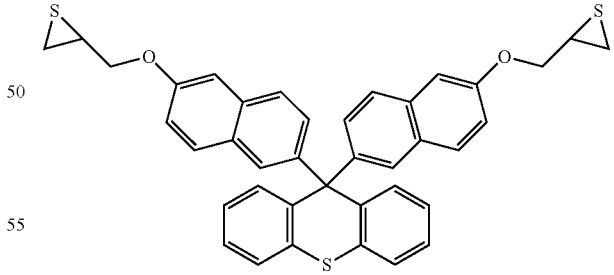
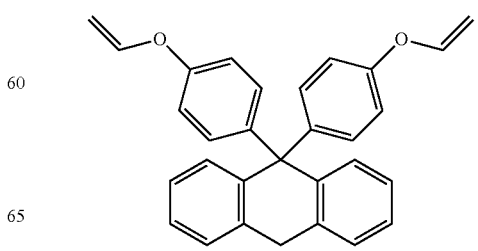

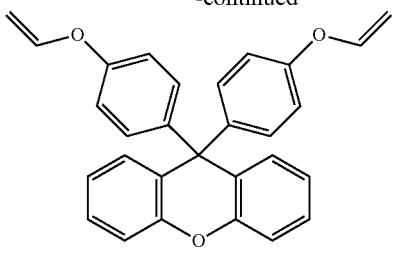
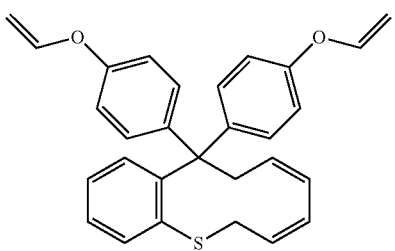
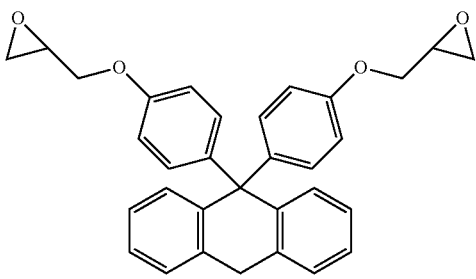
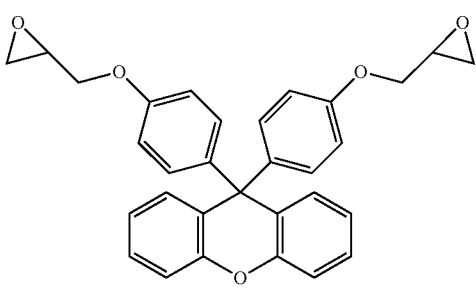 [SMILES: c1ccc2c(c1)Sc1ccccc1C2(c1ccc(OCC2CS2)cc1)c1ccc(OCC2CS2)cc1]
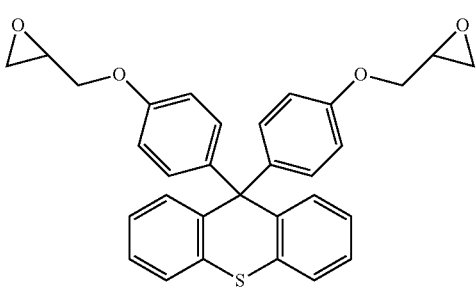
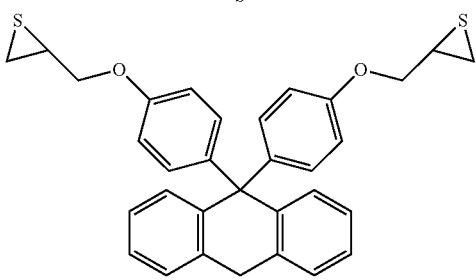
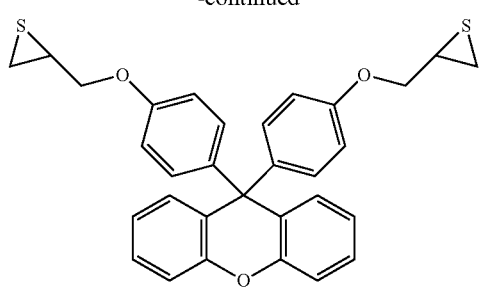
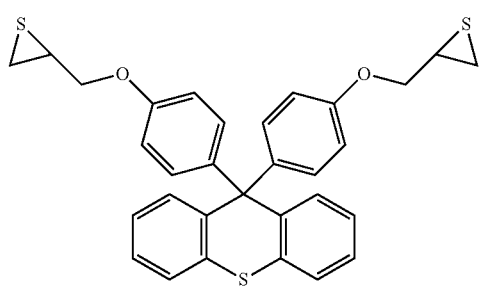
Of the compounds represented by the formula (a1) described above, the following compounds are particularly preferable.
[Formula 14]
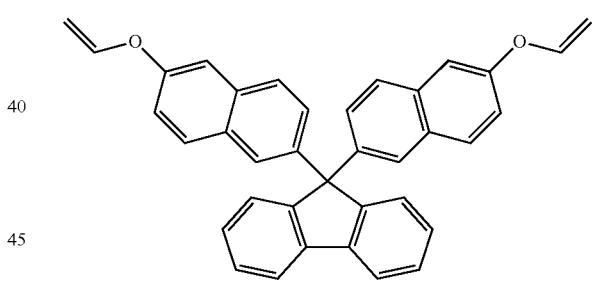
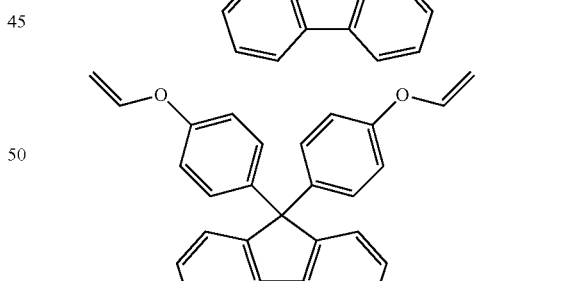
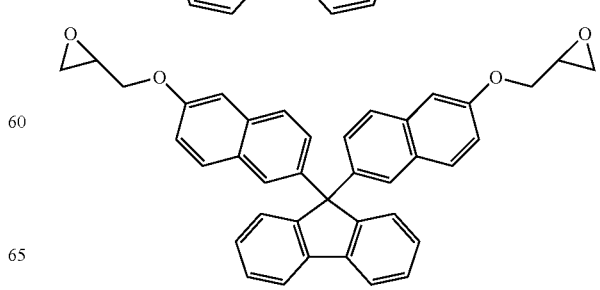

-continued

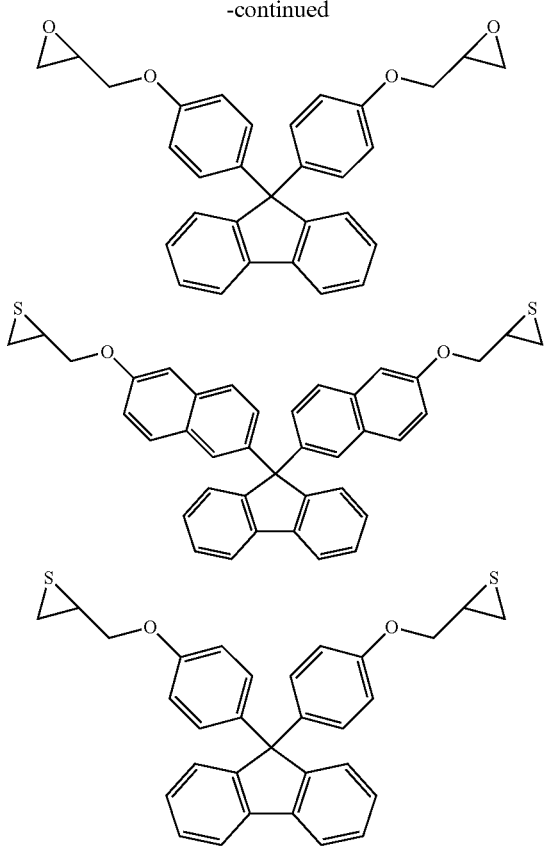

The curable compound (A) may contain a cationic polymerizable compound other than the compound represented by the formula (a1). The amount of the compound represented by the formula (a1) in the curable compound (A) is preferably 50% by mass or more, more preferably 70% by mass or more, still more preferably 80% by mass or more, particularly preferably 90% by mass or more, and most preferably 100% by mass.

Examples of the cationic polymerizable compound other than the compound represented by the formula (a1) include a vinyl ether compound having a vinyloxy group, an epoxy compound having an epoxy group, and an episulfide compound having an episulfide group. Description will be made of a vinyl ether compound, an epoxy compound, and an episulfide compound.

(Vinyl Ether Compound)

The vinyl ether compound to be used together with the compound represented by the formula (a1) is not particularly limited as long as it has a vinyloxy group and is a cationic polymerizable compound. The vinyl ether compound to be used in combination with the compound represented by the formula (a1) may have an aromatic group or not.

In view of satisfactory pyrolysis resistance of the cured product, the vinyl ether compound to be used in combination with the compound represented by the formula (a1) is preferably a compound having a vinyloxy group bonded to an aromatic group.

Suitable specific examples of the vinyl ether compound usable together with the compound represented by the formula (a1) include aromatic monovinyl ether compounds such as vinyl phenyl ether, 4-vinyloxytoluene, 3-vinyloxytoluene, 2-vinyloxytoluene, 1-vinyloxy-4-chlorobenzene, 1-vinyloxy-3-chlorobenzene, 1-vinyloxy-2-chlorobenzene, 1-vinyloxy-2,3-dimethylbenzene, 1-vinyloxy-2,4-dimethylbenzene, 1-vinyloxy-2, 5-dimethylbenzene, 1-vinyloxy-2,6-dimethylbenzene, 1-vinyloxy-3,4-dimethylbenzene, 1-vinyloxy-3,5-dimethylbenzene, 1-vinyloxynaphthalene, 2-vinyloxynaphthalene, 2-vinyloxyfluorene, 3-vinyloxyfluorene, 4-vinyloxy-1,1'-biphenyl, 3-vinyloxy-1,1'-biphenyl, 2-vinyloxy-1,1'-biphenyl, 6-vinyloxytetralin, and 5-vinyloxytetralin; and aromatic divinyl ether compounds such as 1,4-divinyloxybenzene, 1,3-divinyloxybenzene, 1,2-divinyloxybenzene, 1,4-divinyloxynaphthalene, 1,3-divinyloxynaphthalene, 1,2-divinyloxynaphthalene, 1,5-divinyloxynaphthalene, 1,6-divinyloxynaphthalene, 1,7-divinyloxynaphthalene, 1,8-divinyloxynaphthalene, 2,3-divinyloxynaphthalene, 2,6-divinyloxynaphthalene, 2,7-divinyloxynaphthalene, 1,2-divinyloxyfluorene, 3,4-divinyloxyfluorene, 2,7-divinyloxyfluorene, 4,4'-divinyloxybiphenyl, 3,3'-divinyloxybiphenyl, 2,2'-divinyloxybiphenyl, 3,4'-divinyloxybiphenyl, 2,3'-divinyloxybiphenyl, 2,4'-divinyloxybiphenyl, and bisphenol A divinyl ether.

These vinyl ether compounds can be used in combination of two or more types thereof.

(Epoxy Compound)

Examples of the epoxy compound usable together with the compound represented by the formula (a1) include difunctional epoxy resins such as a bisphenol A type epoxy resin, a bisphenol F type epoxy resin, a bisphenol S type epoxy resin, a bisphenol AD type epoxy resin, a naphthalene type epoxy resin, and a biphenyl type epoxy resin; novolak epoxy resins such as a phenol novolak type epoxy resin, a brominated phenol novolak type epoxy resin, an ortho-cresol novolak type epoxy resin, a bisphenol A novolak type epoxy resin, and a bisphenol AD novolak type epoxy resin; cyclic aliphatic epoxy resins such as an epoxidized product of a dicyclopentadiene type phenol resin; aromatic epoxy resins such as an epoxidized product of a naphthalene type phenol resin; glycidyl ester type epoxy resins such as a dimer acid glycidyl ester and triglycidyl ester; glycidylamine type epoxy resins such as tetraglycidylaminodiphenylmethane, triglycidyl-p-aminophenol, tetraglycidylmetaxylenediamine, and tetraglycidyl bisaminomethylcyclohexane; heterocyclic epoxy resins such as triglycidyl isocyanurate; trifunctional epoxy resins such as phloroglucinol triglycidyl ether, trihydroxybiphenyl triglycidyl ether, trihydroxyphenylmethane triglycidyl ether, glycerin triglycidyl ether, 2-[4-(2,3-epoxypropoxy)phenyl]-2-[4-[1,1-bis[4-(2,3-epoxypropoxy)phenyl]ethyl]phenyl]
propane, and 1,3-bis[4-[1-[4-(2,3-epoxypropoxy)phenyl]-1-[4-[1-[4-(2,3-epoxypropoxy)phenyl]-1-methylethyl]phenyl]ethyl]phenoxy]-2-propanol; tetrafunctional epoxy resins such as tetrahydroxyphenylethane tetraglycidyl ether, tetraglycidylbenzophenone, bisresorcinol tetraglycidyl ether, and tetraglycidoxybiphenyl; and a 1,2-epoxy-4-(2-oxyranyl) cyclohexane adduct of 2,2-bis(hydroxymethyl)-1-butanol. The 1,2-epoxy-4-(2-oxiranyl)cyclohexene adduct of 2,2-bis (hydroxymethyl)-1 butanol is commercially available as EHPE-3150 (manufactured by Daicel Corporation).

The oligomer or polymer type polyfunctional epoxy compound can also be preferably used as the curable compound (A).

Typical examples thereof include a phenol novolak type epoxy compound, a brominated phenol novolak type epoxy compound, an ortho-cresol novolak type epoxy compound, a xylenol novolak type epoxy compound, a naphthol novolak type epoxy compound, a bisphenol A novolak type epoxy compound, a bisphenol AD novolak type epoxy compound, an epoxidized product of a dicyclopentadiene type phenol resin, an epoxidized product of a naphthalene type phenol resin, and the like.

Suitable other examples of the epoxy compound usable in combination with the compound represented by the formula (a1) include a polyfunctional alicyclic epoxy compound having an alicyclic epoxy group. When the curable compound (A) contains an alicyclic epoxy compound, it is easy to form a cured product having excellent transparency using a curable composition.

Specific examples of such alicyclic epoxy compound include 2-(3,4-epoxycyclohexyl-5,5-spiro-3,4-epoxy)cyclohexane-meta-dioxane, bis(3,4-epoxycyclohexylmethyl)adipate, bis(3,4-epoxy-6-methylcyclohexylmethyl)adipate, 3,4-epoxy-6-methylcyclohexyl-3', 4'-epoxy-6'-methylcyclohexanecarboxylate, e-caprolactone-modified 3,4-epoxycyclohexylmethyl-3',4'-epoxycyclohexanecarboxylate, trimethyl-caprolactone-modified 3,4-epoxycyclohexylmethyl-3',4'-epoxycyclohexanecarboxylate, β-methyl-δ-valerolactone-modified 3,4-epoxycyclohexylmethyl-3', 4'-epoxycyclohexane carboxylate, methylenebis(3,4-epoxycyclohexane), di(3,4-epoxycyclohexylmethyl)ether of ethylene glycol, ethylenebis(3,4-epoxycyclohexane carboxylate), and a polyfunctional epoxy compound having a tricyclodecene oxide group and compounds represented by the following formulas (a1-1) to (a1-5). These alicyclic epoxy compounds can be used alone or in combination of two or more types thereof.

[Formula 15]

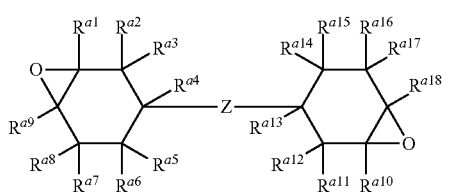

(a1-1)

In the formula (a1-1), Z represents a single bond or a linking group (divalent group having one or more atoms.

$R^{a1}$ to $R^{a18}$ each independently represent a group selected from the group consisting of a hydrogen atom, a halogen atom, and an organic group.

Examples of the linking group Z include a divalent hydrocarbon group, a divalent group selected from the group consisting of —O—, —O—CO—, —S—, —SO—, —SO$_2$—, —CBr$_2$—, —C(CBr$_3$)$_2$—, —C(CF$_3$)$_2$—, and —R$^{a19}$—O—CO—, and a group in which plural these groups are bonded.

Examples of the divalent hydrocarbon group as the linking group Z include a linear or branched alkylene group having 1 or more and 18 or less carbon atoms, a divalent alicyclic hydrocarbon group, and the like. Examples of the linear or branched alkylene group having 1 or more and 18 or less carbon atoms include a methylene group, a methylmethylene group, a dimethylmethylene group, a dimethylene group, a trimethylene group, and the like. Examples of the divalent alicyclic hydrocarbon group include cycloalkylene groups (including a cycloalkylidene group) such as a 1,2-cyclopentylene group, a 1,3-cyclopentylene group, a cyclopentylidene group, a 1,2-cyclohexylene group, a 1,3-cyclohexylene group, a 1,4-cyclohexylene group, a cyclohexylidene group, and the like.

$R^{a19}$ is an alkylene group having 1 or more and 8 or less carbon atoms, and preferably a methylene group or an ethylene group.

[Formula 16]

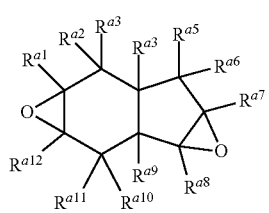

(a1-2)

In the formula (a1-2), $R^{a1}$ to $R^{a12}$ are groups selected from the group consisting of a hydrogen atom, a halogen atom, and an organic group.

[Formula 17]

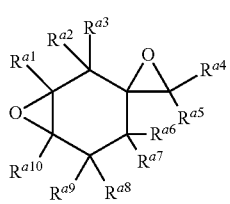

(a1-3)

In the formula (a1-3), $R^{a1}$ to $R^{a10}$ are groups selected from the group consisting of a hydrogen atom, a halogen atom, and an organic group. $R^{a2}$ and $R^{a8}$ may be combined with each other.

[Formula 18]

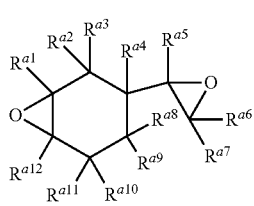

(a1-4)

In the formula (a1-4), $R^{a1}$ to $R^{a12}$ are groups selected from the group consisting of a hydrogen atom, a halogen atom, and an organic group. $R^{a2}$ and $R^{a10}$ may be combined with each other.

[Formula 19]

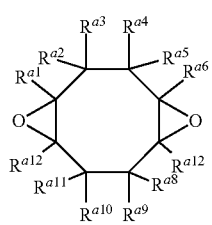

(a1-5)

In the formula (a1-5), $R^{a1}$ to $R^{a12}$ are groups selected from the group consisting of a hydrogen atom, a halogen atom, and an organic group.

In the formulas (a1-1) to (a1-5), when $R^{a1}$ to $R^{a18}$ are organic groups, the organic group is not particularly limited as long as the object of the present invention is not impaired, and may be a hydrocarbon group, a group composed of a carbon atom and a halogen atom, or a group containing heteroatoms such as a halogen atom, an oxygen atom, a sulfur atom, a nitrogen atom, and a silicon atom, together with a carbon atom and a hydrogen atom.

Examples of the halogen atom include a chlorine atom, a bromine atom, an iodine atom, and a fluorine atom.

The organic group is preferably a group composed of a hydrocarbon group and a carbon atom, a hydrogen atom, and an oxygen atom, a group composed of a halogenated hydrocarbon group and a carbon atom, an oxygen atom, and a halogen atom, and a group composed of a carbon atom, a hydrogen atom, an oxygen atom, and a halogen atom.

When the organic group is a hydrocarbon group, the hydrocarbon group may be an aromatic hydrocarbon group, or an aliphatic hydrocarbon group, or a group including an aromatic skeleton and an aliphatic skeleton.

The number of carbon atoms of the organic group is preferably 1 or more and 20 or less, more preferably 1 or more and 10 or less, and particularly preferably 1 or more and 5 or less.

Specific examples of the hydrocarbon group include chain alkyl groups such as a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, a 2-ethylhexyl group, an n-nonyl group, an n-decyl group, an n-undecyl group, an n-tridecyl group, an n-tetradecyl group, an n-pentadecyl group, an n-hexadecyl group, an n-heptadecyl group, an n-octadecyl group, an n-nonadecyl group, and an n-icosyl group; chain alkenyl groups such as a vinyl group, a 1-propenyl group, a 2-n-propenyl group (allyl group), a 1-n-butenyl group, a 2-n-butenyl group, and a 3-n-butenyl group; cycloalkyl groups such as a cyclopropyl group, a cyclobutyl group, a cyclopentyl group, a cyclohexyl group, and a cycloheptyl group; aryl groups such as a phenyl group, an o-tolyl group, a m-tolyl group, a p-tolyl group, an α-naphthyl group, a β-naphthyl group, a biphenyl-4-yl group, a biphenyl-3-yl group, a biphenyl-2-yl group, an anthryl group, and a phenanthryl group; and aralkyl groups such as a benzyl group, a phenethyl group, an a-naphthylmethyl group, a β-naphthylmethyl group, an a-naphthylethyl group, and a β-naphthylethyl group.

Specific examples of the halogenated hydrocarbon group include halogenated chain alkyl groups such as a chloromethyl group, a dichloromethyl group, a trichloromethyl group, a bromomethyl group, a dibromomethyl group, a tribromomethyl group, a fluoromethyl group, a difluoromethyl group, a trifluoromethyl group, a 2,2,2-trifluoroethyl group, a pentafluoroethyl group, a heptafluoropropyl group, a perfluorobutyl group, a perfluoropentyl group, a perfluorohexyl group, a perfluoroheptyl group, a perfluorooctyl group, a perfluorononyl group, and a perfluorodecyl group; halogenated cycloalkyl groups such as a 2-chlorocyclohexyl group, a 3-chlorocyclohexyl group, a 4-chlorocyclohexyl group, a 2,4-dichlorocyclohexyl group, a 2-bromocyclohexyl group, a 3-bromocyclohexyl group, and a 4-bromocyclohexyl group; halogenated aryl groups such as a 2-chlorophenyl group, a 3-chlorophenyl group, a 4-chlorophenyl group, a 2,3-dichlorophenyl group, a 2,4-dichlorophenyl group, a 2,5-dichlorophenyl group, a 2,6-dichlorophenyl group, a 3,4-dichlorophenyl group, a 3,5-dichlorophenyl group, a 2-bromophenyl group, a 3-bromophenyl group, a 4-bromophenyl group, a 2-fluorophenyl group, a 3-fluorophenyl group, and a 4-fluorophenyl group; and halogenated aralkyl groups such as a 2-chlorophenylmethyl group, a 3-chlorophenylmethyl group, a 4-chlorophenylmethyl group, a 2-bromophenylmethyl group, a 3-bromophenylmethyl group, a 4-bromophenylmethyl group, a 2-fluorophenylmethyl group, a 3-fluorophenylmethyl group, and a 4-fluorophenylmethyl group.

Specific examples of the group composed of a carbon atom, a hydrogen atom, and an oxygen atom include hydroxy chain alkyl groups such as a hydroxymethyl group, a 2-hydroxyethyl group, a 3-hydroxy-n-propyl group, and a 4-hydroxy-n-butyl group; halogenated cycloalkyl groups such as a 2-hydroxycyclohexyl group, a 3-hydroxycyclohexyl group, and a 4-hydroxycyclohexyl group; hydroxyaryl groups such as a 2-hydroxyphenyl group, a 3-hydroxyphenyl group, a 4-hydroxyphenyl group, a 2,3-dihydroxyphenyl group, a 2,4-dihydroxyphenyl group, a 2,5-dihydroxyphenyl group, a 2,6-dihydroxyphenyl group, a 3,4-dihydroxyphenyl group, and a 3,5-dihydroxyphenyl group; hydroxyaralkyl groups such as a 2-hydroxyphenylmethyl group, a 3-hydroxyphenylmethyl group, and a 4-hydroxyphenylmethyl group; chain alkoxy groups such as a methoxy group, an ethoxy group, an n-propoxy group, an isopropoxy group, an n-butyloxy group, an isobutyloxy group, a sec-butyloxy group, a tert-butyloxy group, an n-pentyloxy group, an n-hexyloxy group, an n-heptyloxy group, an n-octyloxy group, a 2-ethylhexyloxy group, an n-nonyloxy group, an n-decyloxy group, an n-undecyloxy group, an n-tridecyloxy group, an n-tetradecyloxy group, an n-pentadecyloxy group, an n-hexadecyloxy group, an n-heptadecyloxy group, an n-octadecyloxy group, an n-nonadecyloxy group, and an n-icosyloxy group; chain alkenyloxy groups such as a vinyloxy group, a 1-propenyloxy group, a 2-n-propenyloxy group (allyloxy group), a 1-n-butenyloxy group, a 2-n-butenyloxy group, and a 3-n-butenyloxy group; aryloxy groups such as a phenoxy group, an o-tolyloxy group, a m-tolyloxy group, a p-tolyloxy group, an α-naphthyloxy group, a β-naphthyloxy group, a biphenyl-4-yloxy group, a biphenyl-3-yloxy group, a biphenyl-2-yloxy group, an anthryloxy group, and a phenanthryloxy group; aralkyloxy groups such as a benzyloxy group, a phenethyloxy group, an a-naphthylmethyloxy group, a β-naphthylmethyloxy group, an α-naphthylethyloxy group, and a β-naphthylethyloxy group; alkoxyalkyl groups such as a methoxymethyl group, an ethoxymethyl group, an n-propoxymethyl group, a 2-methoxyethyl group, a 2-ethoxyethyl group, a 2-n-propoxyethyl group, a 3-methoxy-n-propyl group, a 3-ethoxy-n-propyl group, a 3-n-propoxy-n-propyl group, a 4-methoxy-n-butyl group, a 4-ethoxy-n-butyl group, and a 4-n-propoxy-n-butyl group; alkoxyalkoxy groups such as a methoxymethoxy group, an ethoxymethoxy group, an n-propoxymethoxy group, a 2-methoxyethoxy group, a 2-ethoxyethoxy group, a 2-n-propoxyethoxy group, a 3-methoxy-n-propoxy group, a 3-ethoxy-n-propoxy group, a 3-n-propoxy-n-propoxy group, a 4-methoxy-n-butyloxy group, a 4-ethoxy-n-butyloxy group, and a 4-n-propoxy-n-butyloxy group; alkoxyaryl groups such as a 2-methoxyphenyl group, a 3-methoxyphenyl group, and a 4-methoxyphenyl group; alkoxyaryloxy groups such as a 2-methoxyphenoxy group, a 3-methoxyphenoxy group, and a 4-methoxyphenoxy group; aliphatic acyl groups such as a formyl group, an acetyl group, a propionyl group, a butanoyl group, a pentanoyl group, a hexanoyl group, a heptanoyl group, an octanoyl group, a nonanoyl group, and a decanoyl group; aromatic acyl groups such as a benzoyl group, an a-naphthoyl group, and a β-naphthoyl group; chain alkyloxycarbonyl groups such as a methoxycarbonyl group, an ethoxycarbonyl group, an n-propoxycarbonyl group, an n-butyloxycarbonyl group, an n-pentyloxycarbonyl group, an n-hexylcarbonyl group, an n-heptyloxycarbonyl group, an n-octyloxycarbonyl group, an n-nonyloxycarbonyl group, and an n-decyloxycarbonyl group; aryloxycarbonyl groups such as a phenoxycarbonyl group, an α-naphthoxycarbonyl group, and a β-naphthoxycarbonyl group; aliphatic acyloxy groups such as a formyloxy group, an acetyloxy group, a propionyloxy group, a butanoyloxy group, a pentanoyloxy group, a hexanoyloxy group, a heptanoyloxy group, an octanoyloxy group, a nonanoyloxy group, and a decanoyloxy group; and aromatic acyloxy groups such as a benzoyloxy group, an a-naphthoyl oxy group, and a β-naphthoyl oxy group.

$R^{a1}$ to $R^{a18}$ each independently is preferably a group selected from the group consisting of a hydrogen atom, a halogen atom, an alkyl group having 1 or more and 5 or less carbon atoms, and an alkoxy group having 1 or more and 5 or less carbon atoms. All $R^{a1}$ to $R^{a18}$ are more preferably hydrogen atoms since it is easy to form a cured film having particularly excellent mechanical properties.

In the formulas (a1-2) to (a1-5), $R^{a1}$ to $R^{a12}$ are the same as $R^{a1}$ to $R^{a12}$ in the formula (a1-1).

In the formulas (a1-2) and formula (a1-4), when $R^{a2}$ and $R^{a10}$ are combined with each other, a divalent group thus formed includes, for example, —CH$_2$— and —C(CH$_3$)$_2$—. In the formula (a1-3), when $R^{a2}$ and $R^{a8}$ are combined with each other, a divalent group thus formed includes, for example, —CH$_2$— and —C(CH$_3$)$_2$—.

Of the alicyclic epoxy compounds represented by the formula (a1-1), specific examples of suitable compound include alicyclic epoxy compounds represented by the following formula (a1-1a), formula (a1-1b), and formula (a1-1c), 2,2-bis(3,4-epoxycyclohexan-1-yl)propane[=2,2-bis(3,4-epoxycyclohexyl)propane], and the like.

[Formula 20]

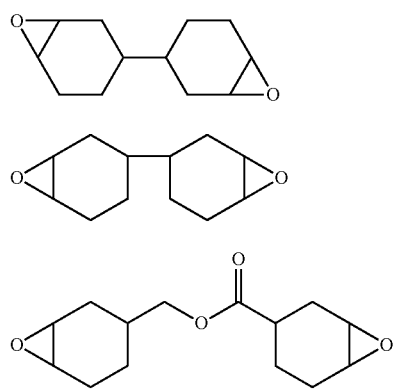

(a1-1a)

(a1-1b)

(a1-1c)

Of the alicyclic epoxy compounds represented by the formula (a1-2), specific examples of suitable compound include bicyclononadiene diepoxide represented by the following formula (a1-2a), or dicyclononadiene diepoxide.

[Formula 21]

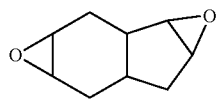

(a1-2a)

Among the alicyclic epoxy compounds represented by the formula (a1-3), specific examples of suitable compound include S spiro[3-oxatricyclo[3.2.1.0$^{2,4}$]octane-6,2'-oxirane], and the like.

Among the alicyclic epoxy compounds represented by the formula (a1-4), specific examples of suitable compound include 4-vinylcyclohexene dioxide, dipentene dioxide, limonene dioxide, 1-methyl-4-(3-methyloxiran-2-yl)-7-oxabicyclo[4.1.0]heptane, and the like.

Among the alicyclic epoxy compounds represented by the formula (a1-5), specific examples of suitable compound include 1,2,5,6-diepoxycyclooctane, and the like.

It is also possible to suitably use, as curable compound (A), a compound represented by the following formula (a1-I).

[Formula 22]

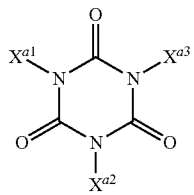

(a1-I)

In the formula (a1-I), $X^{a1}$, $X^{a2}$, and $X^{a3}$ each independently represent a hydrogen atom, or an organic group optionally having an epoxy group, and the total number of epoxy groups possessed by $X^{a1}$, $X^{a2}$, and $X^{a3}$ is 2 or more.

The compound represented by the formula (a1-I) is preferably a compound represented by the following formula (a1-II).

[Formula 23]

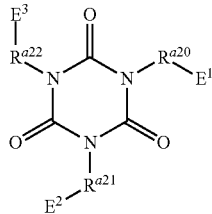

(a1-II)

In the formula (a1-II), $R^{a20}$ to $R^{a22}$ represent a linear, branched, or cyclic alkylene group, an arylene group, —O—, —C(=O)—, —NH—, and a combination thereof, and each may be the same or different. $E^1$ to $E^3$ represent at least one substituent or hydrogen atom selected from the group consisting of an epoxy group, an oxetanyl group, an ethylenically unsaturated group, an alkoxysilyl group, an isocyanate group, a blocked isocyanate group, a thiol group, a carboxy group, a hydroxyl group, and a succinic anhydride group. Provided that, at least two of $E^1$ to $E^3$ represent at least one selected from the group consisting of an epoxy group and an oxetanyl group.

In the formula (a1-II), each of at least two of a group represented by $R^{a20}$ and $E^1$, $R^{a21}$ and $E^2$, and $R^{a22}$ and $E^3$ is preferably groups represented by the following formula (a1-IIa), and all the groups are more preferably groups represented by the following formula (a1-IIa).

A group represented by plural formulas (a1-IIa) bonded to one compound is preferably the same group.

$$-L-C^a \qquad \text{(a1-IIa)}$$

In the formula (a1-IIa), L is a linear, branched, or cyclic alkylene group, an arylene group, —O—, —C(=O)—, —NH—, and a combination thereof, and $C^a$ is an epoxy group.

In the formula (a1-IIa), L and $C^a$ may be combined to form a cyclic structure.

In the formula (a1-IIa), the linear, branched, or cyclic alkylene group as L is preferably an alkylene group having 1 or more and 10 or less carbon atoms, and the arylene group as L is preferably an arylene group having 5 or more and 10 or less carbon atoms. In the formula (a1-IIa), L is preferably a linear alkylene group having 1 or more and 3 or less carbon atoms, a phenylene group, —O—, —C(=O)—, —NH—, and a combination thereof, and preferably at least one of a linear alkylene group having 1 or more and 3 or less carbon atoms such as a methylene group, and a phenylene group, or a group composed of a combination of these groups and at least one of —O—, —C(=O)— and NH—.

In the formula (a1-IIa), when L and $C^a$ are combined with each other to form a cyclic structure, for example, when a branched alkylene group and an epoxy group are combined with each other to form a cyclic structure (structure having an alicyclic structure epoxy group), an organic group represented by the following formula (a1-IIb) or (a1-IIc) is exemplified.

[Formula 24]

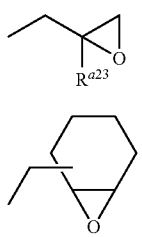

(a1-IIb)

(a1-IIc)

In the formula (a1-IIb), $R^{a23}$ is a hydrogen atom or a methyl group.

Examples of the compound represented by the formula (a1-II) include, but are not limited to, examples of an epoxy compound having an oxyranyl group or an alicyclic epoxy group.

[Formula 25]

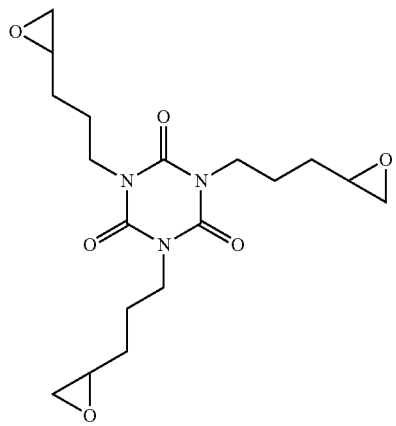

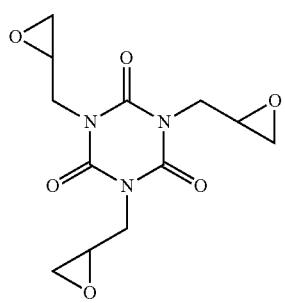

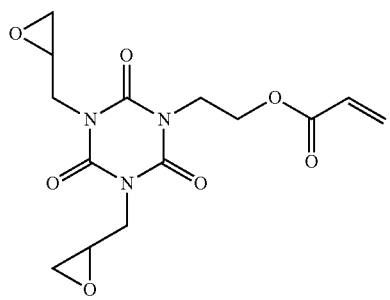

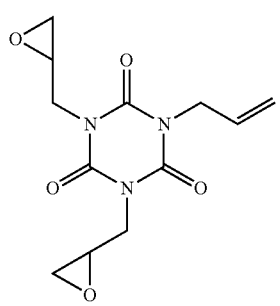 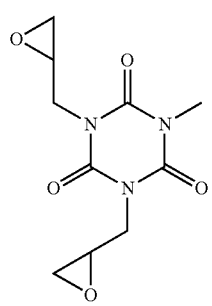

35
-continued
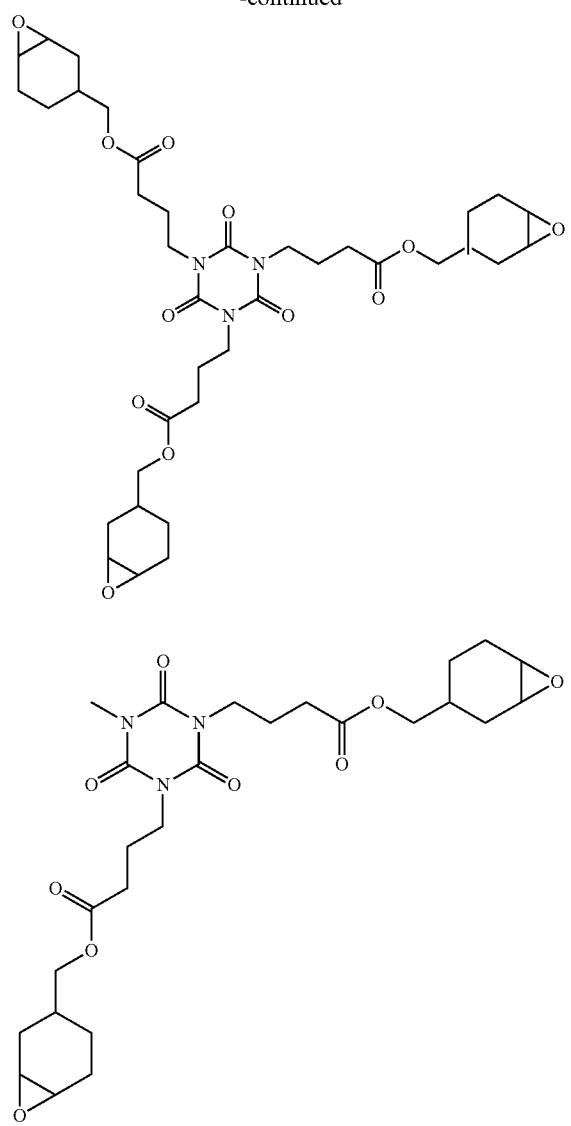
36
-continued
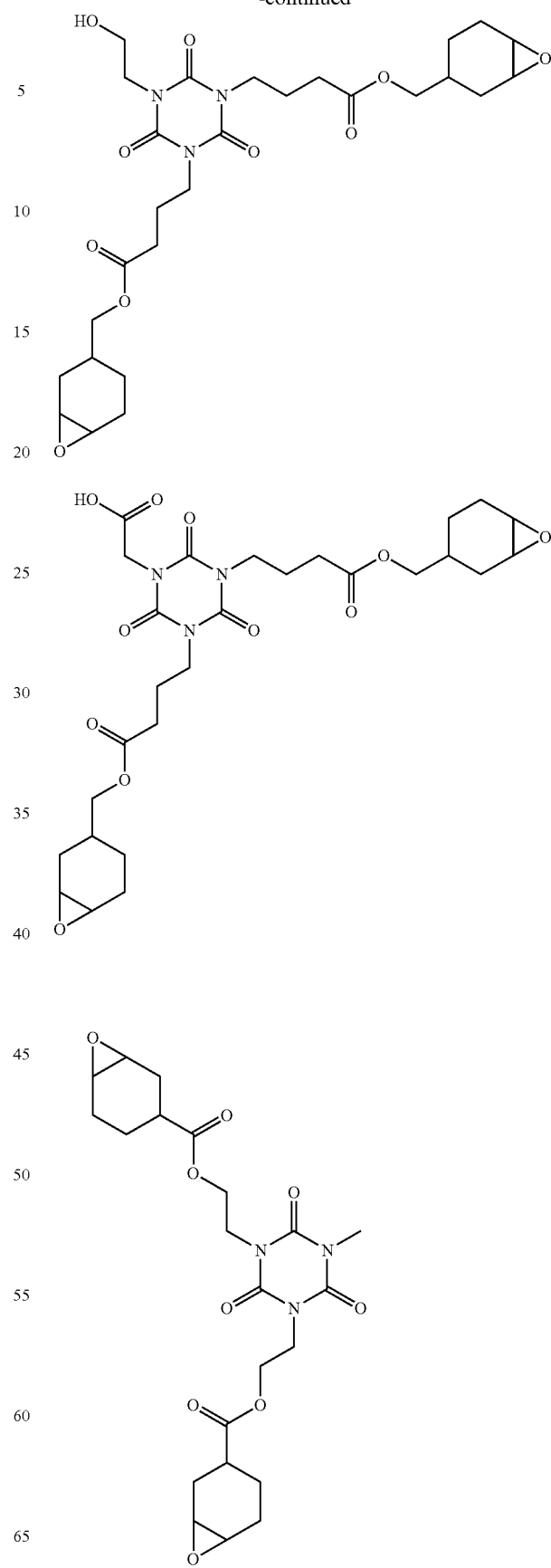

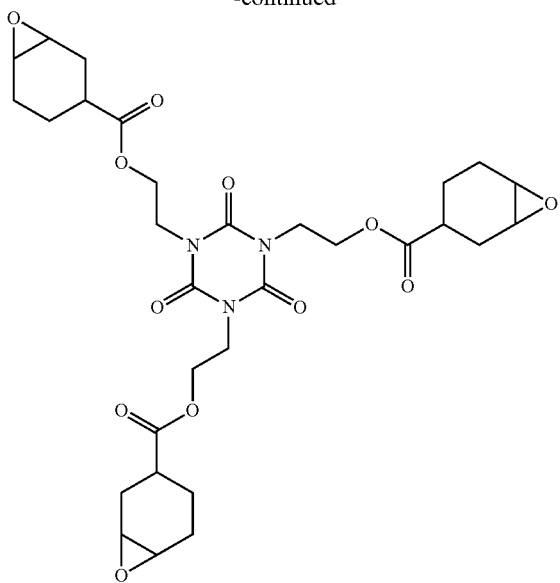

Examples of the compound usable suitably as an epoxy compound, which can be used in combination with the compound represented by the formula (a1-I), include a siloxane compound having two or more glycidyl groups in the molecule (hereinafter simply referred to as "siloxane compound").

The siloxane compound is a compound including a siloxane skeleton composed of a siloxane bond (Si—O—Si) and two or more glycidyl groups in the molecule.

Examples of the siloxane skeleton in the siloxane compound include a cyclic siloxane skeleton, and a cage or ladder type polysilsesquioxane skeleton.

The siloxane compound is preferably a compound including a cyclic siloxane skeleton represented by the following formula (a1-III) (hereinafter sometimes referred to as "cyclic siloxane").

[Formula 26]

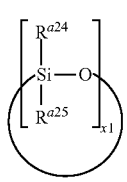

(a1-III)

In the formula (a1-III), $R^{a24}$ and $R^{a25}$ represent a monovalent group having a glycidyl group, or an alkyl group. Provided that, at least two of x1 $R^{a24}$ and x1 $R^{a25}$ in the compound represented by the formula (a1-III) are monovalent groups having a glycidyl group. x1 in the formula (a1-III) represents an integer of 3 or more. $R^{a24}$ and $R^{a25}$ in the compound represented by the formula (a1-III) may be the same or different. Plural $R^{a24}$(S) may be the same or different. Plural $R^{a25}$(S) may also be the same or different.

The monovalent group having a glycidyl group is preferably a glycidyl ether group represented by -D-O—$R^{a26}$ [D represents an alkylene group and $R^{a26}$ represents a glycidyl group]. Examples of D (alkylene group) include linear or branched alkylene groups having 1 or more and 18 or less carbon atoms such as a methylene group, a methylmethylene group, a dimethylmethylene group, a dimethylene group, and a trimethylene group.

Examples of the alkyl group include linear or branched alkyl groups having 1 or more and 18 or less carbon atoms (preferably 1 or more and 6 or less carbon atoms, and particularly preferably 1 or more and 3 or less carbon atoms) such as a methyl group, an ethyl group, a propyl group, and an isopropyl group.

x1 in the formula (a1-III) represents an integer of 3 or more, and preferably an integer of 3 or more and 6 or less in view of excellent crosslinking reactivity in the case of forming a cured film.

The number of glycidyl groups in the molecule possessed by the siloxane compound is 2 or more, preferably 2 or more and 6 or less in view of excellent crosslinking reactivity in the case of forming a cured film, and particularly preferably 2 or more and 4 or less.

The curable composition may contain, in addition to the siloxane compound represented by the formula (a1-III), compounds including a siloxane skeleton, such as an alicyclic epoxy group-containing cyclic siloxane, an alicyclic epoxy group-containing silicone resin mentioned in Japanese Unexamined Patent Application, Publication No. 2008-248169, and an organopolysilsesquioxane resin having at least two epoxy functional groups in a molecule mentioned in Japanese Unexamined Patent Application, Publication No. 2008-19422.

More specific examples of the siloxane compound include cyclic siloxane having two or more glycidyl groups in the molecule represented by the following formula. It is possible to use, as the siloxane compound, commercially available products, for example, trade name "X-40-2670", "X-40-2701", "X-40-2728", "X-40-2738", and "X-40-2740" (which are manufactured by Shin-Etsu Chemical Co., Ltd.).

[Formula 27]

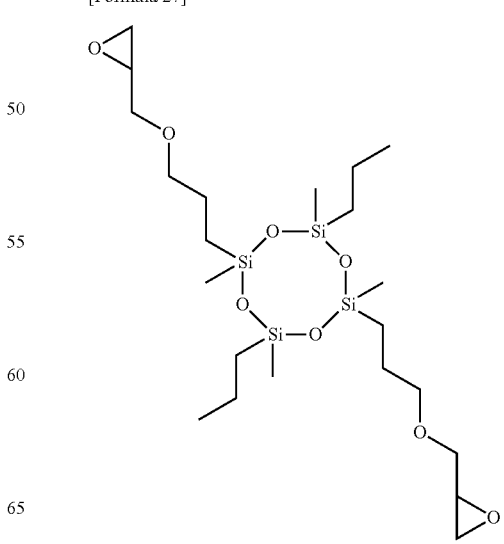

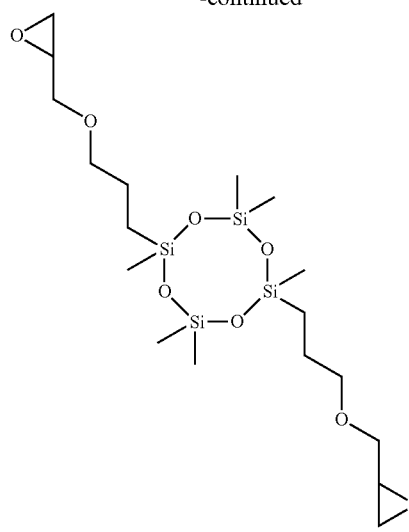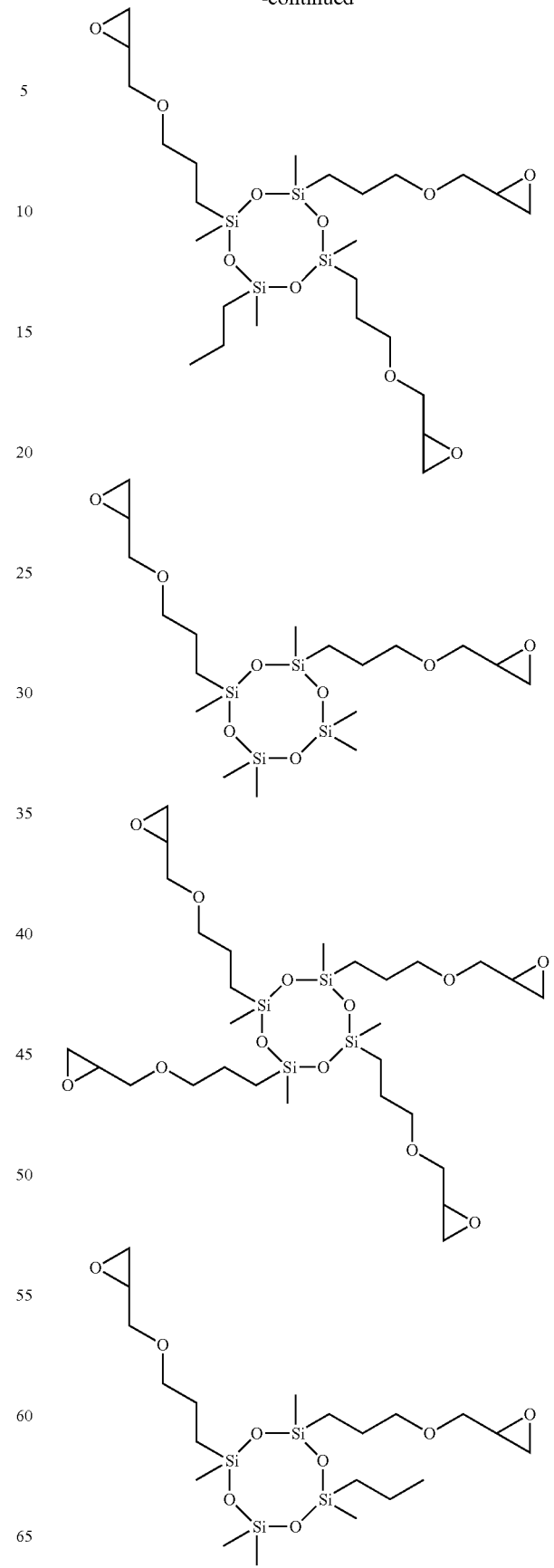

-continued

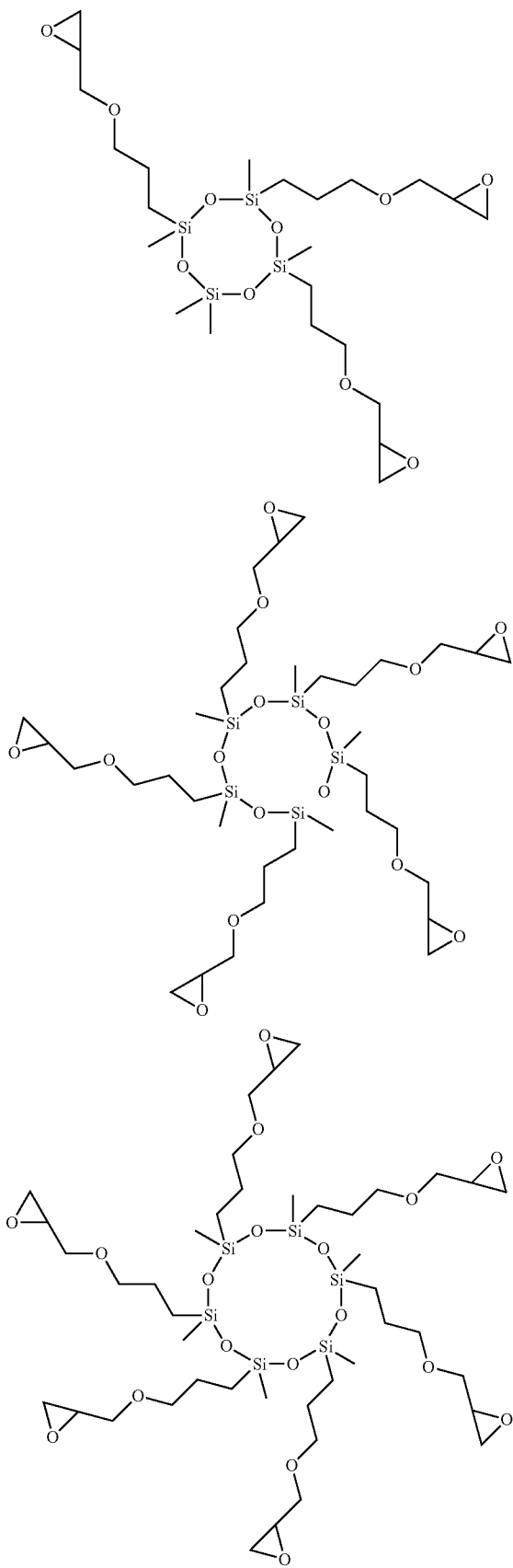

(Episulfide Compound)

There is no specific limitation on the type of the episulfide compound as long as it does not interfere with the object of the present invention. Examples of preferred episulfide compound include compounds in which the oxygen atom in the epoxy group of the epoxy compound is substituted with a sulfur atom.

There is no particular limitation on the content of the curable compound (A) in the curable composition as long as the object of the present invention is not impaired.

The content of the curable compound (A) in the curable composition is preferably 60 parts by mass or more and 99.9 parts by mass or less, more preferably 75 parts by mass or more and 99.5 parts by mass or less, and particularly preferably 90 parts by mass or more and 99 parts by mass or less, based on 100 parts by mass of the entire solid component of the curable composition.

<(B) Cationic Polymerization Initiator>

The curable composition comprises a cationic polymerization initiator (B) as a component which cures a curable compound (A). The cationic polymerization initiator (B) is a compound comprising a cation moiety and an anion moiety, the anion moiety being an anion represented by the following formula (b1):

[Formula 28]

$$R^4\text{—}\underset{\underset{R^3}{|}}{\overset{\overset{R^1}{|}}{Ga^-}}\text{—}R^2 \qquad (b1)$$

wherein, in the formula (b1), $R^1$, $R^2$, $R^3$ and $R^4$ are each independently an optionally substituted hydrocarbon group, or an optionally substituted heterocyclic group, and at least one of $R^1$, $R^2$, $R^3$ and $R^4$ is an optionally substituted aromatic hydrocarbon group.

In the cationic polymerization initiator (B), the cation moiety, a counter cation to an anion represented by the formula (b1), is not particularly limited, as long as the curable composition is satisfactorily cured. The counter cation is represented by the following formula (b2):

$$(R^5)_{t+1}\text{—}R^{6+} \qquad (b2)$$

wherein, in the formula (b2), $R^5$ is a monovalent organic group. $R^6$ is a Group 15 to 17 (IUPAC notation) element having an atomic value t. t is an integer of 1 or more and 3 or less. A plurality of $R^5$ may be the same or different, and a plurality of $R^5$ may be combined with each other to form a ring together with $R^6$.

The number of carbon atoms in a hydrocarbon group or heterocyclic group as $R^1$ to $R^4$ in the formula (b1) is not particularly limited, and is preferably 1 or more and 50 or less, more preferably 1 or more and 30 or less, and particularly preferably 1 or more and 20 or less.

Specific examples of the hydrocarbon group as $R^1$ to $R^4$ include a linear or branched alkyl group, a linear or branched alkenyl group, a linear or branched alkynyl group, an aromatic hydrocarbon group, an alicyclic hydrocarbon group, and an aralkyl group, and the like. As described above, at least one of $R^1$ to $R^4$ is an optionally substituted aromatic group, more preferably three or more of $R^1$ to $R^4$ are an optionally substituted aromatic group, and particularly preferably all of $R^1$ to $R^4$ are an optionally substituted aromatic group.

Substituents optionally bonded to a hydrocarbon group or a heterocyclic group as $R^1$ to $R^4$ include a halogenated alkyl group having 1 or more and 18 or less carbon atoms, a halogenated aliphatic cyclic group having 3 or more and 18 or less carbon atoms, a nitro group, a hydroxyl group, a cyano group, an alkoxy group having 1 or more and 18 or less carbon atoms, an aryloxy group having 6 or more and 14 or less carbon atoms, an aliphatic acyl group having 2 or more and 19 or less carbon atoms, an aromatic acyl group having 7 or more and 15 or less carbon atoms, an aliphatic acyloxy group having 2 or more and 19 or less carbon atoms, an aromatic acyloxy group having 7 or more and 15 or less carbon atoms, an alkylthio group having 1 or more and 18 or less carbon atoms, an arylthio group having 6 or more and 14 or less carbon atoms, an amino group in which one or two hydrogen atoms bonded to the nitrogen atom are optionally substituted with a hydrocarbon group(s) having 1 or more and 18 or less, and a halogen atom. When a hydrocarbon group as $R^1$ to $R^4$ is an aromatic hydrocarbon group, the aromatic hydrocarbon group is optionally substituted with one or more substituents selected from the group consisting of an alkyl group having 1 or more and 18 or less carbon atoms, an alkenyl group having 2 or more and 18 or less carbon atoms, and an alkynyl group having 2 or more and 18 or less carbon atoms.

When a hydrocarbon group as $R^1$ to $R^4$ has a substituent, the number of substituents is not particularly limited, and may be one or plural, two or more. When the number of substituents is plural, the plurality of substituents each may be the same or different.

When $R^1$ to $R^4$ are an alkyl group, suitable specific examples thereof include linear alkyl groups such as a methyl group, an ethyl group, an n-propyl group, an n-butyl group, an n-pentyl group, an n-hexyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group and an n-icosyl group; and branched alkyl groups such as an isopropyl group, an isobutyl group, a sec-butyl group, a tert-butyl group, an isopentyl group, a neopentyl group, a tert-pentyl group, an isohexyl group, a 2-ethylhexyl group and a 1,1,3,3-tetramethylbutyl group.

When $R^1$ to $R^4$ are an alkenyl group or an alkynyl group, suitable examples thereof include alkenyl groups and alkynyl groups corresponding to the suitable groups as an alkyl group.

When $R^1$ to $R^4$ are an aromatic hydrocarbon group, suitable examples thereof include a phenyl group, an α-naphthyl group, a β-naphthyl group, a biphenyl-4-yl group, a biphenyl-3-yl group, a biphenyl-2-yl group, an anthryl group, and a phenanthryl group, and the like.

When $R^1$ to $R^4$ are an alicyclic hydrocarbon group, suitable examples thereof include cycloalkyl groups such as a cyclopropyl group, a cyclobutyl group, a cyclopentyl group, a cyclohexyl group, a cyclopentyl group, a cyclooctyl group, a cyclononyl group, and a cyclodecyl group; and crosslinking aliphatic cyclic hydrocarbon groups such as a norbornyl group, an adamantyl group, a tricyclodecyl group, and a pinanyl group.

When $R^1$ to $R^4$ are an aralkyl group, suitable examples thereof include a benzyl group, a phenethyl group, an α-naphtylmethyl group, a β-naphtylmethyl group, an α-naphtylethyl group, and a β-naphtylethyl group, and the like.

When $R^1$ to $R^4$ are a heterocyclic group, suitable examples thereof include a thienyl group, a furanyl group, a selenophenyl group, a pyranyl group, a pyrrolyl group, an oxazolyl group, a thiazolyl group, a pyridyl group, a pyrimidyl group, a pyrazinyl group, an indolyl group, a benzofuranyl group, a benzothienyl group, a quinolyl group, an isoquinolyl group, a quinoxalinyl group, a quinazolinyl group, a carbazolyl group, an acridinyl group, a phenothiazinyl group, a phenazinyl group, a xanthenyl group, a thianthrenyl group, a phenoxazinyl group, a phenoxathiinyl group, a chromanyl group, an isochromanyl group, a dibenzothienyl group, a xanthonyl group, a thioxanthonyl group, and a dibenzofuranyl group, and the like.

When a substituent optionally bonded to a hydrocarbon group or heterocyclic group as $R^1$ to $R^4$ is a halogenated alkyl group, preferred examples of the halogenated alkyl group include linear halogenated alkyl groups such as a trifluoromethyl group, a trichloromethyl group, a pentafluoroethyl group, a 2,2,2-trichloroethyl group, a 2,2,2-trifluoroethyl group, a 1,1-difluoroethyl group, a heptafluoro-n-propyl group, a 1,1-difluoro-n-propyl group, a 3,3,3-trifluoro-n-propyl group, a nonafluoro-n-butyl group, a 3,3,4,4,4-pentafluoro-n-butyl group, a perfluoro-n-pentyl group, and a perfluoro-n-octyl group; and branched halogenated alkyl groups such as a hexafluoroisopropyl group, a hexachloroisopropyl group, a hexafluoroisobutyl group, and a nonafluoro-tert-butyl group.

When a substituent optionally bonded to a hydrocarbon group or heterocyclic group as $R^1$ to $R^4$ is a halogenated aliphatic cyclic group, preferred examples of the halogenated aliphatic cyclic group include a pentafluorocyclopropyl group, a nonafluorocyclobutyl group, a perfluorocyclopentyl group, a perfluorocyclohexyl group, and a perfluoroadamantyl group, and the like.

When a substituent optionally bonded to a hydrocarbon group or heterocyclic group as $R^1$ to $R^4$ is an alkoxy group, preferred examples of the alkoxy group include linear alkoxy groups such as a methoxy group, an ethoxy group, an n-propyloxy group, an n-butyloxy group, an n-pentyloxy group, an n-hexyloxy group, an n-octyloxy group, an n-nonyloxy group, an n-decyloxy group, an n-undecyloxy group, an n-dodecyloxy group, an n-tridecyloxy group, an n-tetradecyloxy group, an n-pentadecyloxy group, an n-hexadecyloxy group, an n-heptadecyloxy group, and an n-octadecyloxy group; and branched alkoxy groups such as an isopropyloxy group, an isobutyloxy group, a sec-butyloxy group, a tert-butyloxy group, an isopentyloxy group, a neopentyloxy group, a tert-pentyloxy group, an isohexyloxy group, a 2-ethylhexyloxy group, and a 1,1,3,3-tetramethylbutyloxy group.

When a substituent optionally bonded to a hydrocarbon group or heterocyclic group as $R^1$ to $R^4$ is an aryloxy group, preferred examples of the aryloxy group include a phenoxy group, an α-naphthyloxy group, a β-naphthyloxy group, a biphenyl-4-yloxy group, a biphenyl-3-yloxy group, a biphenyl-2-yloxy group, an anthryloxy group, and a phenanthryloxy group, and the like.

When a substituent optionally bonded to a hydrocarbon group or heterocyclic group as $R^1$ to $R^4$ is an aliphatic acyl group, preferred examples of the aliphatic acyl group include an acetyl group, a propanoyl group, a butanoyl group, a pentanoyl group, a hexanoyl group, a heptanoyl group, and an octanoyl group, and the like.

When a substituent optionally bonded to a hydrocarbon group or heterocyclic group as $R^1$ to $R^4$ is an aliphatic acyl group, preferred examples of the aliphatic acyl group include an acetyl group, a propanoyl group, a butanoyl group, a pentanoyl group, a hexanoyl group, a heptanoyl group, and an octanoyl group, and the like.

When a substituent optionally bonded to a hydrocarbon group or heterocyclic group as $R^1$ to $R^4$ is an aromatic acyl group, preferred examples of the aromatic acyl group include a benzoyl group, an α-naphthoyl group, a β-naphthoyl group, a biphenyl-4-ylcarbonyl group, a biphenyl-3-ylcarbonyl group, a biphenyl-2-ylcarbonyl group, an anthrylcarbonyl group, and a phenanthrylcarbonyl group, and the like.

When a substituent optionally bonded to a hydrocarbon group or heterocyclic group as $R^1$ to $R^4$ is an aliphatic acyloxy group, preferred examples of the aliphatic acyloxy group include an acetyloxy group, a propanoyloxy group, a butanoyloxy group, a pentanoyloxy group, a hexanoyloxy group, a heptanoyloxy group, and an octanoyloxy group, and the like.

When a substituent optionally bonded to a hydrocarbon group or heterocyclic group as $R^1$ to $R^4$ is an aromatic acyloxy group, preferred examples of the aromatic acyloxy group include a benzoyloxy group, an α-naphthoyloxy group, a β-naphthoyloxy group, a biphenyl-4-ylcarbonyloxy group, a biphenyl-3-ylcarbonyloxy group, a biphenyl-2-ylcarbonyloxy group, an anthrylcarbonyloxy group, and a phenanthrylcarbonyloxy group, and the like.

When a substituent optionally bonded to a hydrocarbon group or heterocyclic group as $R^1$ to $R^4$ is an alkylthio group or an arylthio group, preferred examples of the alkylthio group or arylthio group include groups in which the oxygen atom in suitable groups as the above-described alkoxy group or aryloxy group is substituted with sulfur atom.

When a substituent optionally bonded to a hydrocarbon group or heterocyclic group as $R^1$ to $R^4$ is an amino group optionally substituted with a hydrocarbon group, suitable examples of the amino group optionally substituted with a hydrocarbon group include an amino group, a methylamino group, an ethylamino group, an n-propylamino group, a dimethylamino group, a diethylamino group, a methylethylamino group, a di-n-propylamino group, and a piperidino group, and the like.

When a substituent optionally bonded to a hydrocarbon group or a heterocyclic group as $R^1$ to $R^4$ is a halogen atom, suitable examples of the halogen atom include a fluorine atom, a chlorine atom, a bromine atom, and an iodine atom, and the like.

Among the substituents optionally bonded to a hydrocarbon group or a heterocyclic group as $R^1$ to $R^4$ described above, in view of a high activity as an initiator of the cationic polymerization initiator (B), a halogenated alkyl group having 1 or more and 8 or less carbon atoms, a halogen atom, a nitro group, and a cyano group are preferable, and a fluorinated alkyl group having 1 or more and 8 or less carbon atoms is more preferable.

$R^5$ in the formula (b2) represents an organic group bonded to $R^6$.

$R^5$ may be the same or different.

Examples of $R^5$ include an aromatic hydrocarbon group having 6 or more and 14 or less carbon atoms, an alkyl group having 1 or more and 18 or less carbon atoms, an alkenyl group having 2 or more and 18 or less carbon atoms, and an alkynyl group having 2 or more and 18 or less carbon atoms. The aromatic hydrocarbon group may be further substituted with an alkyl group having 1 or more and 18 or less carbon atoms, an alkenyl group having 2 or more and 18 or less carbon atoms, an alkynyl group having 2 or more and 18 or less carbon atoms, an aryl group having 6 or more and 14 or less carbon atoms, a nitro group, a hydroxyl group, a cyano group, an alkoxy group having 1 or more and 18 or less carbon atoms, an aryloxy group having 6 or more and 14 or less carbon atoms, an aliphatic acyl group having 2 or more and 19 or less carbon atoms, an aromatic acyl group having 7 or more and 15 or less carbon atoms, an aliphatic acyloxy group having 2 or more and 19 or less carbon atoms, an aromatic acyloxy group having 7 or more and 15 or less carbon atoms, an alkylthio group having 1 or more and 18 or less carbon atoms, an arylthio group having 6 or more and 14 or less carbon atoms, an amino group in which one or two hydrogen atoms bonded to the nitrogen atom are optionally substituted with a hydrocarbon group having 1 or more and 18 or less carbon atoms, and a halogen atom. Suitable examples of these substituents are the same as the suitable examples of substituents optionally bonded to a hydrocarbon group or a heterocyclic group as $R^1$ to $R^4$ in the formula (b1).

When a plurality of $R^5$ exists in the formula (b2), the plurality of $R^5$ may form a ring together with $R^6$. A ring formed from a plurality of $R^5$ and $R^6$ may comprise a bond selected from the group consisting of —O—, —S—, —SO—, —SO$_2$—, —NH—, —CO—, —COO— and —CONH— in the ring structure.

The cation moiety in the cationic polymerization initiator (B) is preferably a cation represented by the above-described formula (b2).

$R^6$ in the formula (b2) is a Group 15 to 17 (IUPAC notation) element having an atomic value t. t is an integer of 1 or more and 3 or less. $R^6$ is combined with an organic group $R^5$ to form an onium ion $[R^{6+}]$. The Group 15 to 17 element is preferably O (oxygen), N (nitrogen), P (phosphorus), S (sulfur) or I (iodine). Corresponding onium ions are an oxonium ion, an ammonium ion, a phosphonium ion, a sulfonium ion, and an iodonium ion. Among these, an ammonium ion, a phosphonium ion, a sulfonium ion and an iodonium ion are preferable due to stability and handleability, and a sulfonium ion and an iodonium ion are more preferable in view of excellent cationic polymerization properties and cross-linking reaction properties.

Specific examples of the oxonium ion include oxoniums such as trimethyloxonium, diethylmethyloxonium, triethyloxonium, and tetramethylene methyloxonium; pyryliniums such as 4-methylpyrylinium, 2,4,6-trimethylpyrylinium, 2,6-di-tert-butylpyrylinium, and 2,6-diphenylpyrylinium; chromeniums such as 2,4-dimethylchromenium, and 1,3-dimethylisochromenium, and isochromenium.

Specific examples of the ammonium ion include tetraalkylammoniums such as tetramethylammonium, ethyltrimethylammonium, diethyldimethylammonium, triethylmethylammonium and tetraethylammonium; pyrrolidiniums such as N,N-dimethylpyrrolidinium, N-ethyl-N-methylpyrrolidinium and N,N-diethylpyrrolidinium; imidazoliniums such as N,N'-dimethylimidazolinium, N,N'-diethylimidazolinium, N-ethyl-N'-methylimidazolinium, 1,3,4-trimethylimidazolinium and 1,2,3,4-tetramethylimidazolinium; tetrahydropyrimidiniums such as N,N'-dimethyltetrahydropyrimidinium; morpholiniums such as N,N'-dimethylmorpholinium; piperidiniums such as N,N'-diethylpiperidinium; pyridiniums such as N-methylpyridinium, N-benzylpyridinium and N-phenacylpyridinium; imidazoliums such as N,N'-dimethylimidazolium; quinoliums such as N-methylquinolium, N-benzylquinolium and N-phenacylquinolium; isoquinoliums such as N-methylisoquinolium; thiazoniums such as benzylbenzothiazonium and phenacylbenzothiazonium; and acridiums such as benzylacridium and phenacylacridium.

Specific examples of the phosphonium ion include tetraarylphosphoniums such as tetraphenylphosphonium, tetra-p-tolylphosphonium, tetrakis(2-methoxyphenyl)phosphonium, tetrakis(3-methoxyphenyl)phosphonium, and tetrakis (4-methoxyphenyl)phosphonium; triarylphosphoniums such as triphenylbenzylphosphonium, triphenylphenacylphosphonium, triphenylmethylphosphonium and triphenylbutylphosphonium; tetraalkylphosphoniums such as triethylbenzylphosphonium, tributylbenzylphosphonium, tetraethylphosphonium, tetrabutylphosphonium, tetrahexylphosphonium, triethylphenacylphosphonium, and tributylphenacylphosphonium, and the like.

Specific examples of the sulfonium ion include triarylsulfoniums such as triphenylsulfonium, tri-p-tolylsulfonium, tri-o-tolylsulfonium, tris(4-methoxyphenyl)sulfonium, 1-naphthyldiphenylsulfonium, 2-naphthyldiphenylsulfonium, tris(4-fluorophenyl)sulfonium, tri-1-naphthylsulfonium, tri-2-naphthylsulfonium, tris(4-hydroxyphenyl)sulfonium, 4-(phenylthio)phenyldiphenylsulfonium, 4-(p-tolylthio)phenyldi-p-tolylsulfonium, 4-(4-methoxyphenylthio)phenylbis(4-methoxyphenyl)sulfonium, 4-(phenylthio)phenylbis(4-fluorophenyl)sulfonium, 4-(phenylthio)phenylbis(4-methoxyphenyl)sulfonium, 4-(phenylthio)phenyldi-p-tolylsulfonium, [4-(4-biphenylylthio)phenyl]-4-biphenylylphenylsulfonium, [4-(2-thioxanthonylthio)phenyl]diphenylsulfonium, bis[4-(diphenylsulfonio)phenyl]sulfide, bis[4-{bis[4-(2-hydroxyethoxy)phenyl]sulfonio}phenyl]sulfide, bis{4-[bis(4-fluorophenyl)sulfonio]phenyl}sulfide, bis{4-[bis(4-methylphenyl)sulfonio]phenyl}sulfide, bis{4-[bis(4-methoxyphenyl)sulfonio]phenyl}sulfide, 4-(4-benzoyl-2-chlorophenylthio)phenylbis(4-fluorophenyl)sulfonium, 4-(4-benzoyl-2-chlorophenylthio)phenyldiphenylsulfonium, 4-(4-benzoylphenylthio)phenylbis(4-fluorophenyl)sulfonium, 4-(4-benzoylphenylthio)phenyldiphenylsulfonium, 7-isopropyl-9-oxo-10-thia-9,10-dihydroanthracen-2-yldi-p-tolylsulfonium, 7-isopropyl-9-oxo-10-thia-9,10-dihydroanthracen-2-yldiphenylsulfonium, 2-[(di-p-tolyl)sulfonio]thioxanthone, 2-[(diphenyl)sulfonio]thioxanthone, 4-(9-oxo-9H-thioxanthen-2-yl)thiophenyl-9-oxo-9H-thioxanthen-2-ylphenylsulfonium, 4-[4-(4-tert-butylbenzoyl)phenylthio]phenyldi-p-tolylsulfonium, 4-[4-(4-tert-butylbenzoyl)phenylthio]phenyldiphenylsulfonium, 4-[4-(benzoylphenylthio)]phenyldi-p-tolylsulfonium, 4-[4-(benzoylphenylthio)]phenyldiphenylsulfonium, 5-(4-methoxyphenyl)thianthrenium, 5-phenylthianthrenium, 5-tolylthianthrenium, 5-(4-ethoxyphenyl)thianthrenium, and 5-(2,4,6-trimethylphenyl)thianthrenium; diarylsulfoniums such as diphenylphenacylsulfonium, diphenyl4-nitrophenacylsulfonium, diphenylbenzylsulfonium, and diphenylmethylsulfonium; monoarylsulfoniums such as phenylmethylbenzylsulfonium, 4-hydroxyphenylmethylbenzylsulfonium, 4-methoxyphenylmethylbenzylsulfonium, 4-acetocarbonyloxyphenylmethylbenzylsulfonium, 4-hydroxyphenyl(2-naphtylmethyl)methylsulfonium, 2-naphtylmethylbenzylsulfonium, 2-naphtylmethyl(1-ethoxycarbonyl)ethylsulfonium, phenylmethylphenacylsulfonium, 4-hydroxyphenylmethylphenacylsulfonium, 4-methoxyphenylmethylphenacylsulfonium, 4-acetocarbonyloxyphenylmethylphenacylsulfonium, 2-naphtylmethylphenacylsulfonium, 2-naphtyloctadecylphenacylsulfonium, and 9-anthracenylmethylphenacylsulfonium; trialkylsulfoniums such as dimethylphenacylsulfonium, phenacyltetrahydrothiophenium, dimethylbenzylsulfonium, benzyltetrahydrothiophenium, and octadecylmethylphenacylsulfonium, and the like.

It is also preferred that the cationic polymerization initiator (B) comprise a sulfonium salt comprising the anion moiety, an anion represented by the formula (b1), and the cation moiety, a sulfonium ion represented by the formula (c1) described below.

Specific examples of the iodonium ion include iodonium ions such as diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, and 4-isobutylphenyl(p-tolyl)iodonium.

Suitable specific examples of the anion represented by the formula (b1) described above include tetrakis(4-nonafluorobiphenyl)gallate anion, tetrakis(1-heptafluoronaphthyl)gallate anion, tetrakis(pentafluorophenyl)gallate anion, tetrakis(3,4,5-trifluorophenyl)gallate anion, tetrakis(2-nonaphenylbiphenyl)gallate anion, tetrakis(2-heptafluoronaphthyl)gallate anion, tetrakis(7-nonafluoroanthryl)gallate anion, tetrakis(4'-(methoxy)octafluorobiphenyl)gallate anion, tetrakis(2,4,6-tris(trifluoromethyl)phenyl)gallate anion, tetrakis(3,5-bis(trifluoromethyl)phenyl)gallate anion, tetrakis(2,3-bis(pentafluoroethyl)naphthyl)gallate anion, tetrakis (2-isopropoxy-hexafluoronaphthyl)gallate anion, tetrakis(9,10-bis(heptafluoropropyl)heptafluoroanthryl)gallate anion, tetrakis(9-nonafluorophenanthryl)gallate anion, tetrakis(4-[tri(isopropyl)silyl]-tetrafluorophenyl)gallate anion, tetrakis (9,10-bis(p-tolyl)-heptafluorophenanthryl)gallate anion, tetrakis(4-[dimethyl(t-butyl)silyl]-tetrafluorophenyl)gallate anion, monophenyltris(pentafluorophenyl)gallate anion, and monoperfluorobutyltris(pentafluorophenyl)gallate anion, and the like, and more preferably the following anions.

[Formula 29]

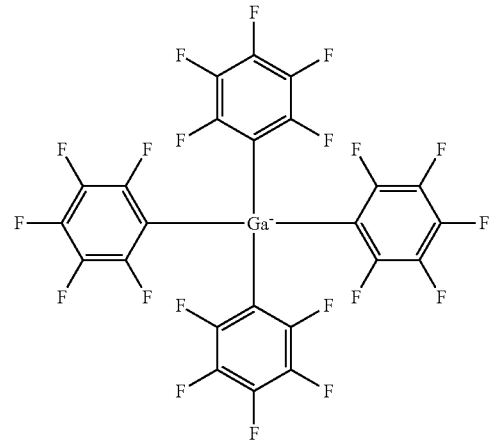

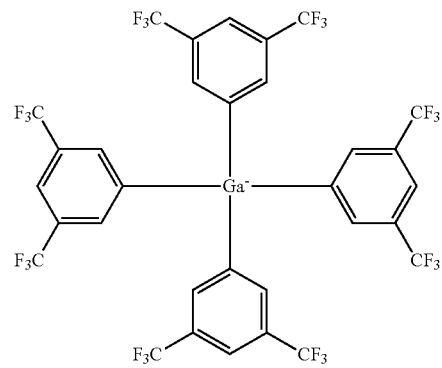

-continued

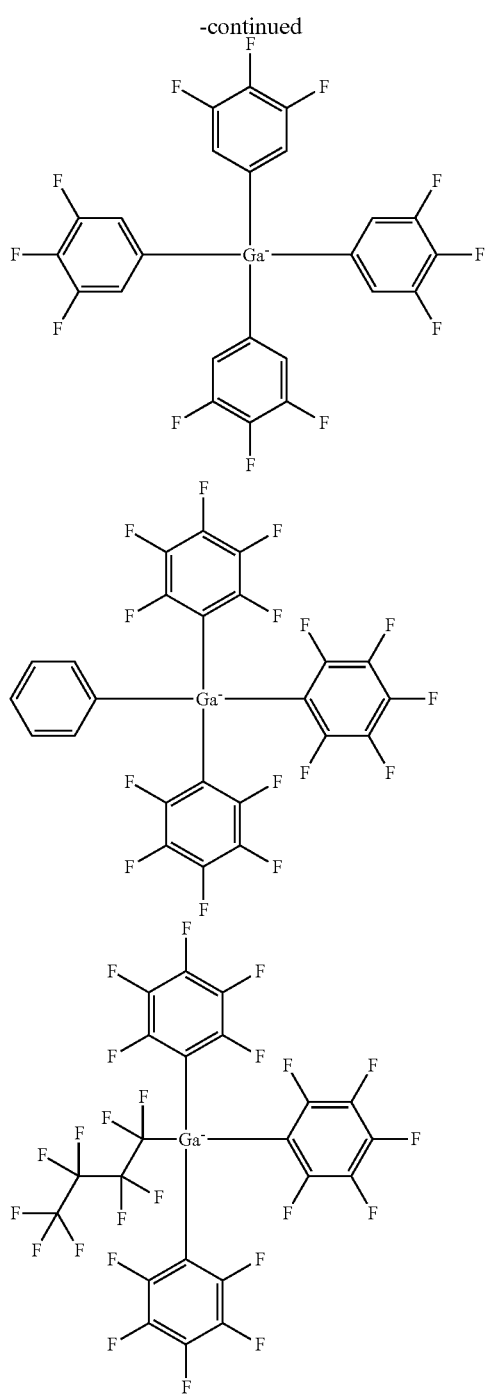

Suitable specific examples of the counter cation represented by the formula (b2) described above include iodonium ions such as 4-isopropylphenyl(p-tolyl)iodonium, and 4-isobutylphenyl(p-tolyl)iodonium; thioxanthone skeleton-containing sulfonium ions such as [4-(2-thioxanthonylthio)phenyl]diphenylsulfonium, 2-[(di-p-tolyl)sulfonio]thioxanthone, 2-[(diphenyl)sulfonio]thioxanthone, 4-(9-oxo-9H-thioxanthen-2-yl)thiophenyl-9-oxo-9H-thioxanthen-2-ylphenylsulfonium;
sulfonium ions given as specific examples of a cation represented by the formula (c1) described below;
sulfonium ions given as specific examples of the cation moiety of a sulfonium salt represented by the formula (c1') described below; and
moreover sulfonium ions given below.

[Formula 30]

51
-continued
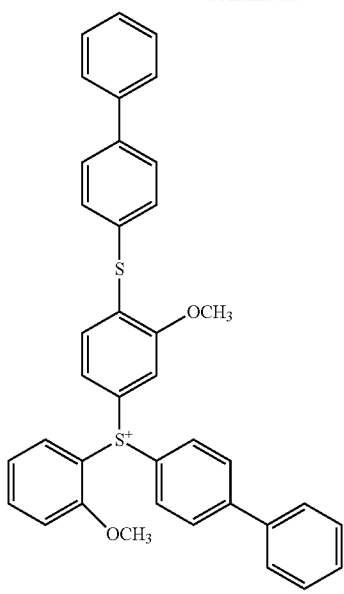
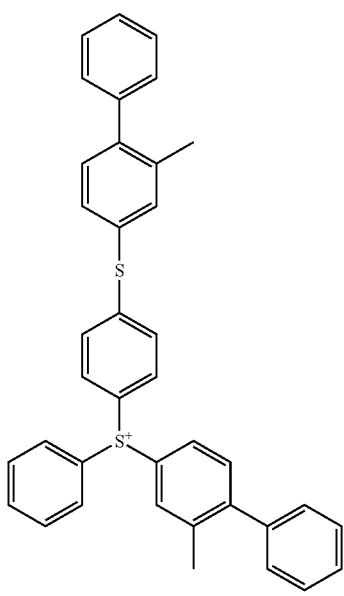
52
-continued
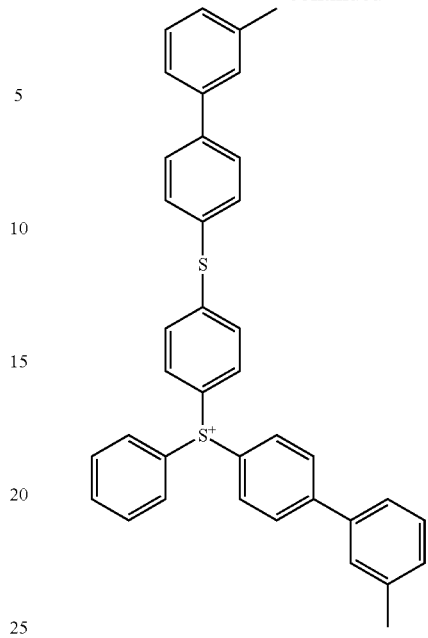
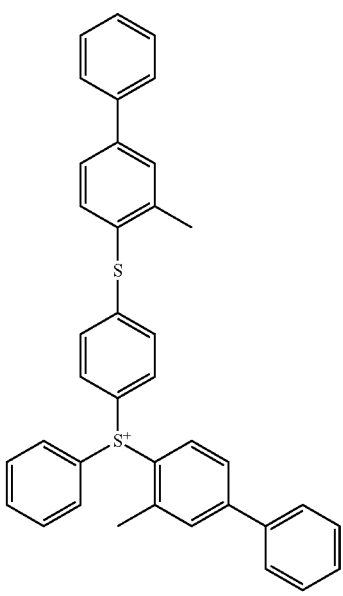

-continued
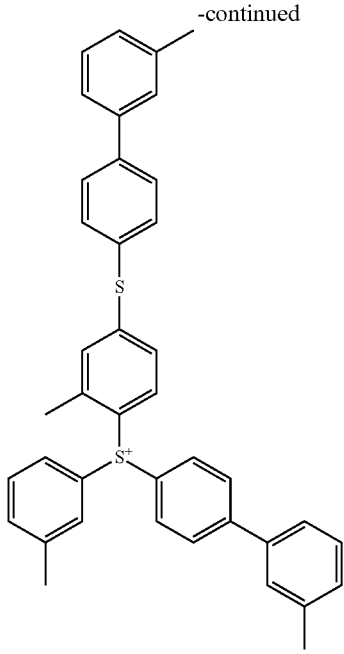
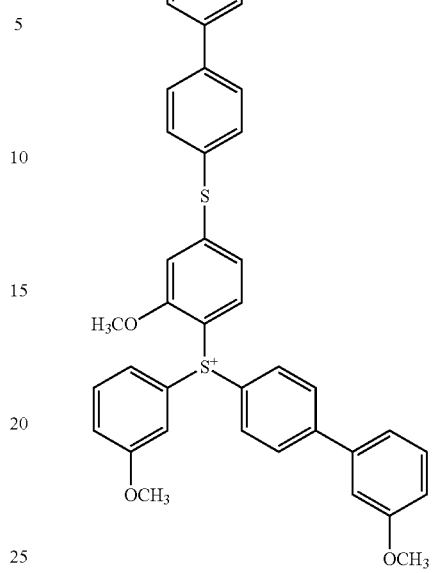
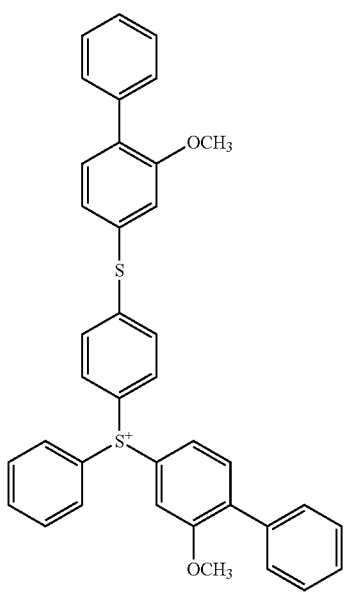
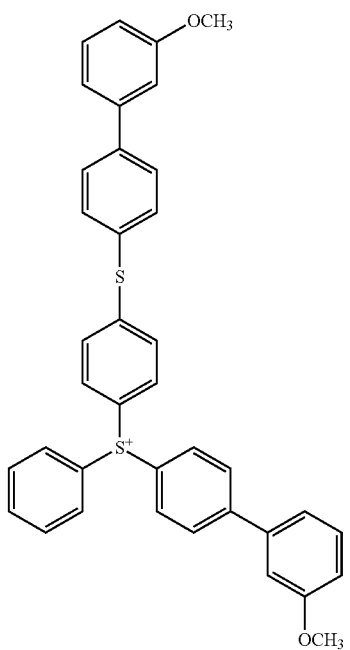

55
-continued
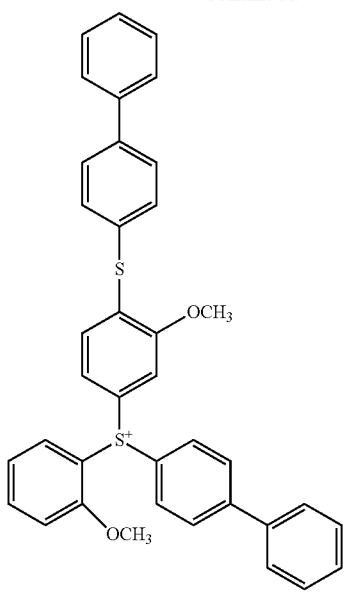
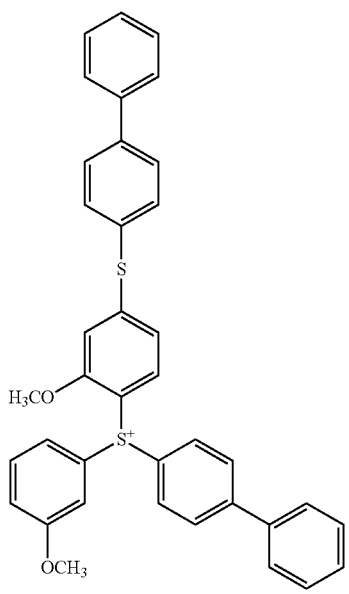
56
-continued
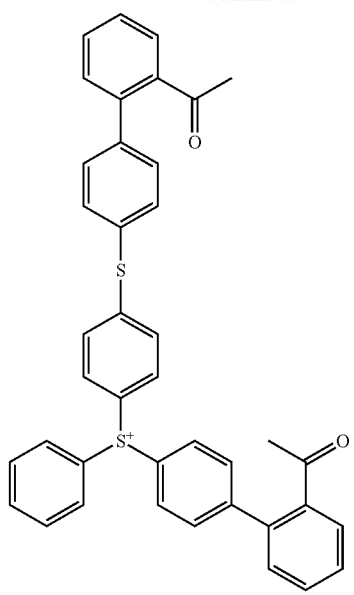
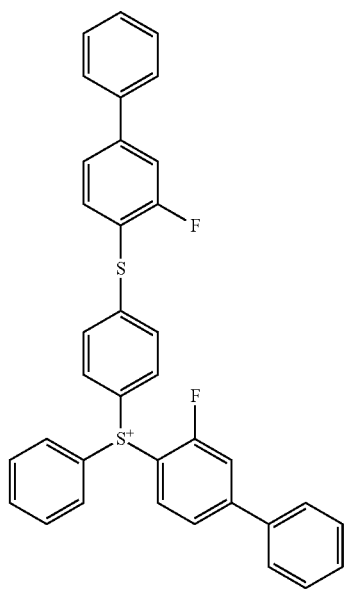

-continued

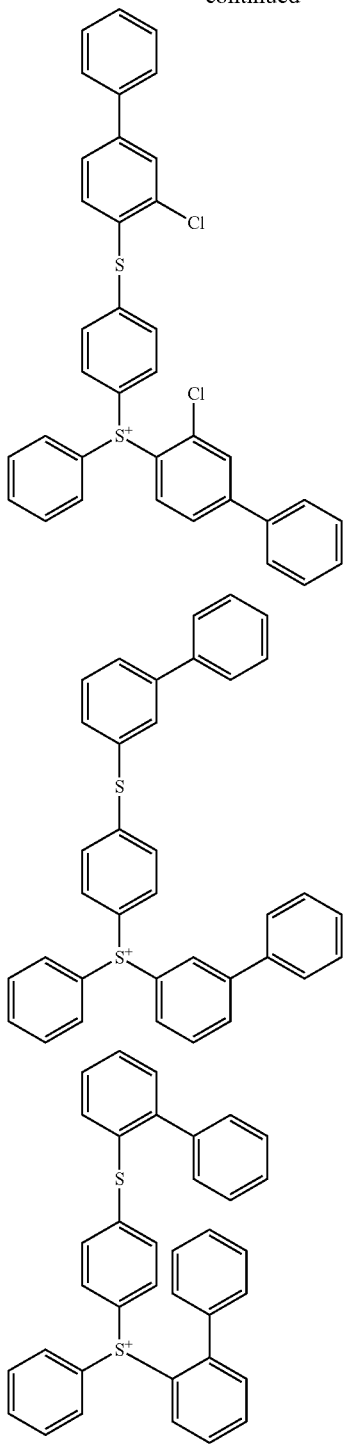

The cationic polymerization initiator (B) is preferably a salt comprising the anion given as suitable specific examples of the anion represented by the formula (b1) and the cation given as suitable specific examples of the counter cation represented by the formula (b2). Two or more suitable specific examples of the counter cation represented by the formula (b2) may be combined.

The content of the cationic polymerization initiator (B) in the curable composition is not particularly limited without defeating the object of the present invention. The content of the cationic polymerization initiator (B) in the curable composition is, as the total amount of the cationic polymerization initiator (B) and another cationic polymerization initiator (C) described below, preferably 0.01 parts by mass or more and 5 parts by mass or less, more preferably 0.05 parts by mass or more and 3 parts by mass or less, particularly preferably 0.1 parts by mass or more and 2 parts by mass or less with respect to 100 parts by mass of the curable compound (A). In addition, the content of the cationic polymerization initiator (B) is preferably 10% by mass or more, more preferably 50% by mass or more, still more preferably 70% by mass or more, particularly preferably 90% by mass or more, most preferably 100% by mass with respect to the total amount of the cationic polymerization initiator (B) and another cationic polymerization initiators (C) described below. A curable composition which is capable of forming a cured product having satisfactory heat resistance (pyrolysis resistance) and adhesion to a base material and has satisfactory curability is easily obtained using the cationic polymerization initiator (B) in such range of amount.

<(C) Another Cationic Polymerization Initiator>

The curable composition preferably comprises another cationic polymerization initiator (C) together with the cationic polymerization initiator (B). The curable composition easily forms a cured product having more satisfactory heat resistance (pyrolysis resistance) and adhesion to a base material by adding another cationic polymerization initiator (C) together with the cationic polymerization initiator (B).

Another cationic polymerization initiator (C) can be a thermal cationic polymerization initiator ($C_1$) or a photocationic polymerization initiator (C2), and is preferably a photocationic polymerization initiator (C2).

The thermal cationic polymerization initiator (C1) and photocationic polymerization initiator (C2) will now be described.

((C1) Thermal Cationic Polymerization Initiator)

Examples of the thermal cationic polymerization initiator (C1) include diphenyliodonium hexafluoroarsenate, diphenyliodonium hexafluorophosphate, diphenyliodonium trifluoromethanesulfonate, triphenylsulfonium tetrafluoroborate, tri-p-tolylsulfonium hexafluorophosphate, tri-p-tolylsulfonium trifluoromethanesulfonate, bis(cyclohexylsulfonyl)diazomethane, bis(tert-butylsulfonyl) diazomethane, bis(p-toluenesulfonyl)diazomethane, triphenylsulfonium trifluoromethanesulfonate, diphenyl-4-methylphenylsulfonium trifluoromethanesulfonate, diphenyl-2,4,6-trimethylphenylsulfonium-p-toluenesulfonate, and diphenyl-p-phenylthiophenylsulfonium hexafluorophosphate, and the like. Two or more of these may be used in combination.

Examples of commercially available thermal cationic polymerization initiators include diazonium salt type initiators such as AMERICURE Series (manufactured by American Can Co.) and ULTRASET Series (manufactured by ADEKA CORPORATION), WPAG Series (manufactured by Wako Pure Chemical Industries, Ltd.); iodonium salt type initiators such as UVE Series (manufactured by General Electric Company), FC Series (manufactured by 3M Company), UV9310C (manufactured by GE Toshiba Silicones Co., Ltd.), and WPI Series (manufactured by Wako Pure Chemical Industries, Ltd.); and sulfonium salt type initiators such as CYRACURE Series (manufactured by Union Carbide Corporation), UVI Series (manufactured by General Electric Company), FC Series (manufactured by 3M Company), CD Series (manufactured by Sartomer Co.), Optomer SP Series (manufactured by ADEKA CORPORATION), Optomer CP Series (manufactured by ADEKA CORPORATION), SAN-AID SI Series (manufactured by Sanshin Chemical Industry Co., Ltd.), CI Series (manufactured by Nippon Soda Co., Ltd.), WPAG Series (manufactured by Wako Pure Chemical Industries, Ltd.), and CPI Series (manufactured by San-Apro Ltd.) and the like.

The thermal cationic polymerization initiator (C1) preferably comprises a compound comprising a cation moiety and an anion moiety, the cation moiety being a cation represented by the following formula (c-I).
Using such thermal cationic polymerization initiator (C1), the above-described curable compound (A) cures satisfactorily, and easily forms a cured product having satisfactory heat resistance (pyrolysis resistance) and adhesion to a base material:

[Formula 31]

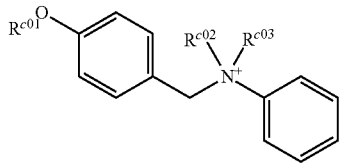

(c-I)

wherein, in the formula (c-I), $R^{c01}$, $R^{c02}$, and $R^{c03}$ are each independently an alkyl group having 1 or more and 6 or less carbon atoms.

Suitable examples of the alkyl group as $R^{c01}$, $R^{c02}$, and $R^{c03}$ in the formula (c-I) include a methyl group, an ethyl group, an n-propyl group, an isopropyl group, an n-butyl group, an isobutyl group, a sec-butyl group, a tert-butyl group, an n-pentyl group, and an n-hexyl group. The alkyl group is preferably a methyl group, or an ethyl group, more preferably a methyl group. It is particularly preferred that all of $R^{c01}$, $R^{c02}$, and $R^{c03}$ be a methyl group.

That is, the cation represented by the formula (c-I) is preferably a cation represented by the following formula (c-II)

[Formula 32]

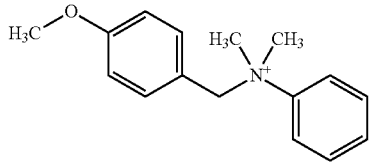

(c-II)

Examples of counter anions to a cation represented by the formula (c-I) include $AsF_6^-$, $SbF_6^-$, $PF_6^-$, and $((C_6F_5)_4B)^-$ and the like. Among these, $((C_6F_5)_4B)^-$ is preferable. "$C_6F_5$" represents a pentafluorophenyl group.

As the compound comprising the cation moiety represented by the formula (c-I) and the anion moiety, a compound obtainable as a commercially available product can be used. Examples of the commercially available product include CXC-1821 (King Industries, Inc.) and the like.

Suitable specific examples of the compound comprising the cation moiety comprising a cation represented by the formula (c-I) and the anion moiety include a quaternary ammonium salt comprising a cation represented by the formula (c-II) and $AsF_6^-$, a quaternary ammonium salt comprising a cation represented by the formula (c-II) and $SbF_6^-$, a quaternary ammonium salt comprising a cation represented by the formula (c-II) and $PF_6^-$, and a quaternary ammonium salt comprising a cation represented by the formula (c-II) and $((C_6F_5)_4B)^-$. Among these, a quaternary ammonium salt comprising a cation represented by the formula (c-II) and $((C_6F_5)_4B)^-$ is more preferable.

The compounds comprising the cation moiety comprising a cation represented by the formula (c-I) and the anion moiety can be used individually or two or more of the compounds may be used in combination.

((C2) Photocationic Polymerization Initiator)

It is possible to use, as the photocationic polymerization initiator (C2), a polymerization initiator other than the cationic polymerization initiator (B) used for photocuring a cationic polymerizable curable composition without particular limitation. Suitable examples of the photocationic polymerization initiator (C2) include an iodonium salt and a sulfonium salt.

Specific examples of the iodonium salt include diphenyliodonium tetrakis(pentafluorophenyl)borate, diphenyliodonium hexafluorophosphate, diphenyliodonium hexafluoroantimonate, di(4-nonylphenyl)iodonium hexafluorophosphate, and the like.

The photocationic polymerization initiator (C2) is preferably a sulfonium salt. Among these sulfonium salts, a sulfonium salt comprising the cation moiety comprising a cation represented by the following formula (c1) and the anion moiety (hereinafter also referred to as "sulfonium salt (Q)". When the cationic polymerization initiator (B) is a sulfonium salt having the cation moiety comprising a cation represented by the following formula (c1), the sulfonium salt is classified into the cationic polymerization initiator (B)) is preferable.

When the curable composition comprises a sulfonium salt (Q), curing of the curable composition is easily allowed to particularly satisfactorily proceed.

[Formula 33]

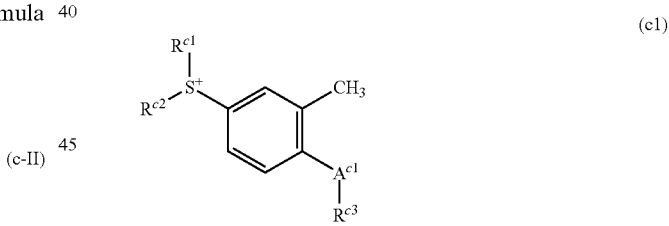

(c1)

In the formula (c1), $R^{c1}$ and $R^{c2}$ independently represent an alkyl group optionally substituted with a halogen atom, or a group represented by the following formula (c2), $R^{c1}$ and $R^{c2}$ may be combined with each other to form a ring together with the sulfur atom in the formula, $R^{c3}$ represents a group represented by the following formula (c3) or a group represented by the following formula (c4), $A^{c1}$ represents S, O, or Se, provided that $R^{c1}$ and $R^{c2}$ are not simultaneously an alkyl group optionally substituted with a halogen atom.

[Formula 34]

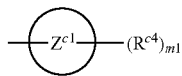

(c2)

In the formula (c2), a ring $Z^{c1}$ represents an aromatic hydrocarbon ring, $R^{c4}$ represents an alkyl group optionally substituted with a halogen atom, a hydroxy group, an alkoxy group, an alkylcarbonyl group, an alkoxycarbonyl group, an acyloxy group, an alkylthio group, a thienyl group, a thienylcarbonyl group, a furanyl group, a furanylcarbonyl group, a selenophenyl group, a selenophenylcarbonyl group, a aliphatic heterocyclic group, an alkylsulfinyl group, an alkylsulfonyl group, a hydroxy(poly)alkyleneoxy group, an optionally substituted amino group, a cyano group, a nitro group, or a halogen atom, and m1 represents an integer of 0 or more.

[Formula 35]

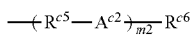
(c3)

In the formula (c3), $R^{c5}$ represents a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, an alkylene group optionally substituted with a cyano group, a nitro group or a halogen atom, or a group represented by the following formula (c5), $R^{c6}$ represents a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, an alkyl group optionally substituted with a cyano group, a nitro group or a halogen atom, or a group represented by the following formula (c6), $A^{c2}$ represents a single bond, S, O, a sulfinyl group, or a carbonyl group, and m2 represents 0 or 1.

[Formula 36]

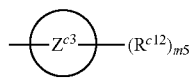
(c4)

In the formula (c4), $R^{c7}$ and $R^{c8}$ independently represent a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, an alkylene group optionally substituted with a cyano group, a nitro group or a halogen atom, or a group represented by the following formula (c5), $R^{c9}$ and $R^{c10}$ independently represent an alkyl group optionally substituted with a halogen atom, or a group represented by the formula (c2), $R^{c9}$ and $R^{c10}$ may be combined with each other to form a ring together with the sulfur atom in the formula, $A^{c3}$ represents a single bond, S, O, a sulfinyl group, or a carbonyl group, and m3 represents 0 or 1, provided that $R^{c9}$ and $R^{c10}$ are not simultaneously an alkyl group optionally substituted with a halogen atom.

[Formula 37]

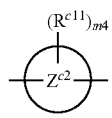
(c5)

In the formula (c5), a ring $Z^{c2}$ represents an aromatic hydrocarbon ring, $R^{c11}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, and m4 represents an integer of 0 or more.

[Formula 38]

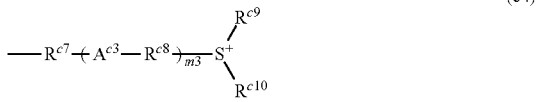
(c6)

In the formula (c6), a ring $Z^{c3}$ represents an aromatic hydrocarbon ring, $R^{c12}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, a thienylcarbonyl group, a furanylcarbonyl group, an selenophenylcarbonyl group, an aryl group, a heterocyclic group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, and m5 represents an integer of 0 or more.

(Sulfonium Salt (Q))

A sulfonium salt (Q) will be described below.

The sulfonium salt (Q) is characterized in that, in a benzene ring in the formula (c1), a methyl group is bonded to the carbon atom at the ortho-position with respect to the carbon atom to which $A^{c1}$ is bonded.

Since the sulfonium salt (Q) has a methyl group at the above position, protons are easily generated as compared with a conventional sulfonium salt, leading to high sensitivity to active energy ray such as ultraviolet light.

In the formula (c1), both $R^{c1}$ and $R^{c2}$ are preferably groups represented by the formula (c2).

$R^{c1}$ and $R^{c2}$ may be the same or different with each other. In the formula (c1), $R^{c1}$ and $R^{c2}$ are combined with each other to form a ring together with a sulfur atom in the formula, and the number of ring-constituting atoms of the ring to be formed is preferably 3 or more and 10 or less, and more preferably, 5 or more and 7 or less, including a sulfur atom.

The ring to be formed may be polycyclic, and preferably those in which 5- to 7-membered rings are fused.

In the formula (c1), both $R^{c1}$ and $R^{c2}$ are preferably phenyl groups.

In the formula (c1), $R^{c3}$ is preferably a group represented by the formula (c3).

In the formula (c1), $A^{c1}$ is preferably S or O, and more preferably S.

In the formula (c2), $R^{c4}$ is preferably an alkyl group optionally substituted with a halogen atom, a hydroxy group, an alkylcarbonyl group, a thienylcarbonyl group, a furanylcarbonyl group, a selenophenylcarbonyl group, an optionally substituted amino group, or a nitro group, and more preferably, an alkyl group optionally substituted with a halogen atom, an alkylcarbonyl group, or a thienylcarbonyl group.

In the formula (c2), m1 can be selected according to types of the ring $Z^{c1}$ and may be, for example, an integer of 0 or more and 4 or less, preferably an integer of 0 or more and 3 or less, and more preferably an integer of 0 or more and 2 or less.

In the formula (c3), $R^{c5}$ is preferably an alkylene group; an alkylene group substituted with a hydroxy group, an optionally substituted amino group, or a nitro group; or a group represented by the formula (c5), and more preferably a group represented by the formula (c5).

In the formula (c3), $R^{c6}$ is preferably an alkyl group; an alkyl group substituted with a hydroxy group, an optionally substituted amino group, or a nitro group; or a group represented by the formula (c6), and more preferably a group represented by the formula (c6).

In the formula (c3), $A^{c2}$ is preferably S or O, and more preferably S.

In the formula (c3), m2 is preferably 0.

In the formula (c4), $R^{c7}$ and $R^{c8}$ independently represent an alkylene group; an alkylene group substituted with a hydroxy group, an optionally substituted amino group, or a nitro group; or a group represented by the formula (a5), and more preferably, a group represented by the formula (c5). $R^{c7}$ and $R^{c8}$ may be the same or different with each other. In the formula (c4), both $R^{c9}$ and $R^{c10}$ are preferably groups represented by the formula (c2).

$R^{c9}$ and $R^{c10}$ may be the same or different with each other. In the formula (c4), $R^{c9}$ and $R^{c10}$ are combined with each other to form a ring together with a sulfur atom in the formula, and the number of ring-constituting atoms of the ring to be formed is preferably 3 or more and 10 or less, and more preferably 5 or more and 7 or less, including a sulfur atom.

The ring to be formed may be polycyclic, and preferably those in which 5- to 7-membered rings are fused.

In the formula (c4), $A^{c3}$ is preferably S or O, and more preferably S.

In the formula (c4), m3 is preferably 0.

In the formula (c5), $R^{c11}$ is preferably an alkyl group optionally substituted with a halogen atom, a hydroxy group, an optionally substituted amino group, or a nitro group, and more preferably, an alkyl group optionally substituted with a halogen atom.

In the formula (c5), m4 can be selected according to types of the ring $Z^{c2}$ and may be, for example, an integer of 0 or more and 4 or less, preferably an integer of 0 or more and 3 or less, and more preferably an integer of 0 or more and 2 or less.

In the formula (c6), $R^{c12}$ is preferably an alkyl group optionally substituted with a halogen atom, a hydroxy group, an alkylcarbonyl group, a thienylcarbonyl group, a furanylcarbonyl group, a selenophenylcarbonyl group, an optionally substituted amino group, or a nitro group, and more preferably, an alkyl group optionally substituted with a halogen atom, an alkylcarbonyl group, or a thienylcarbonyl group.

In the formula (c6), m5 can be selected according to types of the ring $Z^{c3}$ and may be, for example, an integer of 0 or more and 4 or less, preferably an integer of 0 or more and 3 or less, and more preferably an integer of 0 or more and 2 or less.

The cation represented by the formula (c1) generally forms a salt together with a monovalent anion $X^-$. $X^-$ is a monovalent anion corresponding to an acid (HX) generated by irradiating a sulfonium salt (Q) with active energy (such as heat, visible light, ultraviolet rays, electron beam, and X-ray). $X^-$ is suitably a monovalent polyatomic anion, and more preferably an anion represented by $MY_a^-$, $(Rf)_bPF_{6-b}^-$, $R^{x1}_cBY_{4-c}^-$, $R^{x2}SO_3^-$, $(R^{x2}SO_2)_3C^-$, or $(R^{x2}SO_2)_2N^-$. $X^-$ may be also a halogen anion and examples thereof include fluoride ion, chloride ion, bromide ion, iodide ion, and the like.

M represents a phosphorus atom, a boron atom, or an antimony atom.

Y represents a halogen atom (preferably a fluorine atom).

Rf represents an alkyl group in which 80 mol % or more of hydrogen atoms are substituted with a fluorine atom (preferably an alkyl group having 1 or more and 8 or less carbon atoms). Examples of the alkyl group, which forms Rf by fluorine substitution, include a linear alkyl group (methyl, ethyl, propyl, butyl, pentyl, and octyl), a branched alkyl group (isopropyl, isobutyl, sec-butyl, and tert-butyl) and cycloalkyl group (cyclopropyl, cyclobutyl, cyclopentyl, and cyclohexyl), and the like. The proportion of the hydrogen atom of the alkyl group substituted with the fluorine atom in Rf is preferably 80 mol % or more, more preferably 90 mol % or more, and particularly preferably 100 mol %, based on the number of mols of the hydrogen atom originally possessed by the alkyl group. When the proportion of substitution with the fluorine atom is preferably within the above range, the photosensitivity of the sulfonium salt (Q) becomes more satisfactory. Particularly preferred Rf includes $CF_3-$, $CF_3CF_2^-$, $(CF_3)_2CF^-$, $CF_3CF_2CF_2^-$, $CF_3CF_2CF_2CF_2^-$, $(CF_3)_2CFCF_2^-$, $CF_3CF_2(CF_3)CF^-$, and $(CF_3)_3C^-$. b Rf(s) are mutually independent and may be the same or different with each other.

P represents a phosphorus atom and F represents a fluorine atom.

$R^{x1}$ represents a phenyl group in which hydrogen atoms are partially substituted with at least one element or electron withdrawing group.

A halogen atom is included in examples of one element, and examples thereof include a fluorine atom, a chlorine atom, and a bromine atom, and the like. Examples of the electron withdrawing group include a trifluoromethyl group, a nitro group, and a cyano group, and the like. Of these groups, preferred is a phenyl group in which at least one hydrogen atom is substituted with a fluorine atom or a trifluoromethyl group. c $R^{x1}$ (s) are mutually independent and may be the same or different with each other.

B represents a boron atom.

$R^{x2}$ represents an alkyl group having 1 or more and 20 or less carbon atoms, a fluoroalkyl group having 1 or more and 20 or less carbon atoms, or an aryl group having 6 or more and 20 or less carbon atoms, the alkyl group and the fluoroalkyl group may be linear, branched, or cyclic, and the alkyl group, the fluoroalkyl group, or the aryl group is not optionally substituted or optionally substituted.

Examples of the substituent include a hydroxy group, an optionally substituted amino group (e.g., including those exemplified in the below-mentioned description with respect to the formulas (c2) to (c6)), a nitro group, and the like.

A carbon chain in the alkyl group, fluoroalkyl group, or aryl group represented by $R^{x2}$ may have a heteroatom such as an oxygen atom, a nitrogen atom, or a sulfur atom. Particularly, the carbon chain in the alkyl group or fluoroalkyl group represented by $R^{x2}$ may have a divalent functional group (e.g., an ether bond, a carbonyl bond, an ester bond, an amino bond, an amide bond, an imide bond, a sulfonyl bond, a sulfonylamide bond, a sulfonylimide bond, a urethane bond, etc.).

When the alkyl group, fluoroalkyl group or aryl group represented by $R^{x2}$ has the substituent, heteroatom, or functional group, the number of the substituent, heteroatom, or functional group may be 1, or 2 or more.

S represents a sulfur atom, O represents an oxygen atom, C represents a carbon atom, and N represents a nitrogen atom. a represents an integer of 4 or more and 6 or less.

b is preferably an integer of 1 or more and 5 or less, more preferably an integer of 2 or more and 4 or less, and particularly preferably 2 or 3.

c is preferably an integer of 1 or more and 4 or less, and more preferably 4.

Examples of the anion represented by $MY_a^-$ include an anion represented by $SbF_6^-$, $PF_6^-$, or $BF_4^-$.

Examples of the anion represented by $(Rf)_b PF_{6-b}^-$ include an anion represented by $(CF_3CF_2)_2PF_4^-$, $(CF_3CF_2)_3PF_3^-$, $((CF_3)_2CF)_2PF_4^-$, $((CF_3)_2CF)_3PF_3^-$, $(CF_3CF_2CF_2)_2PF_4^-$, $(CF_3CF_2CF_2)_3PF_3^-$, $((CF_3)_2CFCF_2)_2PF_4^-$, $((CF_3)_2CFCF_2)_3PF_3^-$, $(CF_3CF_2CF_2CF_2)_2PF_4^-$, or $(CF_3CF_2CF_2CF_2)_3PF_3^-$, and the like. Of these, an anion represented by $(CF_3CF_2)_3PF_3^-$, $(CF_3CF_2CF_2)_3PF_3^-$, $((CF_3)_2CF)_3PF_3^-$, $((CF_3)_2CF)_2PF_4^-$, $((CF_3)_2CFCF_2)_3PF_3^-$, or $((CF_3)_2CFCF_2)_2PF_4^-$ is preferable.

The anion represented by $R^{x1}_c BY_{4-c}$ is preferably an anion represented by:

$R^{x1}_c BY_{4-c}{}^-$ wherein $R^{x1}$ represents a phenyl group in which at least part of hydrogen atoms are substituted with a halogen atom or an electron withdrawing group, Y represents a halogen atom, and c represents an integer of 1 or more and 4 or less, and examples thereof include an anion represented by $((C_6F_5)_4B)^-$, $(((CF_3)_2C_6H_3)_4B)^-$, $((CF_3C_6H_4)_4B)^-$, $((C_6F_5)_2BF_2)^-$, $(C_6F_5BF_3)^-$, or $((C_6H_3F_2)_4B)^-$, and the like. Among these, an anion represented by $((C_6F_5)_4B)^-$ or $(((CF_3)_2C_6H_3)_4B)^-$ is preferable.

Examples of the anion represented by $R^{x2}SO_3$— include a trifluoromethanesulfonic acid anion, a pentafluoroethanesulfonic acid anion, a heptafluoropropanesulfonic acid anion, a nonafluorobutanesulfonic acid anion, a pentafluorophenylsulfonic acid anion, a p-toluenesulfonic acid anion, a benzenesulfonic acid anion, a camphorsulfonic acid anion, a methanesulfonic acid anion, an ethanesulfonic acid anion, a propanesulfonic acid anion, and a butanesulfonic acid anion. Of these, a trifluoromethanesulfonic acid anion, a nonafluorobutanesulfonic acid anion, a methanesulfonic acid anion, a butanesulfonic acid anion, a camphorsulfonic acid anion, a benzenesulfonic acid anion, or a p-toluenesulfonic acid anion is preferable.

Examples of the anion represented by $(R^{x2}SO_2)_3C^-$ include an anion represented by $(CF_3SO_2)_3C^-$, $(C_2F_5SO_2)_3C^-$, $(C_3F_7SO_2)_3C^-$, or $(C_4F_9SO_2)_3C^-$, and the like.

Examples of the anion represented by $(R^{x2}SO_2)_2N^-$ include an anion represented by $(CF_3SO_2)_2N^-$, $(C_2F_5SO_2)_2N^-$, $(C_3F_7SO_2)_2N^-$, or $(C_4F_9SO_2)_2N^-$, and the like.

It is possible to use, as the monovalent polyatomic anion, in addition to an anion represented by $MY_a^-$, $(Rf)_b PF_{6-b}^-$, $R^{x1}_c BY_{4-c}^-$, $R^{x2}SO_3^-$, $(R^{x2}SO_2)_3C^-$, or $(R^{x2}SO_2)_2N^-$, a perhalogen acid ion ($ClO_4^-$, $BrO_4^-$, etc.), a halogenated sulfonic acid ion ($FSO_3^-$, $ClSO_3^-$, etc.), a sulfuric acid ion ($CH_3SO_4^-$, $CF_3SO_4^-$, $HSO_4^-$, etc.), a carbonic acid ion ($HCO_3^-$, $CH_3CO_3^-$, etc.), an aluminic acid ion ($AlCl_4^-$, $AlF_4^-$, etc.), a hexafluorobismuthic acid ion ($BiF_6^-$), a carboxylic acid ion ($CH_3COO^-$, $CF_3COO^-$, $C_6H_5COO^-$, $CH_3C_6H_4COO^-$, $C_6F_5COO^-$, $CF_3C_6H_4COO^-$, etc.), an arylboric acid ion ($B(C_6H_5)_4^-$, $CH_3CH_2CH_2CH_2B(C_6H_5)_3^-$, etc.), a thiocyanic acid ion ($SCN^-$), and a nitric acid ion ($NO_3^-$), and the like.

Among these $X^-$(s), in view of the cationic polymerization properties, anions represented by $MY_a^-$, $(Rf)_b PF_{6-b}^-$, $R^{x1}_c BY_{4-c}^-$, and $(R^{x2}SO_2)_3C^-$ are preferable and anions represented by $SbF_6^-$, $PF_6^-$, $(CF_3CF_2)_3PF_3^-$, $((C_6F_5)_4B)^-$, $(((CF_3)_2C_6H_3)_4B)^-$, and $(CF_3SO_2)_3C^-$ are more preferable.

In the formulas (c2), (c5), and (c6), examples of the aromatic hydrocarbon ring include a benzene ring and a fused polycyclic aromatic hydrocarbon ring [fused di- to tetracyclic aromatic hydrocarbon rings, for example, a fused dicyclic hydrocarbon ring (e.g., a $C_{8-20}$ fused dicyclic hydrocarbon ring such as a naphthalene ring, and preferably a $C_{10-16}$ fused dicyclic hydrocarbon ring), a fused tricyclic aromatic hydrocarbon ring (e.g., an anthracene ring, a phenanthrene ring, etc.).

The aromatic hydrocarbon ring is preferably a benzene ring or a naphthalene ring, and more preferably a benzene ring.

In the formulas (c1) to (c6), examples of the halogen atom include a fluorine atom, a chlorine atom, a bromine atom, and an iodine atom.

In the formulas (c1) to (c6), examples of the alkyl group include a linear alkyl group having 1 or more and 18 or less carbon atoms (methyl, ethyl, n-propyl, n-butyl, n-pentyl, n-octyl, n-decyl, n-dodecyl, n-tetradecyl, n-hexadecyl, and n-octadecyl), a branched alkyl group having 3 or more and 18 or less carbon atoms (isopropyl, isobutyl, sec-butyl, tert-butyl, isopentyl, neopentyl, tert-pentyl, isohexyl, and isooctadecyl), and a cycloalkyl group having 3 or more and 18 or less carbon atoms (cyclopropyl, cyclobutyl, cyclopentyl, cyclohexyl, and 4-decylcyclohexy). Particularly, in the formulas (c1), (c2), and (c4) to (c6), the alkyl group optionally substituted with a halogen atom means an alkyl group substituted with an alkyl group and a halogen atom. Examples of the alkyl group substituted with a halogen atom include a group in which at least one hydrogen atom in the linear alkyl group, branched alkyl group, or cycloalkyl group is substituted with a halogen atom (monofluoromethyl, difluoromethyl, trifluoromethyl, etc.). Of the alkyl groups optionally substituted with a halogen atom, $R^{c1}$, $R^{c2}$, $R^{c9}$, or $R^{c10}$ is particularly preferably a trifluoromethyl group, and $R^{c4}$, $R^{c6}$, $R^{c11}$, or $R^{c12}$ is particularly preferably a methyl group.

In the formulas (c2) to (c6), examples of the alkoxy group include a linear or branched alkoxy group having 1 or more and 18 or less carbon atoms (methoxy, ethoxy, propoxy, isopropoxy, butoxy, isobutoxy, sec-butoxy, tert-butoxy, hexyloxy, decyloxy, dodecyloxy, and octadecyloxy), and the like.

In the formulas (c2) to (c6), examples of the alkyl group in the alkylcarbonyl group include the above-mentioned linear alkyl group having 1 or more and 18 or less carbon atoms, branched alkyl group having 3 or more and 18 or less carbon atoms, or cycloalkyl group having 3 or more and 18 or less carbon atoms, and examples of the alkylcarbonyl group include a linear, branched, or cyclic alkylcarbonyl group having 2 or more and 18 or less carbon atoms (acetyl, propionyl, butanoyl, 2-methylpropionyl, heptanoyl, 2-methylbutanoyl, 3-methylbutanoyl, octanoyl, decanoyl, dodecanoyl, octadecanoyl, cyclopentanoyl group, and cyclohexanoyl group), and the like.

In the formulas (c3) to (c6), examples of the arylcarbonyl group include an arylcarbonyl group having 7 or more and 11 or less carbon atoms (benzoyl and naphthoyl), and the like.

In the formulas (a2) to (a6), examples of the alkoxycarbonyl group include a linear or branched alkoxycarbonyl group having 2 or more and 19 or less carbon atoms (methoxycarbonyl, ethoxycarbonyl, propoxycarbonyl, isopropoxycarbonyl, butoxycarbonyl, isobutoxycarbonyl, sec-butoxycarbonyl, tert-butoxycarbonyl, octyloxycarbonyl, tetradecyloxycarbonyl, and octadecyloxycarbonyl), and the like.

In the formulas (c3) to (c6), examples of the aryloxycarbonyl group include an aryloxycarbonyl group having 7 or more and 11 or less carbon atoms (phenoxycarbonyl and naphthoxycarbonyl), and the like.

In the formulas (c3) to (c6), examples of the arylthiocarbonyl group include an arylthiocarbonyl group having 7 or more and 11 or less carbon atoms (phenylthiocarbonyl and naphthoxythiocarbonyl), and the like.

In the formulas (c2) to (c6), examples of the acyloxy group include a linear or branched acyloxy group having 2 or more and 19 or less carbon atoms (acetoxy, ethylcarbonyloxy, propylcarbonyloxy, isopropylcarbonyloxy, butylcarbonyloxy, isobutylcarbonyloxy, sec-butylcarbonyloxy, tert-butylcarbonyloxy, octylcarbonyloxy, tetradecylcarbonyloxy, and octadecylcarbonyloxy), and the like.

In the formulas (c3) to (c6), examples of the arylthio group include an arylthio group having 6 or more and 20 or less carbon atoms (phenylthio, 2-methylphenylthio, 3-methylphenylthio, 4-methylphenylthio, 2-chlorophenylthio, 3-chlorophenylthio, 4-chlorophenylthio, 2-bromophenylthio, 3-bromophenylthio, 4-bromophenylthio, 2-fluorophenylthio, 3-fluorophenylthio, 4-fluorophenylthio, 2-hydroxyphenylthio, 4-hydroxyphenylthio, 2-methoxyphenylthio, 4-methoxyphenylthio, 1-naphthylthio, 2-naphthylthio, 4-[4-(phenylthio)benzoyl]phenylthio, 4-[4-(phenylthio)phenoxy]phenylthio, 4-[4-(phenylthio)phenyl]phenylthio, 4-(phenylthio)phenylthio, 4-benzoylphenylthio, 4-benzoyl-2-chlorophenylthio, 4-benzoyl-3-chlorophenylthio, 4-benzoyl-3-methylthiophenylthio, 4-benzoyl-2-methylthiophenylthio, 4-(4-methylthiobenzoyl)phenylthio, 4-(2-methylthiobenzoyl)phenylthio, 4-(p-methylbenzoyl)phenylthio, 4-(p-ethylbenzoyl)phenylthio 4-(p-isopropylbenzoyl)phenylthio, and 4-(p-tert-butylbenzoyl)phenylthio), and the like.

In the formulas (c2) to (c6), examples of the alkylthio group include a linear or branched alkylthio group having 1 or more and 18 or less carbon atoms (methylthio, ethylthio, propylthio, isopropylthio, butylthio, isobutylthio, sec-butylthio, tert-butylthio, pentylthio, isopentylthio, neopentylthio, tert-pentylthio, octylthio, decylthio, dodecylthio, and isooctadecylthio), and the like.

In the formulas (c3) to (c6), examples of the aryl group include an aryl group having 6 or more and 10 or less carbon atoms (phenyl, tolyl, dimethylphenyl, and naphthyl), and the like.

In the formula (c2), examples of the aliphatic heterocyclic group include an aliphatic heterocyclic group having 2 or more and 20 or less carbon atoms (preferably 4 or more and 20 or less) (e.g. pyrrolidinyl, tetrahydrofuranyl, tetrahydrothienyl, piperidinyl, tetrahydropyranyl, tetrahydrothiopyranyl, morpholinyl) and the like.

In the formulas (c3) to (c6), examples of the heterocyclic group include a heterocyclic group having 4 or more and 20 or less carbon atoms (e.g. thienyl, furanyl, selenophenyl, pyranyl, pyrrolyl, oxazolyl, thiazolyl, pyridyl, pyrimidyl, pyrazinyl, indolyl, benzofuranyl, benzothienyl, quinolyl, isoquinolyl, quinoxalinyl, quinazolinyl, carbazolyl, acridinyl, phenothiazinyl, phenazinyl, xanthenyl, thianthrenyl, phenoxazinyl, phenoxathiinyl, chromanyl, isochromanyl, dibenzothienyl, xanthonyl, thioxanthonyl, and dibenzofuranyl) and the like.

In the formulas (c3) to (c6), examples of the aryloxy group include an aryloxy group having 6 or more and 10 or less carbon atoms (phenoxy and naphthyloxy), and the like.

In the formulas (c2) to (c6), examples of the alkylsulfinyl group include a linear or branched sulfinyl group having 1 or more and 18 or less carbon atoms (methylsulfinyl, ethylsulfinyl, propylsulfinyl, isopropylsulfinyl, butylsulfinyl, isobutylsulfinyl, sec-butylsulfinyl, tert-butylsulfinyl, pentylsulfinyl, isopentylsulfinyl, neopentylsulfinyl, tert-pentylsulfinyl, octylsulfinyl, and isooctadecylsulfinyl), and the like.

In the formulas (c3) to (c6), examples of the arylsulfinyl group include an arylsulfinyl group having 6 or more and 10 or less carbon atoms (phenylsulfinyl, tolylsulfinyl, and naphthylsulfinyl), and the like.

In the formulas (c2) to (c6), examples of the alkylsulfonyl group include a linear or branched alkylsulfonyl group having 1 or more and 18 or less carbon atoms (methylsulfonyl, ethylsulfonyl, propylsulfonyl, isopropylsulfonyl, butylsulfonyl, isobutylsulfonyl, sec-butylsulfonyl, tert-butylsulfonyl, pentylsulfonyl, isopentylsulfonyl, neopentylsulfonyl, tert-pentylsulfonyl, octylsulfonyl, and octadecylsulfonyl), and the like.

In the formulas (c3) to (c6), examples of the arylsulfonyl group include an arylsulfonyl group having 6 or more and 10 or less carbon atoms (phenylsulfonyl, tolylsulfonyl (tosyl group) and naphthylsulfonyl), and the like.

In the formulas (c2) to (c6), examples of the hydroxy(poly)alkyleneoxy group include a hydroxy(poly)alkyleneoxy group represented by $HO(AO)_q$— (wherein AO independently represents an ethyleneoxy group and/or a propyleneoxy group, and q represents an integer of 1 or more and 5 or less).

In the formulas (c2) to (c6), examples of the optionally substituted amino group include an amino group ($-NH_2$) and a substituted amino group having 1 or more and 15 or less carbon atoms (methylamino, dimethylamino, ethylamino, methylethylamino, diethylamino, n-propylamino, methyl-n-propylamino, ethyl-n-propylamino, n-propylamino, isopropylamino, isopropylmethylamino, isopropylethylamino, diisopropylamino, phenylamino, diphenylamino, methylphenylamino, ethylphenylamino, n-propylphenylamino, and isopropylphenylamino), and the like.

In the formulas (c3) and (c4), examples of the alkylene group include a linear or branched alkylene group having 1 or more and 18 or less carbon atoms (a methylene group, a 1,2-ethylene group, a 1,1-ethylene group, a propane-1,3-diyl group, a propane-1,2-diyl group, a propane-1,1-diyl group, a propane-2,2-diyl group, a butane-1,4-diyl group, a butane-1,3-diyl group, a butane-1,2-diyl group, a butane-1,1-diyl group, a butane-2,2-diyl group, a butane-2,3-diyl group, a pentane-1,5-diyl group, a pentane-1,4-diyl group, a hexane-1,6-diyl group, a heptane-1,7-diyl group, an octane-1,8-diyl group, a 2-ethylhexane-1,6-diyl group, a nonane-1,9-diyl group, a decane-1,10-diyl group, a undecane-1,11-diyl group, a dodecane-1,12-diyl group, a tridecane-1,13-diyl group, a tetradecane-1,14-diyl group, a pentadecane-1,15-diyl group, and a hexadecane-1,16-diyl group), and the like.

A sulfonium salt (Q) can be synthesized, for example, in accordance with the following scheme. Specifically, 1-fluoro-2-methyl-4-nitrobenzene represented by the following formula (c1-1) is reacted with a compound represented by the following formula (c1-2) in the presence of a base such as potassium hydroxide to obtain a nitro compound represented by the following formula (c1-3), followed by reduction in the presence of reduced iron to obtain an amine compound represented by the following formula (c1-4).

The amine compound is reacted with a nitrite (e.g., sodium nitrite) represented by $MaNO_2$ (wherein Ma represents a metal atom, for example, an alkali metal atom such as a sodium atom) to obtain a diazo compound, and then the diazo compound is mixed with cuprous halide represented by CuX' (wherein X' represents a halogen atom such as a bromine atom, the same shall apply hereinafter) and hydrogen halide represented by HX', followed by proceeding of the reaction to obtain a halide represented by the following formula (c1-5).

A Grignard reagent is prepared from the halide and magnesium, and then the Grignard reagent is reacted with a sulfoxide compound represented by the following formula (c1-6) in the presence of chlorotrimethylsilane, thus making it possible to obtain a sulfonium salt represented by the following formula (c1-7). Furthermore, the sulfonium salt is reacted with a salt represented by $Mb^+X''^-$ (wherein $Mb^+$ represents a metal cation, for example, an alkali metal cation such as a potassium ion, and $X''^-$ represents a monovalent anion represented by $X^-$ (provided that, a halogen anion is excluded)), thereby performing a salt exchange, thus making it possible to obtain a sulfonium salt represented by the following formula (c1-8).

In the following formulas (c1-2) to (c-8), $R^{c1}$ to $R^{c3}$ and $A^{c1}$ are the same as those in the formula (c1).

<Scheme>

[Formula 39]

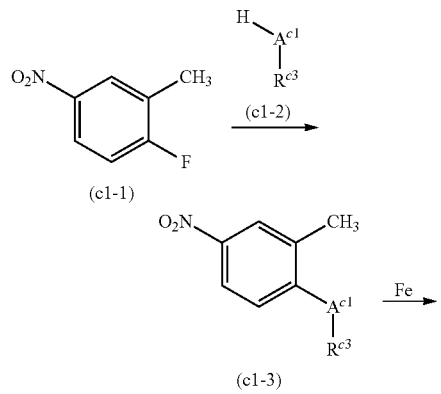

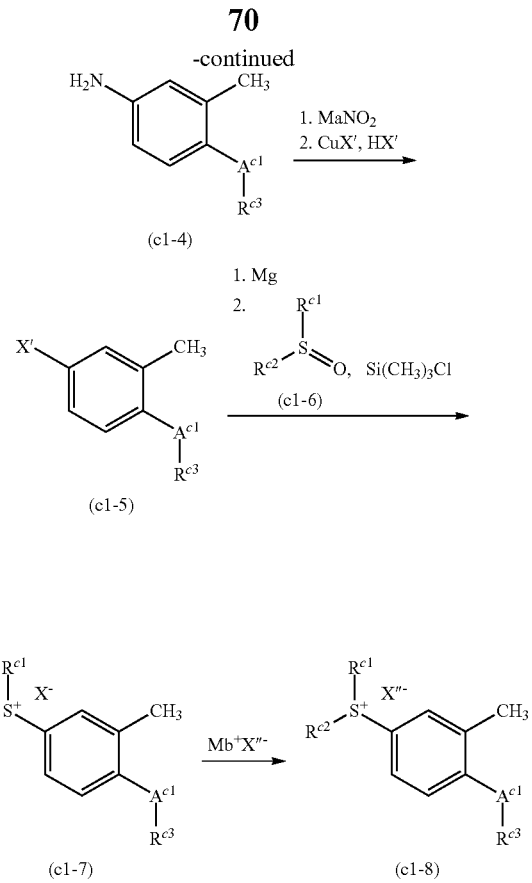

Specific examples of the cation represented by the formula (c1), the cation moiety of the sulfonium salt (Q), include the following. Specific examples of the anion moiety of the sulfonium salt (Q) can include conventionally known ones such as those provided in the description of $X^-$. The sulfonium salt (Q) comprising the cation moiety represented by the formula (c1) can be synthesized in accordance with the scheme, and it is possible to combine the cation moiety with a desired anion moiety by further performing salt exchange as needed, and particularly a combination with an anion represented by $R^{x1}BY_{4-c}^-$ (wherein $R^{X1}$ represents a phenyl group in which at least part of hydrogen atoms are substituted with a halogen atom or an electron withdrawing group, Y represents a halogen atom, and c represents an integer of 1 or more and 4 or less) is preferable.

[Formula 40]

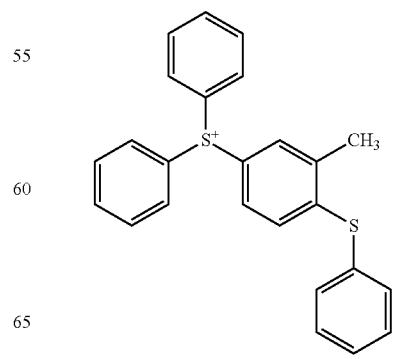

71
-continued
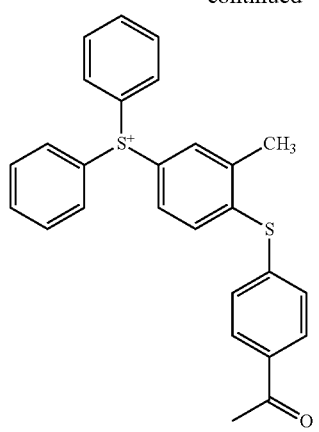
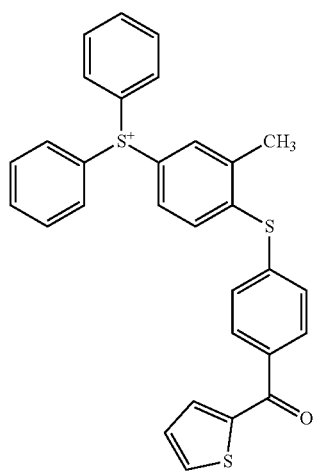
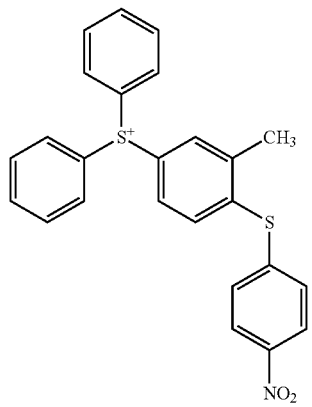
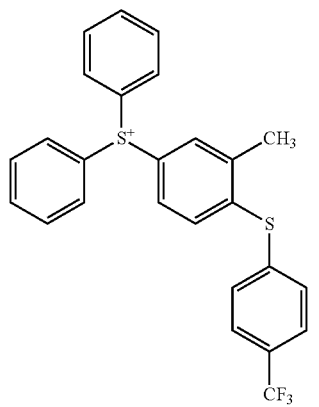
72
-continued
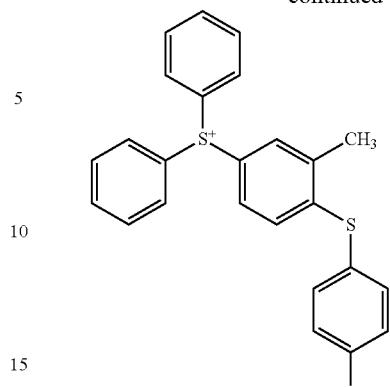
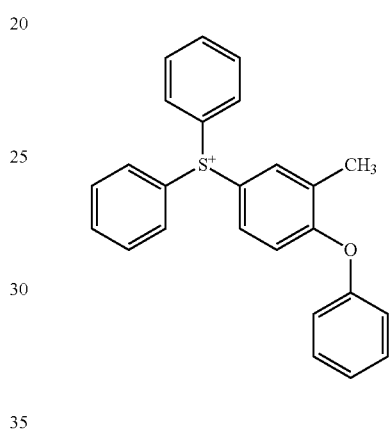
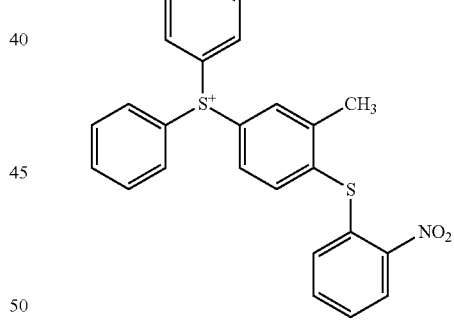
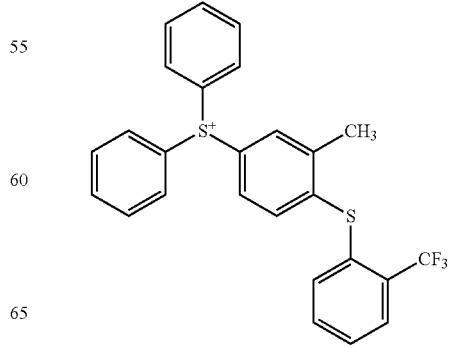

-continued

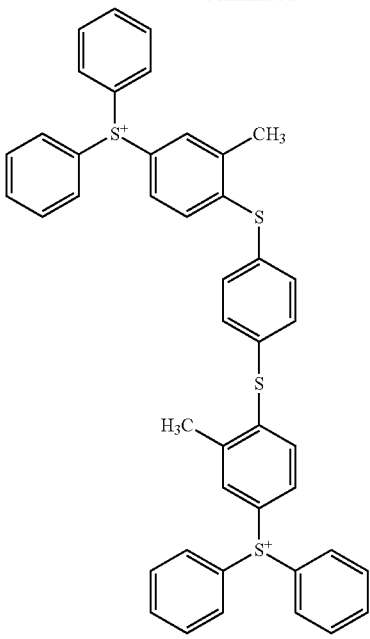

In the group of preferred cation moiety, the cation moiety represented by the following formula is more preferable.

[Formula 41]

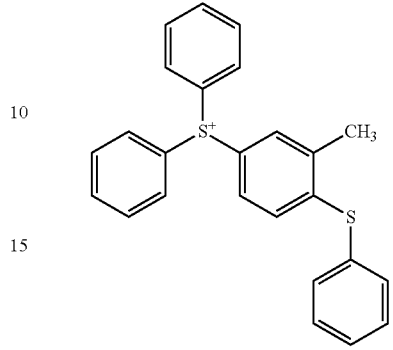

Another cationic polymerization initiator (C) may comprise another photocationic polymerization initiator other than the sulfonium salt (Q), together with the sulfonium salt (Q).

The content of the sulfonium salt (Q) in another cationic polymerization initiator (C) is not particularly limited and, typically, is preferably 70% by mass or more, more preferably 80% by mass or more, particularly preferably 90% by mass or more, and most preferably 100% by mass.

The photocationic polymerization initiator (C2) may further comprise a photocationic polymerization initiator other than the above-described cationic polymerization initiator (B) and sulfonium (Q), together with the sulfonium salt (Q).

It is possible to use, as the photocationic polymerization initiator other than the above-described cationic polymerization initiator (B) and sulfonium (Q), various cationic polymerization initiators, which have hitherto been used for cation polymerization, without particular limitation.

As described above, the photocationic polymerization initiators other than the above-described cationic polymerization initiator (B) and sulfonium (Q) are preferably onium salts such as an iodonium salt and a sulfonium salt, and more preferably other sulfonium salts other than the sulfonium salt (Q).

Hereinafter, the sulfonium salt as the photocationic polymerization initiator other than the above-described cationic polymerization initiator (B) and sulfonium (Q) is also referred to as "sulfonium salt (Q')".

The sulfonium salt (Q') preferably comprises, as the monovalent anion $X^-$, the above-described $R^{x1}{}_cBY_{4-c}{}^-$, as is the case of the sulfonium salt (Q).

The sulfonium salt (Q') having a monovalent anion represented by $R^{x1}{}_cBY_{4-c}{}^-$ includes, for example, a sulfonium salt represented by the following formula (c1'):

[Formula 42]

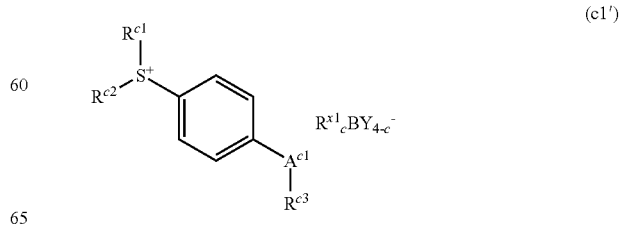

(c1')

wherein, $R^{c1}$, $R^{c2}$, $R^{c3}$, $A^{c1}$, $R^{x1}$, Y, and c are as mentioned above.

Specific examples of the cation moiety of the sulfonium salt (Q') represented by the formula (c1') include the following.
[Formula 43]
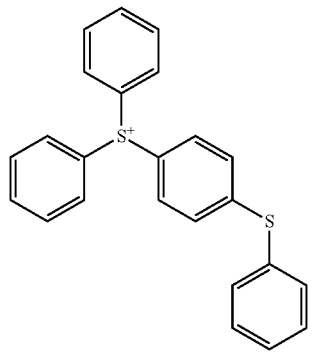
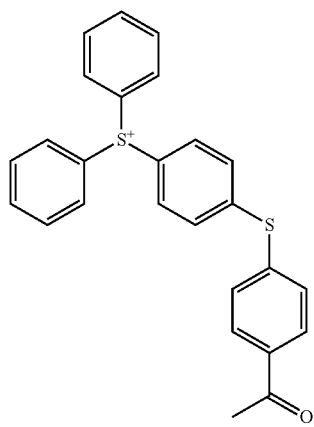
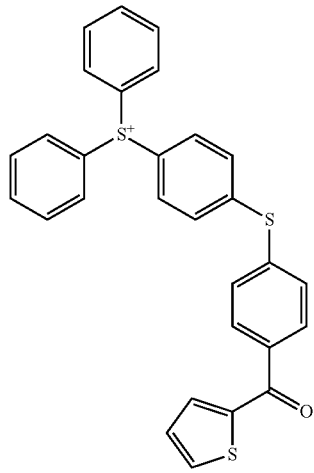
-continued
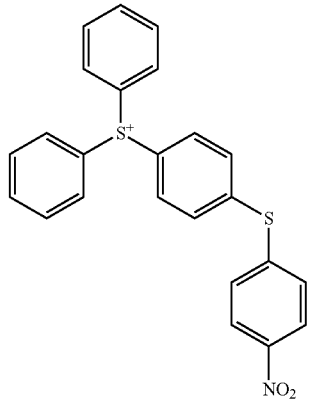
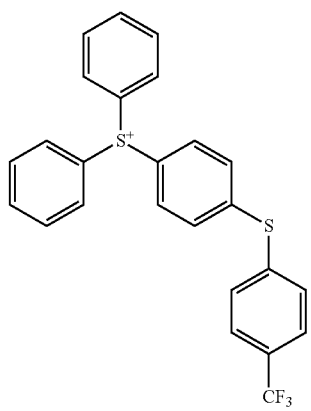
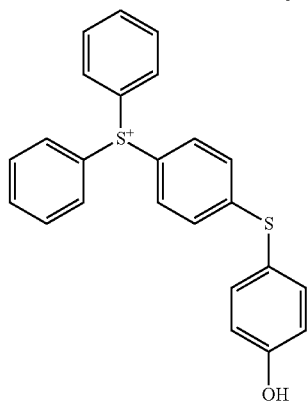
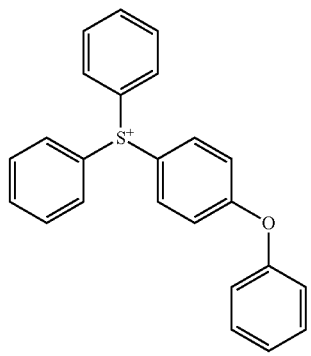

-continued

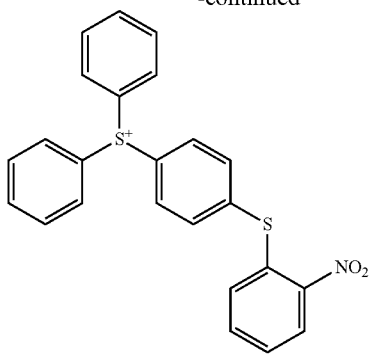

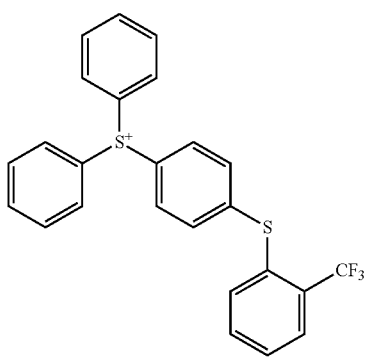

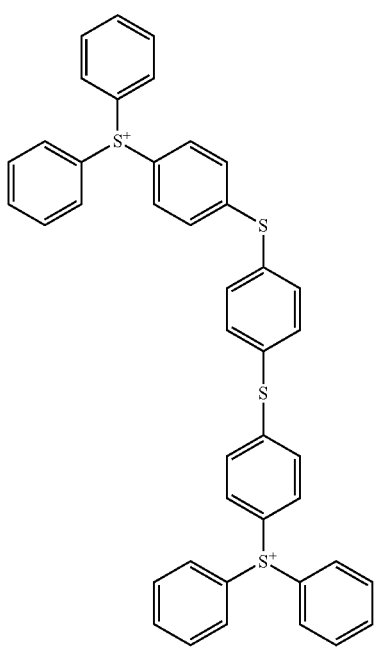

-continued

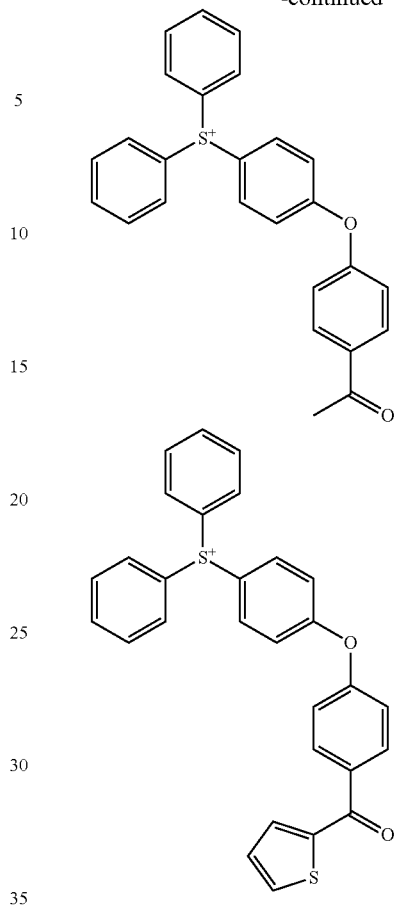

Typical examples of the cation moiety of the sulfonium salt (Q') include the following.

[Formula 44]

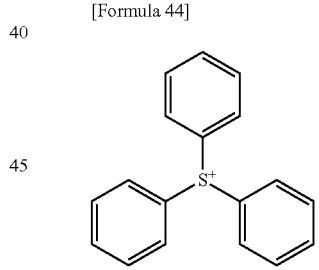

There is no particular limitation on the content of the another cationic polymerization initiator (C) in the curable composition, as long as curing of the curable composition satisfactorily proceeds.

In view of the fact that it is easy to satisfactorily cure the curable composition, typically, the content of the another cationic polymerization initiator (C) is, as the total amount of the cationic polymerization initiator (B) and another cationic polymerization initiator (C) described below, preferably 0 parts by mass or more and 5 parts by mass or less, more preferably 0.01 parts by mass or more and 3 parts by mass or less, and particularly preferably 0.03 parts by mass or more and 2 parts by mass or less with respect to 100 parts by mass of the curable compound (A).

The content of the another cationic polymerization initiator (C) is preferably 90% by mass or less, more preferably 50% by mass or less, still more preferably 70% by mass or less, and particularly preferably 90% by mass or less with respect to the total amount of the cationic polymerization initiator (B) and another cationic polymerization initiator (C) described below.

It is also preferred that the curable composition not comprise another cationic polymerization initiator (C).

<(D) Curing Accelerator>

A curable composition may contain: (D) a curing accelerator.

When the curable composition contains the curing accelerator (D), it is possible to form a cured product which has particularly satisfactory curability of the curable composition, and particularly satisfactory heat resistance (pyrolysis resistance) and adhesion to a base material.

Examples of the curing accelerator (D) include a urea compound, a tertiary amine and salts thereof, imidazoles and salts thereof, phosphine-based compounds and derivatives thereof, carboxylic acid metal salts, Lewis acids, Bronsted acids and salts thereof, tetraphenylboronate, and the like.

Preferred specific examples of the curing accelerator (D) include tertiary amines such as 1,8-diazabicyclo(5,4,0)undecene-7, triethylenediamine, benzyldimethylamine, triethanolamine, dimethylaminoethanol, and tris(dimethylaminomethyl)phenol; imidazoles such as 2-methylimidazole, 2-phenylimidazole, 2-phenyl-4-methylimidazole, and 2-heptadecylimidazole; phosphine-based compounds such as tributylphosphine, methyldiphenylphosphine, triphenylphosphine, diphenylphosphine, and phenylphosphine; tetraphenylphosphonium tetraphenylborate, triphenylphosphinetetraphenylborate, 2-ethyl-4-methylimidazoletetraphenylborate, and a tetraphenylboron salt of N-methylmorpholine tetraphenylborate.

Of the above-described curing accelerators (D), phosphine-based compounds and derivatives thereof, and tetraphenylboron salts are preferable. Of the above specific examples, triphenylphosphine and triphenylphosphine triphenylborane are preferable.

There is no particular limitation on the amount of the curing accelerator (D) used without defeating the object of the present invention. The amount of the curing accelerator (D) used is preferably 0.01 parts by mass or more and 5 parts by mass or less, more preferably 0.05 parts by mass or more and 3 parts by mass or less, and particularly preferably 0.1 parts by mass or more and 2 parts by mass or less with respect to 100 parts by mass of the curable compound (A).

<(E) Sensitizer>

The curable composition may comprise a sensitizer (E). When the curable composition comprises a photocationic polymerization initiator (C) or when the cationic polymerization initiator (B) comprises a sulfonium cation and/or an iodonium cation, the curable composition preferably comprises the sensitizer (E). It is possible to use, as the sensitizer, known sensitizers, which have hitherto been used in combination with various cationic polymerization initiators, without particular limitation. Specific examples of the sensitizer include anthracene compounds such as anthracene, 9,10-dibutoxyanthracene, 9,10-dimethoxyanthracene, 9,10-diethoxyanthracene, 2-ethyl-9,10-dimethoxyanthracene, and 9,10-dipropoxyanthracene; pyrene; 1,2-benzanthracene; perylene; tetracene; coronene; thioxanthone compounds such as thioxanthone, 2-methylthioxanthone, 2-ethylthioxanthone, 2-chlorothioxanthone, 2-isopropylthioxanthone, and 2,4-diethylthioxanthone; phenothiazine compounds such as phenothiazine, N-methylphenothiazine, N-ethylphenothiazine, and N-phenylphenothiazine; xanthone; naphthalene compounds such as 1-naphthol, 2-naphthol, 1-methoxynaphthalene, 2-methoxynaphthalene, 1,4-dihydroxynaphthalene, and 4-methoxy-1-naphthol; ketones such as dimethoxyacetophenone, diethoxyacetophenone, 2-hydroxy-2-methyl-1-phenylpropan-1-one, 4'-isopropyl-2-hydroxy-2-methylpropiophenone, and 4-benzoyl-4'-methyldiphenyl sulfide; carbazole compounds such as N-phenylcarbazole, N-ethylcarbazole, poly-N-vinylcarbazole, and N-glycidylcarbazole; chrysene compounds such as 1,4-dimethoxychrysene and 1,4-di-α-methylbenzyloxychrysene; and phenanthrene compounds such as 9-hydroxyphenanthrene, 9-methoxyphenanthrene, 9-hydroxy-10-methoxyphenanthrene, and 9-hydroxy-10-ethoxyphenanthrene. Two or more of these sensitizers may be used in combination.

The amount of the sensitizer (E) used is not particularly limited and is preferably 1% by mass or more and 300% by mass or less, and more preferably 5% by mass or more and 200% by mass or less, based on the mass of the photocationic polymerization initiator (C). When using the sensitizer (E) in the amount within the above range, it is easy to obtain the desired sensitization effect.

<Other Components>

The curable composition can optionally contain additives such as surfactants, thermal polymerization inhibitors, defoamers, silane coupling agents, colorants (pigments, dyes), resins (thermoplastic resins, alkali-soluble resins, etc.), inorganic fillers, and organic fillers. It is possible to use, as any additives, conventionally known ones. Examples of the surfactant include anionic, cationic, and nonionic compounds, examples of the thermal polymerization inhibitor include hydroquinone, hydroquinone monoethyl ether, and the like, and examples of the defoamer include silicone-based compounds, fluorine-based compounds, and the like.

The curable composition comprising essential or optional components described above can form a cured product having satisfactory heat resistance (pyrolysis resistance) and adhesion to a base material, and has satisfactory curability, and thus can be suitably used in various applications. The curable composition is particularly preferably used for forming a transparent film which covers e.g. metal wiring in a display element such as a touch panel.

In addition, a cured film through which gas such as water vapor does not pass well and which is less prone to turn yellow when exposed to light for a long time is easily formed using the above-described curable composition.

Therefore, the above-described curable composition is preferably used for forming a film provided for the purpose of e.g. protection and insulation in a device provided with OLED, in particular an OLED light.

<(S) Solvent>

The curable composition preferably contains: (S) a solvent for the purpose of adjusting the coatability and viscosity. As the solvent (S), an organic solvent is typically used. There is no particular limitation on types of the organic solvent as long as it can uniformly dissolve or disperse components contained in the curable composition.

Suitable examples of the organic solvent usable as the solvent (S) include (poly)alkylene glycol monoalkyl ethers such as ethylene glycol monomethyl ether, ethylene glycol monoethyl ether, ethylene glycol n-propyl ether, ethylene glycol mono-n-butyl ether, diethylene glycol monomethyl ether, diethylene glycol monoethyl ether, diethylene glycol mono-n-propyl ether, diethylene glycol mono-n-butyl ether, triethylene glycol monomethyl ether, triethylene glycol monoethyl ether, propylene glycol monomethyl ether, propylene glycol monoethyl ether, propylene glycol mono-n-propyl ether, propylene glycol mono-n-butyl ether, dipropylene glycol monomethyl ether, dipropylene glycol monoethyl ether, dipropylene glycol mono-n-propyl ether, dipropylene glycol mono-n-butyl ether, tripropylene glycol monomethyl ether, and tripropylene glycol monoethyl ether; (poly)alkylene glycol monoalkyl ether acetates such as ethylene glycol monomethyl ether acetate, ethylene glycol monoethyl ether acetate, diethylene glycol monomethyl ether acetate, diethylene glycol monoethyl ether acetate, propylene glycol monomethyl ether acetate, and propylene glycol monoethyl ether acetate; other ethers such as diethylene glycol dimethyl ether, diethylene glycol methyl ethyl ether, diethylene glycol diethyl ether, and tetrahydrofuran;

ketones such as methyl ethyl ketone, cyclohexanone, 2-heptanone, and 3-heptanone; lactic acid alkyl esters such as methyl 2-hydroxypropionate and ethyl 2-hydroxypropionate; other esters such as ethyl 2-hydroxy-2-methylpropionate, methyl 3-methoxypropionate, ethyl 3-methoxypropionate, methyl 3-ethoxypropionate, ethyl 3-ethoxypropionate, ethyl ethoxyacetate, ethyl hydroxyacetate, methyl 2-hydroxy-3-methylbutanoate, 3-methyl-3-methoxybutyl acetate, 3-methyl-3-methoxybutyl propionate, ethyl acetate, n-propyl acetate, isopropyl acetate, n-butyl acetate, isobutyl acetate, n-pentyl formate, isopentyl acetate, n-butyl propionate, ethyl butyrate, n-propyl butyrate, isopropyl butyrate, n-butyl butyrate, methyl pyruvate, ethyl pyruvate, n-propyl pyruvate, methyl acetoacetate, ethyl acetoacetate, and ethyl 2-oxobutanoate; aromatic hydrocarbons such as toluene and xylene; and amides such as N-methylpyrrolidone, N,N-dimethylformamide, and N,N-dimethylacetamide.

These organic solvents can be used alone or in combination of two or more types thereof.

There is no particular limitation on the amount of the solvent (S) used in the curable composition. In view of the coatability of the curable composition, the amount of the solvent (S) used is, for example, 30 to 99.9% by mass, and preferably 50 to 98% by mass, based on the entire curable composition.

<Cured Film>

A cured film obtained from a cured product obtained by curing the above-described curable composition has excellent heat resistance (pyrolysis resistance). The cured film is suitable, for example, as a sealant for an OLED display device, an OLED light, wafer level lens, the above-described hard coat, and the like. It is also suitable for a flexible device.

The cured film obtained from a cured product of the curable composition exhibits a high refractive index when the curable compound (A) comprises a compound represented by the above-described formula (a1).

The curable composition preferably comprises, for example, metal oxide particles from the viewpoint of further increasing a refractive index of the cured film.

The cured film obtained has, for example, a high refractive index of 1.7 or more as a refractive index at a wavelength of 550 nm.

<<Method for Producing Curable Composition>>

A curable composition can be produced by uniformly mixing each component described above in a predetermined ratio.

Examples of the mixer usable in the production of the curable composition include a two-roll mill, a three-roll mill, and the like. When the curable composition has sufficiently low viscosity, if necessary, the curable composition may be filtered using a filter having a desired hole size so as to remove insoluble foreign substances.

<<Method for Producing Cured Product>>

There is no particular limitation on a method for producing a cured product as long as it is a method capable of curing a curable composition formed into a desired shape. The curing method is not particularly limited as long as it is a method capable of curing a curable composition, and comprises light exposure and/or heating, preferably comprises light exposure.

The shape of the molded body is not particularly limited and is preferably film since it is easy to uniformly apply heat to the molded body, and to uniformly irradiate the molded body with exposure light.

Typical examples of the method for producing a cured product as a cured film will be described below.

First, a curable composition is applied onto a substrate such as a glass substrate to form a coating film. Examples of the coating method include methods using a contact transfer-type coating apparatus such as a roll coater, a reverse coater, or a bar coater, or a non-contacting-type coater such as a spinner (rotary coating apparatus), a slit coater, or a curtain flow coater.

After adjusting the viscosity of the curable composition in an appropriate range, the curable composition may be applied by an inkjet method, or a printing method such as a screen printing method to form a coating film with a desired pattern shape.

Then, if necessary, a volatile component such as a solvent (S) is removed to dry the coating film.

Examples of the drying method include, but are not particularly limited to, a method of drying under reduced pressure at room temperature using a vacuum drying device (VCD), followed by drying with a hot plate at a temperature in a range of 80° C. or higher and 120° C. or lower, and preferably 90° C. or higher and 100° C. or lower, for 60 seconds or more and 120 seconds or less.

After forming the coating film in such a manner, the coating film is subjected to at least one of light exposure and heating.

Light exposure is performed by irradiating with active energy ray such as excimer laser light.

The energy line dose varies depending on the composition of the curable composition and is preferably, for example, 30 mJ/cm$^2$ or more and 2,000 mJ/cm$^2$ or less, and more preferably 50 mJ/cm$^2$ or more and 500 mJ/cm$^2$ or less.

The temperature during heating is not particularly limited and is preferably 180° C. or higher and 280° C. or lower, more preferably 200° C. or higher and 260° C. or lower, and particularly preferably 220° C. or higher and 250° C. or lower. Typically, the heating time is preferably 1 minute or more and 60 minutes or less, more preferably 10 minutes or more and 50 minutes or less, and particularly preferably 20 minutes or more and 40 minutes or less.

A cured product formed as described above, particularly a cured film, is suitably used in a display panel for an image display device and an OLED light.

The cured film is suitably used in a flexible display panel and a flexible light since cracking does not easily occur because of excellent flexibility.

The cured film is also used, particularly preferably, as a transparent film which covers e.g. metal wiring in a display element such as a touch panel.

Examples

The present invention will be more specifically described below by way of Examples, but the scope of the present invention is not limited to these Examples.

Examples 1 to 5, Comparative Example 1 and Comparative Example 2

In Examples and Comparative Examples, a compound A1 represented by the following formula and a hydrogenated bisphenol A type epoxy compound A2 (epoxy equivalent: 250 g/eq.) were used as curable compounds (A) (component (A)).

[Formula 45]

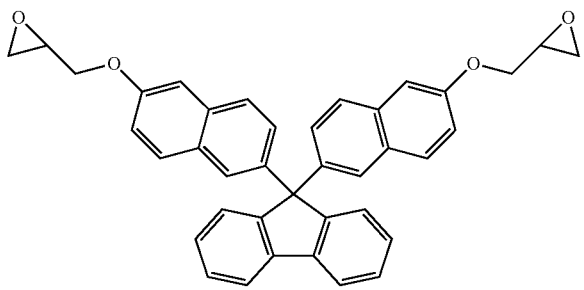

In Examples and Comparative Examples, a compound B1 or B2 represented by the following formulas was used as a cationic polymerization initiator (B) (component (B)).
[Formula 46]
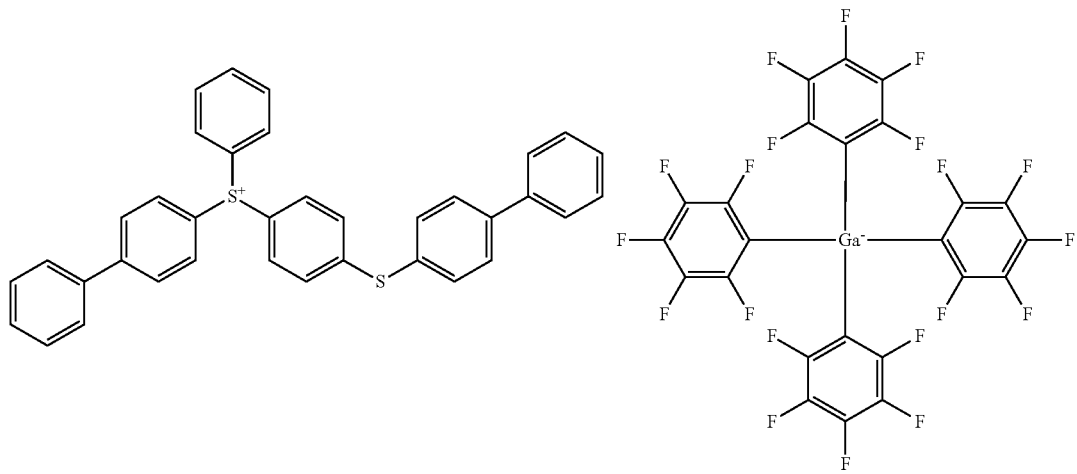
B1
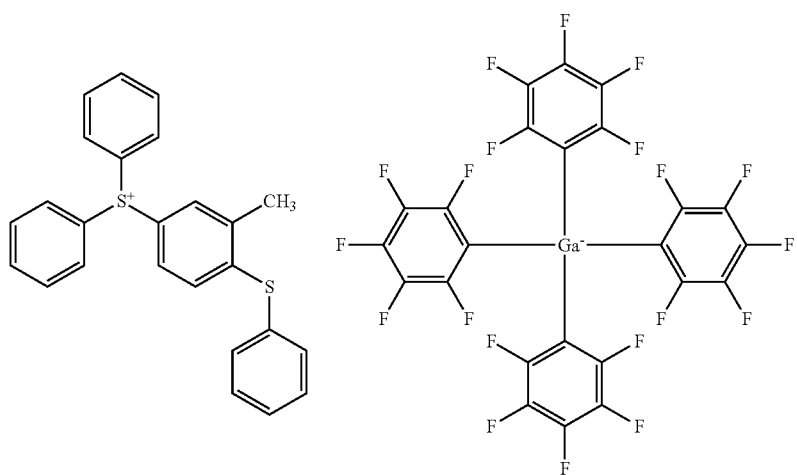
B2

In Examples and Comparative Examples, compounds C1 and C2 represented by the following formulas were used as other cationic polymerization initiators (C) (component (C)).

[Formula 47]

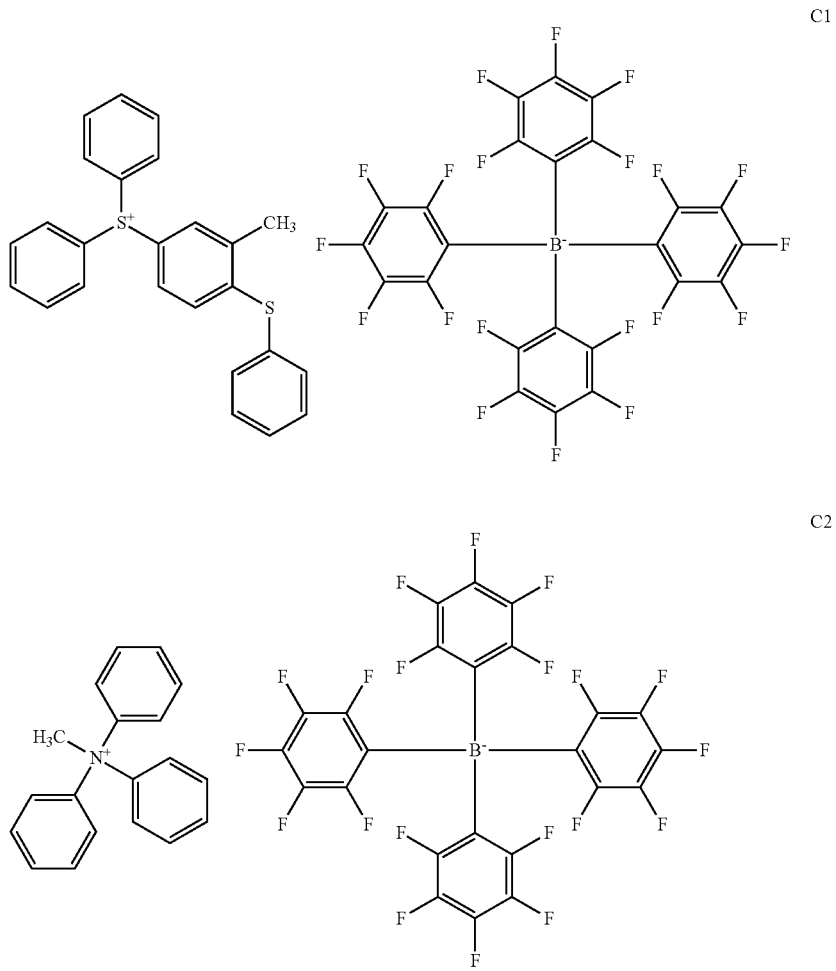

In Examples, triphenylphosphosinetriphenylborane was used as a curing accelerator (D) (component (D))

Components (A) and (B) of types and in amounts shown in Table 1, and components (C) and (D) in amounts shown in Table 1 each were dissolved in propylene glycol monomethyl ether acetate such that the solid component concentration would be 22% by mass to obtain a curable composition in each Example and Comparative Example.

In Example 1, Example 3, Example 4, Comparative Example 1, and Comparative Example 2, the component (C) was not used. In Example 1, Example 2, Comparative Example 1, and Comparative Example 2, the component (D) was not used.

Using the thus obtained curable compositions, the curability, the adhesion of a cured film, and the heat resistance of a cured film were evaluated in accordance with the following methods.

Since the curable composition of Comparative Example 1 was inferior in curability, the adhesion of a cured film and the heat resistance of a cured film were not evaluated. These evaluation results are shown in Table 1.

<Evaluation of Curability>

Based on the evaluation of the chemical resistance (NMP resistance) of the cured film formed using the curable composition in accordance with the following method, the curability of the curable composition was evaluated.

First, the curable composition was applied on a substrate at a film thickness of 1 μm.

The thus formed coating film was subjected to prebaking (at 100° C. for 2 minutes), light exposure (100 mJ/cm$^2$), and postbaking (at 230° C. for 20 minutes) in this order to obtain a cured film.

The thus obtained cured film was immersed in N-methyl-2-pyrrolidone (NMP) at room temperature for 5 minutes, thereby performing a chemical resistance test.

The case where the amount of decrease in film thickness or the amount of increase in film thickness of the cured film after immersion in NMP accounts for 1% or less of the film thickness of the cured film before immersion in NMP was rated "A", the case where the amount accounts for more than 1% and 3% or less was rated "B", and the case where the amount accounts for more than 3% was rated "C".

<Evaluation of Adhesion>

After forming cross-cuts (lattice-shaped cuts each having a width of 1 mm) on a cured film formed on a substrate in the same manner as in evaluation of the curability, a tape test defined in JIS Z 1522 was performed and it was confirmed whether peeling of the cured film occurred.

The case where no peeling occurred was rated "A", the case where the number of peeled squares was 5% or less was rated "B", and the case where the number of peeled squares was more than 5% was rated "C".

<Evaluation of Heat Resistance>

In the same manner as in evaluation of the curability, a cured film was formed on a substrate.

The cured film was partially peeled off from the substrate to obtain a sample.

Using the thus obtained sample, thermal gravimetric analysis (TGDTA) in the atmosphere was performed and the heat resistance was evaluated.

The thermal gravimetric analysis was performed by heating from room temperature (20° C.) at a temperature rise rate of 10° C./minute.

Measurement was made of the temperature at which the weight is reduced by 5% based on the weight at the starting of analysis (Td 5%: 5% weight reduction temperature).

The case where Td 5% is 430° C. or higher was rated "A", the case where Td 5% is 400° C. or higher and lower than 430° C. was rated "B", and the case where Td 5% is lower than 400° C. was rated "C".

TABLE 1

| | Component (A) (Parts by mass/Type) | Component (B) (Parts by mass/Type) | Component (C) (Parts by mass/Type) | Component (D) (Parts by mass) | Curability | Adhesion | Heat resistance |
|---|---|---|---|---|---|---|---|
| Example 1 | 99.5/A1 | 0.5/B1 | — | — | B | B | B |
| Example 2 | 99.5/A1 | 0.45/B1 | 0.05/C1 | — | A | A | A |
| Example 3 | 99.5/A1 | 0.45/B1 | — | 0.45 | A | A | A |
| Example 4 | 99.5/A1 | 0.45/B2 | — | 0.45 | A | A | A |
| Example 5 | 99.5/A1 | 0.45/B1 | 0.05/C1 | 0.45 | A | A | A |
| Comparative Example 1 | 99.5/A1 | — | 0.5/C2 | — | C | — | — |
| Comparative Example 2 | 99.5/A2 | 0.5/B1 | — | — | B | B | C |

As is apparent from Examples 1 to 5, a curable composition which comprises a curable compound (A) comprising a compound having each predetermined structure, and a cationic polymerization initiator (B), which is a salt comprising a gallium-containing anion having a specific structure as the anion moiety, has satisfactory curability, and enables formation of a cured product having satisfactory heat resistance (pyrolysis resistance) and adhesion to a base material.

As is apparent from Examples 2 to 5, when a curable composition comprises another cationic polymerization initiator (C) or a curing accelerator (D) together with a cationic polymerization initiator (B), the curable composition has particularly satisfactory curability, thus enabling formation of a cured product having particularly satisfactory heat resistance (pyrolysis resistance) and adhesion to a base material.

Meanwhile, as is apparent from Comparative Examples 1 and 2, when a curable composition comprises at least one of a curable compound (A) comprising a compound having a predetermined structure, and a cationic polymerization initiator (B), which is a salt comprising a gallium-containing anion having a specific structure as the anion moiety, it is impossible to satisfy all of satisfactory curability, satisfactory adhesion of a cured product, and satisfactory heat resistance (pyrolysis resistance) of a cured product.

What is claimed is:

1. A curable composition comprising a curable compound (A) and a cationic polymerization initiator (B), wherein the curable compound (A) comprises a compound represented by the following formula (a1), with the provisos that the compound represented by the formula (a1) does not comprise a vinyl group, and the compound represented by the formula (a1) is not a compound in which one $R^3$ represents a thiiran-2-ylmethyl group and the other $R^3$ represents a hydrogen atom or in which each $R^3$ represents a thiiran-2-ylmethyl group, and the cationic polymerization initiator (B) is a compound comprising a cation moiety and an anion moiety, the anion moiety being an anion represented by the following formula (b1):

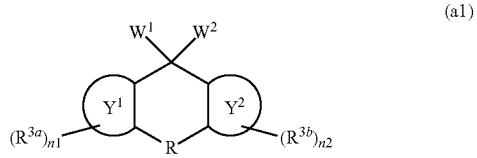

(a1)

wherein, in the formula (a1), $W^1$ and $W^2$ are each independently a group represented by the following formula (a2):

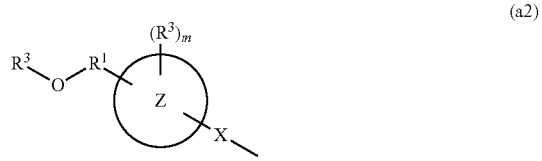

(a2)

wherein, in the formula (a2), a ring Z represents a fused polycyclic aromatic hydrocarbon ring, X represents a single bond or a group represented by —S—, $R^1$ represents a single bond, an alkylene group having 1 or more and 4 or less carbon atoms, or an alkyleneoxy group having 1 or more and 4 or less carbon atoms, and when $R^1$ is an alkyleneoxy group, the oxygen atom in the alkyleneoxy group is bonded with a ring Z, $R^2$ represents a monovalent hydrocarbon group, a hydroxyl group, a group represented by —$OR^{4a}$, a group represented by —$SR^{4b}$, an acyl group, an alkoxycarbonyl group, a halogen atom, a nitro group, a cyano group, a mercapto group, a carboxy group, an amino group, a carbamoyl group, a group represented by —$NHR^{4c}$, a group represented by —$N(R^{4d})_2$, a sulfo group, or a group in which at least part of hydrogen atoms bonded to a carbon atom(s) included in a monovalent hydrocarbon group, a group represented by —$OR^{4a}$, a group represented by —$SR^{4b}$, an acyl group, an alkoxycarbonyl group, a group represented by -$NHR^4c$, or a group represented by -$N(R^{4d})_2$ are substituted with a monovalent hydrocarbon group, a hydroxyl group, a group represented by —$OR^{4a}$, a group represented by —$SR^{4b}$, an acyl group, an alkoxycarbonyl group, a halogen atom, a nitro group, a cyano group, a mercapto group, a carboxy group, an amino group, a carbamoyl group, a group represented by —$NHR^{4c}$, a group represented by —$N(R^{4d})_2$, a mesyloxy group, or a sulfo group, $R^{4a}$ to $R^{4d}$ independently represent a monovalent hydrocarbon group, m represents an integer of 0 or more, and $R^3$ is a hydrogen atom, a thiiran-2-ylmethyl group, or a glycidyl group, both $W^1$ and $W^2$ do not have a hydrogen atom as $R^3$, a ring $Y^1$ and a ring $Y^2$ represent the same or different aromatic hydrocarbon ring, R represents a single bond, an optionally substituted methylene group, an ethylene group which is optionally substituted and optionally comprises a heteroatom between two carbon atoms, a group represented by —O—, a group represented by —NH—, or a group represented by —S—, $R^{3a}$ and $R^{3b}$ independently represent a cyano group, a halogen atom, or a monovalent hydrocarbon group, and n1 and n2 independently represent an integer of 0 or more and 4 or less:

[Formula 3]

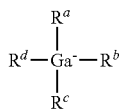
(b1)

wherein, in the formula (b1), $R^a$, $R^b$, $R^c$ and $R^d$ are each independently an optionally substituted hydrocarbon group, and at least one of $R^a$, $R^b$, $R^c$ and $R^d$ is an optionally substituted aromatic hydrocarbon group.

2. The curable composition according to claim 1, further comprising a cationic polymerization initiator (C).

3. The curable composition according to claim 2, wherein the cationic polymerization initiator (B) and/or the cationic polymerization initiator (C) comprises a sulfonium salt, comprising a cation moiety and an anion moiety, wherein the cation moiety is represented by the following formula (c1):

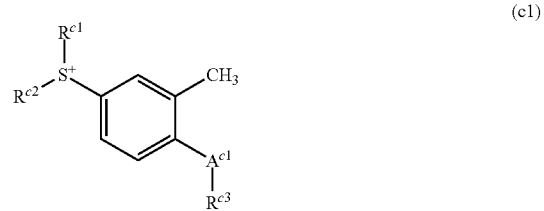
(c1)

wherein, in the formula (c1), $R^{c1}$ and $R^{c2}$ independently represent an alkyl group optionally substituted with a halogen atom, or a group represented by the following formula (c2), $R^{c1}$ and $R^{c2}$ are optionally combined with each other to form a ring together with the sulfur atom in the formula, $R^{c3}$ represents a group represented by the following formula (c3), or a group represented by the following formula (c4), $A^{c1}$ represents S, O, or Se, provided that $R^{c1}$ and $R^{c2}$ are not simultaneously an alkyl group optionally substituted with a halogen atom:

(c2)

wherein, in the formula (c2), a ring $Z^{c1}$ represents an aromatic hydrocarbon ring, $R^{c4}$ represents an alkyl group optionally substituted with a halogen atom, a hydroxy group, an alkoxy group, an alkylcarbonyl group, an alkoxycarbonyl group, an acyloxy group, an alkylthio group, a thienyl group, a thienylcarbonyl group, a furanyl group, a furanylcarbonyl group, a selenophenyl group, a selenophenylcarbonyl group, a heterocyclic aliphatic hydrocarbon group, an alkylsulfinyl group, an alkylsulfonyl group, a hydroxy(poly)alkyleneoxy group, an optionally substituted amino group, a cyano group, a nitro group, or a halogen atom, and m1 represents an integer of 0 or more:

(c3)

wherein, in the formula (c3), $R^{c5}$ represents a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, an alkylene group optionally substituted with a cyano group, a nitro group or a halogen atom, or a group represented by the following formula (c5), $R^{c6}$ represents a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, an alkyl group optionally substituted with a cyano group, a nitro group or a halogen atom, or a group represented by the following formula (c6), $A^{c2}$ represents a single bond, S, O, a sulfinyl group, or a carbonyl group, and m2 represents 0 or 1:

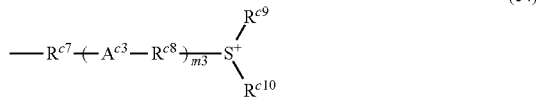

(c4)

wherein, in the formula (c4), $R^{c7}$ and $R^{c8}$ independently represent a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, an alkylene group optionally substituted with a cyano group, a nitro group or a halogen atom, or a group represented by the following formula (c5), $R^{c9}$ and $R^{c10}$ independently represent an alkyl group optionally substituted with a halogen atom, or a group represented by the formula (c2), $R^{c9}$ and $R^{c10}$ are optionally combined with each other to form a ring together with the sulfur atom in the formula, $A^{c3}$ represents a single bond, S, O, a sulfinyl group, or a carbonyl group, and m3 represents 0 or 1, provided that le and $R^{c10}$ are not simultaneously an alkyl group optionally substituted with a halogen atom:

(c5)

wherein, in the formula (c5), a ring $Z^{c2}$ represents an aromatic hydrocarbon ring, $R^{c11}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, and m4 represents an integer of 0 or more:

(c6)

wherein, in the (c6), a ring $Z^{c3}$ represents an aromatic hydrocarbon ring, $R^{c12}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, a thienylcarbonyl group, a furanylcarbonyl group, a selenophenylcarbonyl group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, and m5 represents an integer of 0 or more.

4. The curable composition according to claim 3, wherein both the $R^{c1}$ and the $R^{c2}$ in the formula (c1) are a phenyl group.

5. The curable composition according to claim 3, wherein the $A^{c1}$ in the formula (c1) is S.

6. A cured film obtained from a cured product of a curable composition according to claim 1.

7. A display panel for an image display device or an OLED light, provided with the cured film according to claim 6.

8. The display panel for an image display device or the OLED light according to claim 7, wherein the display panel is flexible.

9. A method for producing a cured product, comprising:
forming a curable composition according to claim 1 into a predetermined shape; and
subjecting the formed curable composition to heating, or to light exposure and heating.

10. The method for producing a cured product according to claim 9, wherein forming of the curable composition is formation of a coating film, and the coating film is subjected to at least one of light exposure and heating.

11. An image display device comprising the display panel or the OLED light according to claim 7.

12. The curable composition according to claim 1, further comprising a cationic polymerization initiator comprising an anion represented by a formula $R^{x1}{}_cBY_{4-c}{}^-$, wherein $R^{x1}$ independently represents a phenyl group in which hydrogen atoms are partially substituted with at least one electron withdrawing group, B represents a boron atom, Y represents a halogen atom, and c represents an integer of 1 or more and 4 or less.

13. A curable composition comprising a curable compound (A), a cationic polymerization initiator (B) and a cationic polymerization initiator (C), wherein the curable compound (A) comprises a compound represented by the following formula (a1) with the proviso that the compound represnted by formula (a1) does not comprise a vinyl group, and the cationic polymerization initiator (B) is a compound comprising a cation moiety and an anion moiety, wherein the anion moiety is an anion represented by the following formula (b1), and the cationic polymerization initiator (C) comprises an anion represented by a formula $R^{x1}{}_cBY_{4-c}{}^-$, wherein $R^{x1}$ independently represents a phenyl group in which hydrogen atoms are partially substituted with at least one electron withdrawing group, B represents a boron atom, Y represents a halogen atom, and c represents an integer of 1 or more and 4 or less:

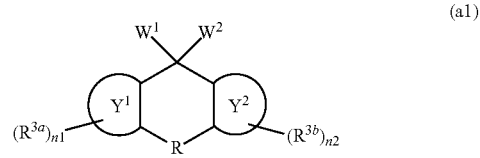

(a1)

wherein, in the formula (a1), $W^1$ and $W^2$ are each independently a group represented by the following formula (a2):

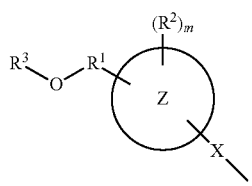

wherein, in the formula (a2), a ring Z represents an aromatic hydrocarbon ring, X represents a single bond or a group represented by —S—, $R^1$ represents a single bond, an alkylene group having 1 or more and 4 or less carbon atoms, or an alkyleneoxy group having 1 or more and 4 or less carbon atoms, and when $R^1$ is an alkyleneoxy group, the oxygen atom in the alkyleneoxy group is bonded with a ring Z, $R^2$ represents a monovalent hydrocarbon group, a hydroxyl group, a group represented by —$OR^{4a}$, a group represented by —$SR^{4b}$, an acyl group, an alkoxycarbonyl group, a halogen atom, a nitro group, a cyano group, a mercapto group, a carboxy group, an amino group, a carbamoyl group, a group represented by —$NHR^{4c}$, a group represented by —$N(R^{4d})_2$, a sulfo group, or a group in which at least part of hydrogen atoms bonded to a carbon atom(s) included in a monovalent hydrocarbon group, a group represented by —$OR^{4a}$, a group represented by —$SR^{4b}$, an acyl group, an alkoxycarbonyl group, a group represented by —$NHR^{4c}$, or a group represented by —$N(R^{4d})_2$ are substituted with a monovalent hydrocarbon group, a hydroxyl group, a group represented by —$OR^{4a}$, a group represented by —$SR^{4b}$, an acyl group, an alkoxycarbonyl group, a halogen atom, a nitro group, a cyano group, a mercapto group, a carboxy group, an amino group, a carbamoyl group, a group represented by $NHR^{4c}$, a group represented by —$N(R^{4d})_2$, a mesyloxy group, or a sulfo group, $R^{4a}$ to $R^{4d}$ independently represent a monovalent hydrocarbon group, m represents an integer of 0 or more, and $R^3$ is a hydrogen atom, a thiiran-2-ylmethyl group, or a glycidyl group, both $W^1$ and $W^2$ do not have a hydrogen atom as $R^3$, a ring $Y^1$ and a ring $Y^2$ represent the same or different aromatic hydrocarbon ring, R represents a single bond, an optionally substituted methylene group, an ethylene group which is optionally substituted and optionally comprises a heteroatom between two carbon atoms, a group represented by —O—, a group represented by —NH—, or a group represented by —S—, $R^{3a}$ and $R^{3b}$ independently represent a cyano group, a halogen atom, or a monovalent hydrocarbon group, and n1 and n2 independently represent an integer of 0 or more and 4 or less:

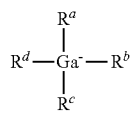

wherein, in the formula (b 1), $R^a$, $R^b$, $R^c$ and $R^d$ are each independently an optionally substituted hydrocarbon group, and at least one of $R^a$, $R^b$, $R^c$ and $R^d$ is an optionally substituted aromatic hydrocarbon group.

14. The curable composition according to claim 3, wherein the cation moiety of the cationic polymerization initiator (C) is represented by the formula (c1).

15. The curable composition according to claim 1, wherein the cation moiety of the cationic polymerization initiator (B) is represented by the following formula (c1):

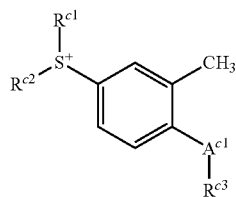

wherein, in the formula (c1), $R^{c1}$ and $R^{c2}$ independently represent an alkyl group optionally substituted with a halogen atom, or a group represented by the following formula (c2), $R^{c1}$ and $R^{c2}$ are optionally combined with each other to form a ring together with the sulfur atom in the formula, $R^{c3}$ represents a group represented by the following formula (c3), or a group represented by the following formula (c4), $A^{c1}$ represents S, O, or Se, provided that $R^{c1}$ and $R^{c2}$ are not simultaneously an alkyl group optionally substituted with a halogen atom:

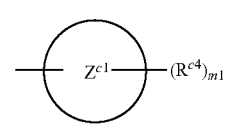

wherein, in the formula (c2), a ring $Z^{c1}$ represents an aromatic hydrocarbon ring, $R^{c4}$ represents an alkyl group optionally substituted with a halogen atom, a hydroxy group, an alkoxy group, an alkylcarbonyl group, an alkoxycarbonyl group, an acyloxy group, an alkylthio group, a thienyl group, a thienylcarbonyl group, a furanyl group, a furanylcarbonyl group, a selenophenyl group, a selenophenylcarbonyl group, a heterocyclic aliphatic hydrocarbon group, an alkylsulfinyl group, an alkylsulfonyl group, a hydroxy(poly)alkyleneoxy group, an optionally substituted amino group, a cyano group, a nitro group, or a halogen atom, and ml represents an integer of 0 or more:

wherein, in the formula (c3), $R^{c5}$ represents a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, an alkylene group optionally substituted with a cyano group, a nitro group or a halogen atom, or a group represented by the following formula (c5), $R^{c6}$ represents a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, an alkyl group optionally substituted with a cyano group, a nitro group or a halogen atom, or a group represented by the following formula (c6), $A^{c2}$ represents a single bond, S, O, a sulfinyl group, or a carbonyl group, and m2 represents 0 or 1:

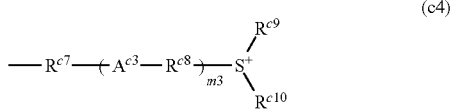

(c4)

wherein, in the formula (c4), $R^{c7}$ and $R^{c8}$ independently represent a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, an alkylene group optionally substituted with a cyano group, a nitro group or a halogen atom, or a group represented by the following formula (c5), $R^{c9}$ and $R^{c10}$ independently represent an alkyl group optionally substituted with a halogen atom, or a group represented by the formula (c2), $R^{c9}$ and $R^{c10}$ are optionally combined with each other to form a ring together with the sulfur atom in the formula, $A^{c3}$ represents a single bond, S, O, a sulfinyl group, or a carbonyl group, and m3 represents 0 or 1, provided that le and $R^{c9}$ are not simultaneously an alkyl group optionally substituted with a halogen atom:

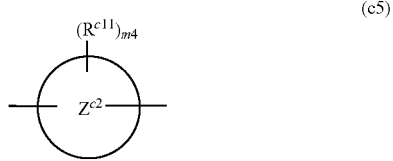

(c5)

wherein, in the formula (c5), a ring $Z^{c2}$ represents an aromatic hydrocarbon ring, $R^{c11}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, and m4 represents an integer of 0 or more:

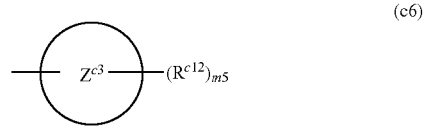

(c6)

wherein, in the (c6), a ring $Z^{c3}$ represents an aromatic hydrocarbon ring, $R^{c12}$ represents an alkyl group optionally substituted with a halogen atom, a hydroxy group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, a thienylcarbonyl group, a furanylcarbonyl group, a selenophenylcarbonyl group, an aryl group, a heterocyclic hydrocarbon group, an aryloxy group, an alkylsulfinyl group, an arylsulfinyl group, an alkylsulfonyl group, an arylsulfonyl group, a hydroxy(poly)alkyleneoxy group, an optionally substituted amino group, a cyano group, a nitro group, or a halogen atom, and m5 represents an integer of 0 or more.

16. The curable composition according to claim 13, wherein the ring Z in the formula (a2) is a fused polycyclic aromatic hydrocarbon ring.

* * * * *